(12) United States Patent
Murakami et al.

(10) Patent No.: US 8,866,720 B2
(45) Date of Patent: Oct. 21, 2014

(54) MEMORY DEVICE AND DISPLAY DEVICE EQUIPPED WITH MEMORY DEVICE

(75) Inventors: Yuhichiroh Murakami, Osaka (JP); Shige Furuta, Osaka (JP); Yasushi Sasaki, Osaka (JP); Seijirou Gyouten, Osaka (JP); Shuji Nishi, Osaka (JP)

(73) Assignee: Sharp Kabushiki Kaisha, Osaka-Shi, Osaka ( * ) Notice: Subject to any disclaimer, the term of this patent is extended or adjusted under 35 U.S.C. 154(b) by 303 days.

(21) Appl. No.: 13/496,027

(22) PCT Filed: Apr. 23, 2010

(86) PCT No.: PCT/JP2010/057277
§ 371 (c)(1),
(2), (4) Date: Mar. 14, 2012

(87) PCT Pub. No.: WO2011/033810
PCT Pub. Date: Mar. 24, 2011

(65) Prior Publication Data
US 2012/0169753 A1   Jul. 5, 2012

(30) Foreign Application Priority Data

Sep. 16, 2009  (JP) ................... 2009-215060

(51) Int. Cl.
*G09G 5/36*        (2006.01)
*G11C 11/405*    (2006.01)
*G09G 3/36*        (2006.01)

(52) U.S. Cl.
CPC ........ *G09G 3/3659* (2013.01); *G09G 2330/022* (2013.01); *G11C 11/405* (2013.01); *G09G 2300/0417* (2013.01); *G09G 2300/0823* (2013.01); *G09G 2300/0842* (2013.01); *G09G 2300/088* (2013.01); *G09G 2300/0861* (2013.01)

USPC ............... 345/98; 345/205; 345/211; 345/78; 365/189.15; 365/189.16; 365/63; 365/72

(58) Field of Classification Search
CPC ................. G09G 3/3614; G09G 5/39; G09G 2300/0852; G09G 2300/0842; G09G 2300/0847; G09G 2300/0857; G09G 5/36; G09G 5/399
USPC ................ 345/98, 560, 87, 205, 211; 365/63, 365/189.15, 189.16
See application file for complete search history.

(56) References Cited

U.S. PATENT DOCUMENTS

| | | | |
|---|---|---|---|
| 5,296,847 A | 3/1994 | Takeda et al. | |
| 6,778,162 B2 * | 8/2004 | Kimura et al. | 345/90 |

(Continued)

FOREIGN PATENT DOCUMENTS

| | | |
|---|---|---|
| JP | 02-157815 A | 6/1990 |
| JP | 2002-229532 A | 8/2002 |

(Continued)

OTHER PUBLICATIONS

International Search Report.

*Primary Examiner* — Jason Olson
*Assistant Examiner* — Linh N Hoffner
(74) *Attorney, Agent, or Firm* — Harness, Dickey & Pierce, P.L.C

(57) ABSTRACT

A memory device is provided which includes a memory circuit that allows a circuit which carries out a refresh operation to suitably carry out an original operation of the circuit even if an off-leakage current occurs in a transfer element used in a transfer section. A memory cell includes a switching circuit, a first retaining section, a transfer section, a second retaining section, a first control section, and a voltage supply, and the first control section is controlled to be in (i) a state in which the first control section carries out a first operation in which the first control section is in an active state or a non-active state and (ii) a state in which the first control section carries out a second operation.

18 Claims, 33 Drawing Sheets

(56) References Cited

U.S. PATENT DOCUMENTS

| | | | |
|---|---|---|---|
| 2001/0024187 A1* | 9/2001 | Sato et al. | 345/98 |
| 2002/0075205 A1 | 6/2002 | Kimura et al. | |
| 2004/0066360 A1 | 4/2004 | Tobita | |
| 2004/0164944 A1* | 8/2004 | Miyazawa et al. | 345/98 |
| 2005/0035959 A1* | 2/2005 | Lin et al. | 345/211 |
| 2007/0024187 A1* | 2/2007 | Shin et al. | 313/504 |
| 2007/0024566 A1* | 2/2007 | Miyazawa et al. | 345/100 |
| 2009/0303168 A1* | 12/2009 | Nagata | 345/90 |
| 2010/0110090 A1* | 5/2010 | Kawabe | 345/547 |

FOREIGN PATENT DOCUMENTS

| | | |
|---|---|---|
| JP | 2004-077742 A | 3/2004 |
| JP | 2007-034095 A | 2/2007 |

* cited by examiner

FIG. 5

| POL | 0 | | 1 | |
|---|---|---|---|---|
| DATA | 0 | 1 | 0 | 1 |
| BIT LINE ELECTRIC POTENTIAL | L | H | H | L |

MEMORY DEVICE AND DISPLAY DEVICE EQUIPPED WITH MEMORY DEVICE

TECHNICAL FIELD

The present invention relates to a memory device which is capable of retaining data.

BACKGROUND ART

A liquid crystal display device which displays a still image is exemplified by a liquid crystal display device including a pixel memory which carries out a display by temporarily retaining image data written to a pixel and carrying out a refresh operation while reversing polarities of the image data. Image data is rewritten to new image data in a pixel every one frame via a data signal line in a normal operation in which a multi-gradation moving image is displayed, whereas image data retained in a pixel memory is used in a memory operation in which a still image is displayed. In view of this, it is unnecessary to supply rewriting image data to a data line while the refresh operation is being carried out.

Accordingly, electric power consumption can be reduced since it is possible in the memory operation to stop an operation of a circuit which drives a scanning signal line and a data signal line. Electric power consumption can also be reduced by a reduction in number of times of charge and discharge of the data signal line having a large capacity and without the need of transmitting, to a controller, image data corresponding to a memory operation period.

Accordingly, a pixel which carries out the memory operation is frequently used for an image display such as a standby display of a mobile phone, the image display being strongly required to be carried out with lower electric power consumption.

FIG. 28 illustrates only a memory circuit part of each pixel structure of a liquid crystal display device including such a pixel memory. In order to cause the each pixel structure to function also as a pixel of the liquid crystal display device, it is only necessary to assume that a liquid crystal capacitor Clc is added to the each pixel structure (see a broken line in FIG. 28). Such a pixel structure is equivalent to, for example, a pixel structure disclosed in Patent Literature 1.

A memory circuit MR100 serving as the memory circuit part includes a switching circuit SW100, a first data retaining section DS101, a data transfer section TS100, a second data retaining section DS102, and a refresh output control section RS100.

The switching circuit SW100 includes a transistor N100 which is an N-channel TFT. The first data retaining section DS101 includes a capacitor Ca100. The data transfer section TS100 includes a transistor N101 which is an N-channel TFT. The second data retaining section DS102 includes a capacitor Cb100. The refresh output control section RS100 includes an inverter INV100 and a transistor N103 which is an N-channel TFT. The inverter INV100 includes a transistor P100 which is a P-channel TFT and a transistor N102 which is an N-channel TFT.

As wires for driving each memory circuit MR100, a data transfer control line DT100, a switch control line SC100, a High voltage supply line PH100, a Low voltage supply line PL100, a refresh output control line RC100, and a capacitor wire CL100 are provided for each row of a pixel matrix, and a data input line IN100 is provided for each column of the pixel matrix.

One and the other of drain/source terminals of a field-effect transistor such as a TFT mentioned above are referred to as a first drain/source terminal and a second drain/source terminal, respectively. Note, however, that the first drain/source terminal and the second drain/source terminal between which a drain terminal and a source terminal are constantly fixed in accordance with a direction in which a current flows are referred to as the drain terminal and the source terminal, respectively. The transistor N100 has a gate terminal which is connected to the switch control line SC100, a first drain/source terminal which is connected to the data input line IN100, and a second drain/source terminal which is connected to a node PIX that is one end of the capacitor Ca100. The other end of the capacitor Ca100 is connected to the capacitor wire CL100.

The transistor N101 has a gate terminal which is connected to the data transfer control line DT100, a first drain/source terminal which is connected to the node PIX, and a second drain/source terminal which is connected to a node MRY that is one end of the capacitor Cb100. The other end of the capacitor Cb100 is connected to the capacitor wire CL100.

An input terminal IP of the inverter INV100 is connected to the node MRY. The transistor P100 has a gate terminal which is connected to the input terminal IP of the inverter INV100, a source terminal which is connected to the High voltage supply line PH100, and a drain terminal which is connected to an output terminal OP of the inverter INV100. The transistor N102 has a gate terminal which is connected to the input terminal IP of the inverter INV100, a drain terminal which is connected to the output terminal OP of the inverter INV100, and a source terminal which is connected to the Low voltage supply line PL100. The transistor N103 has a gate terminal which is connected to the refresh output control line RC100, a first drain/source terminal which is connected to the output terminal OP of the inverter INV100, and a second drain/source terminal which is connected to the node PIX.

Note that, in a case where a pixel structure is constituted as a pixel by adding the liquid crystal capacitor Clc to the memory circuit MR100, the liquid crystal capacitor Clc is connected between the node PIX and a common electrode COM.

Next, operation of the memory circuit MR100 is described below with reference to FIG. 29.

It is assumed in FIG. 29 that the memory circuit MR100 is in a memory operation mode such as a standby state of a mobile phone. An electric potential of binary levels which are High (an active level) and Low (a non-active level) is applied from a driving circuit (not illustrated) to each of the data transfer control line DT100, the switch control line SC100, and the refresh output control line RC100. The High and Low binary levels of a voltage may be individually set for each of these lines. The High and Low binary logic levels are supplied from the driving circuit (not illustrated) to the data input line IN100. An electric potential to be supplied from the High voltage supply line PH100 is equivalent to the High binary logic level, and an electric potential to be supplied from the Low voltage supply line PL100 is equivalent to the Low binary logic level. An electric potential to be supplied from the capacitor wire CL100 may be constant or may change at a given timing. For convenience of explanation, it is assumed here that the electric potential to be supplied from the capacitor wire CL100 is constant.

A writing period T101 and a refresh period T102 are set in the memory operation mode. The writing period T101 is a period in which data to be retained in the memory circuit MR100 is written to the memory circuit MR100 and which has a period t101 and a period t102 that are successive. Since line-sequential writing is carried out with respect to the memory circuit MR100 in the writing period T101, an end timing of the period t101 is set for each row within a period in which corresponding writing data is outputted. An end timing of the period t102, i.e., an end timing of the writing period T101 is identical in all the rows. The refresh period T102 is a period in which the data written to the memory circuit MR100 in the writing period T101 is retained while being refreshed and which has a period t103 through a period t110 that start concurrently in all the rows and are successive.

The switch control line SC100 has a High electric potential in the period t101 of the writing period T101. Each of the data transfer control line DT100 and the refresh output control line RC100 has a Low electric potential. This causes the transistor N100 to turn on. Therefore, a data electric potential (High here) supplied to the data input line IN100 is written to the node PIX. The switch control line SC100 has a Low electric potential in the period t102. This causes the transistor N100 to turn off. Therefore, an electric charge corresponding to the written data electric potential is retained in the capacitor Ca100.

Note here that, in a case where the memory circuit MR100 is constituted only by the capacitor Ca100 and the transistor N100, the node PIX is floating while the transistor N100 is off. In this case, ideally, the electric charge is retained in the capacitor Ca100 so that an electric potential of the node PIX is maintained at High. However, in reality, an off-leakage current occurs in the transistor N100. This causes the electric charge of the capacitor Ca100 to gradually leak to an outside of the memory circuit MR100. The leak of the electric charge of the capacitor Ca100 causes the electric potential of the node PIX to change. Therefore, in a case where the electric charge leaks for a long time, the electric potential of the node PIX changes to an extent that the written data electric potential loses its original function.

In view of the circumstances, the data transfer section TS100, the second data retaining section DS102, and the refresh output control section RS100 are arranged to function to refresh the electric potential of the node PIX, so as to prevent the written data from being lost.

Therefore, the refresh period T102 comes next. The data transfer control line DT100 has a High electric potential in the period t103. This causes the transistor N101 to turn on. Therefore, the capacitor Cb100 is connected in parallel to the capacitor Ca100 via the transistor N101. The capacitor Ca100 is set to have a larger capacitance than the capacitor Cb100. Accordingly, movement of the electric charge between the capacitor Ca100 and the capacitor Cb100 causes an electric potential of the node MRY to be High. A positive electric charge moves from the capacitor Ca100 via the transistor N101 to the capacitor Cb100 until the electric potential of the node PIX becomes equivalent to the electric potential of the node MRY. This causes the electric potential of the node PIX to be lower by a slight amount of voltage of ΔV1 than that obtained in the period t102. However, the electric potential of the node PIX falls within a range of a High electric potential. The data transfer control line DT100 has a Low electric potential in the period t104. This causes the transistor N101 to turn off. Therefore, the electric charge is retained in the capacitor Ca100 so that the electric potential of the node PIX is maintained at High, and the electric charge is retained in the capacitor Cb100 so that the electric potential of the node MRY is maintained at High.

The refresh output control line RC100 has a High electric potential in the period t105. This causes the transistor N103 to turn on. Therefore, the output terminal OP of the inverter INV100 is connected to the node PIX. Since an inverse electric potential (Low here) to the electric potential of the node MRY is supplied to the output terminal OP, the node PIX is charged at the inverse electric potential. The refresh output control line RC100 has a Low electric potential in the period t106. This causes the transistor N103 to turn off. Therefore, the electric charge is retained in the capacitor Ca100 so that the electric potential of the node PIX is maintained at the inverse electric potential.

The data transfer control line DT100 has a High electric potential in the period t107. This causes the transistor N101 to turn on. Therefore, the capacitor Cb100 is connected in parallel to the capacitor Ca100 via the transistor N101. Accordingly, movement of the electric charge between the capacitor Ca100 and the capacitor Cb100 causes the electric potential of the node MRY to be Low. A positive electric charge moves from the capacitor Cb100 via the transistor N101 to the capacitor Ca100 until the electric potential of the node MRY becomes equivalent to the electric potential of the node PIX. This causes the electric potential of the node PIX to be higher by a slight amount of voltage of ΔV2 than that obtained in the period t106. However, the electric potential of the node PIX falls within a range of a Low electric potential.

The data transfer control line DT100 has a Low electric potential in the period t108. This causes the transistor N101 to turn off. Therefore, the electric charge is retained in the capacitor Ca100 so that the electric potential of the node PIX is maintained at Low, and the electric charge is retained in the capacitor Cb100 so that the electric potential of the node MRY is maintained at Low.

The refresh output control line RC100 has a High electric potential in the period t109. This causes the transistor N103 to turn on. Therefore, the output terminal OP of the inverter INV100 is connected to the node PIX. Since an inverse electric potential (High here) to the electric potential of the node MRY is supplied to the output terminal OP, the node PIX is charged at the inverse electric potential. The refresh output control line RC100 has a Low electric potential in the period t110. This causes the transistor N103 to turn off. Therefore, the electric charge is retained in the capacitor Ca100 so that the electric potential of the node PIX is maintained at the inverse electric potential.

Thereafter, the period t103 through the period t110 are repeated in the refresh period T102 until the next writing period T101 comes. In the period t105, the electric potential of the node PIX is refreshed to the inverse electric potential. In the period t109, the electric potential of the node PIX is refreshed to the electric potential obtained during writing. Note that, in a case where the data electric potential of Low is written to the node PIX in the period t101 of the writing period T101, an electric potential waveform of the node PIX is obtained by inverting an electric potential waveform of FIG. 29.

As described earlier, the memory circuit MR100 is arranged such that in accordance with a data inversion method, written data is retained while being refreshed. Assume that the liquid crystal capacitor Clc is added to the memory circuit MR100. In a case where an electric potential of the common electrode COM is reversed between High and Low at a timing at which data is refreshed, black display data or white display data can be refreshed while its polarities are being reversed.

CITATION LIST

Patent Literature

Patent Literature 1
Japanese Patent Application Publication, Tokukai, No. 2002-229532 A (Publication Date: Aug. 16, 2002)

SUMMARY OF INVENTION

Technical Problem

However, according to the conventional memory circuit MR100, the data transfer section TS100 including the transistor N101 is provided in a circuit in which data is refreshed. Therefore, in the period t104 through the period t106 and the period t108 through the period t110 of the refresh period T102 in each of which periods the data transfer control line DT100 has an electric potential of a non-active level (Low here), the node MRY has been cut off from the node PIX and is floating. Especially in the period t105 through the period t106, the node MRY has an electric potential equivalent to High in a case where the node PIX has an electric potential equivalent to Low. In the period t109 through the period t110, the node MRY has an electric potential equivalent to Low in a case where the node PIX has an electric potential equivalent to High. Though the transistor N101 of the data transfer section TS100 is off in this period, the off-leakage current occurring in the transistor N100 causes the electric potential of the node MRY to gradually change as time passes.

Note that each of the nodes which are floating is influenced by an electric potential change due to a parasitic capacitor of a transistor, a wire, or the like. However, for simplification of explanation, no consideration is herein given to the electric potential change due to the parasitic capacitor.

Assume that an amount of electric potential change in the node MRY due to the off-leakage current is $\alpha$. The node MRY has an electric potential of (High electric potential$-\Delta V1-\alpha$) in the period t103 through the period t104. This causes a further electric potential change in addition to the electric potential change of $\Delta V1$ due to electric charge partitioning and further causes an electric potential change of ($\Delta V1+\alpha$). The node MRY has an electric potential of (Low electric potential+$\Delta V2+\alpha$) in the period t107 through the period t108. This causes a further electric potential change in addition to the electric potential change of $\Delta V2$ due to electric charge partitioning and further causes an electric potential change of ($\Delta V2+\alpha$).

Assume that a threshold voltage of each of the transistor P100 and the transistor N102 of the inverter INV100 is Vth. In a case where the electric potential (High electric potential$-\Delta V1-\alpha$) of the node MRY is lower than (High electric potential$-$Vth), the transistor P100 gradually turns on. In this case, the transistor N102 is on. This causes a problem such that a breakthrough current flows from the High voltage supply line PH100 via the transistor P100 and the transistor N102 to the Low voltage supply line L100 and a large consumption current occurs.

In a state in which such a breakthrough current flows, an output of the inverter INV100 gradually has an electric potential between High and Low. In this case, the node PIX also has an electric potential between High and Low. In a case where the node PIX has an electric potential which cannot be discriminated between High and Low, an operation error occurs in the memory circuit MR100.

Similarly, in a case where the electric potential (Low electric potential+$\Delta V2+\alpha$) of the node MRY is higher than (Low electric potential+Vth), the transistor N102 gradually turns on. In this case, the transistor P100 is on. This causes a problem such that a breakthrough current flows from the High voltage supply line PH100 via the transistor P100 and the transistor N102 to the Low voltage supply line L100 and a large consumption current occurs. In a state in which such a breakthrough current flows, an output of the inverter INV100 gradually has an electric potential between High and Low. In this case, the node PIX also has an electric potential between High and Low. In a case where the node PIX has an electric potential which cannot be discriminated between High and Low, an operation error occurs in the memory circuit MR100.

As described earlier, a conventional memory device has the following problem. According to a memory circuit including (i) a first node (the node PIX in the above example) to which a data electric potential is written, (ii) a second node (the node MRY in the above example) to which data of the first node is transferred from the first node so as to be refreshed, and (iii) a data transfer element provided between the first node and the second node, a circuit which carries out a refresh operation in accordance with an electric potential of the second node cannot appropriately carry out its original operation due to an off-leakage current occurring in the data transfer element.

The present invention has been made in view of the conventional problems, and an object of the present invention is to provide (i) a memory device including: two retaining sections each of which retains a binary logic level corresponding to written data; a transfer section which transfers a binary logic level between the two retaining sections; a circuit which carries out a refresh operation with respect to the other of the two retaining sections in accordance with a binary logic level retained in one of the two retaining sections; and a memory circuit that allows the circuit which carries out the refresh operation to suitably carry out an original operation of the circuit even if an off-leakage current occurs in a transfer element used in the transfer section, (ii) a display device including the memory device, (iii) a method for driving the memory device, and (iv) a method for driving the display device.

Solution to Problem

In order to attain the object, a memory device of the present invention includes: a memory array in which memory cells are provided in a matrix pattern; a row driver which drives each row of the memory array; a column driver which drives each column of the memory array; a first wire which is provided for the each row and connects memory cells in an identical row; a second wire and a third wire each of which connects the memory cells; and a fourth wire which is provided for the each column and connects memory cells in an identical column, the fourth wire being driven by the column driver so that each of a first electric potential level and a second electric potential level each indicating a binary logic level is supplied to the fourth wire, the memory cells of the memory array each including: a switching circuit; a first retaining section; a transfer section; a second retaining section; and a first control section, the switching circuit being driven by the row driver via the first wire, so as to selectively turn on/off between the fourth wire and the first retaining section, the first retaining section retaining the binary logic level to be supplied thereto, the transfer section being driven via the second wire, so as to selectively carry out (i) a transfer operation in which the binary logic level retained in the first retaining section is transferred to the second retaining section in a state in which the binary logic level remains retained in the first retaining section and (ii) a non-transfer operation in which no transfer operation is carried out, the second retaining section retaining the binary logic level to be supplied thereto, the first control section being driven via the third wire, so as to be selectively controlled to be in a state in which the first control section carries out a first operation or a second operation, the first operation being an operation which is carried out by the first control section in (i) an active state in which the first control section receives an input thereto and supplies the input as an output thereof to the first retaining section or (ii) a non-active state in which the first control section stops carrying out an output, the active or non-active state having been selected in accordance with control information indicative of which of the first electric potential level and the second electric potential level is retained in the second retaining section as the binary logic level, the second operation being an operation in which the first control section stops carrying out the output regardless of the control information, and the memory device further comprising a voltage supply which supplies a set electric potential to an input of the first control section.

According to the invention, for example, in a case where data is desired to be written to a memory cell, the binary logic level which corresponds to the data to be written and is the first electric potential level or the second electric potential level is supplied from the column driver to the fourth wire. Then, in a case where the binary logic level is supplied from the fourth wire via the switching circuit to the first retaining section and then retained in the first retaining section, the binary logic level retained in the first retaining section can also be retained in the second retaining section by the transfer operation carried out by the transfer section. The first control section may be in the active state (i) when the first electric potential is retained in the second retaining section or (ii) when the second electric potential level is retained in the second retaining section. In either case, assume that the electric potential of the voltage supply is set to supply a level which is inverse to an active level of the first control section when a period in which the first control section carries out the first operation is finished. In a case where, in a state in which the transfer section is carrying out the non-transfer operation, the first control section carries out the first operation in which the first control section is in the active state, the first retaining section is in a state in which the first retaining section retains a level which is inverse to the binary logic level having been retained therein until then, and the second retaining section is in a state in which the second retaining section retains the binary logic level having been retained therein until then. In contrast, in a case where, in a state in which the transfer section is carrying out the non-transfer operation, the first control section carries out the second operation in which the first control section is in the non-active state, both the first retaining section and the second retaining section are in a state in which the first retaining section and the second retaining section retain the respective binary logic levels having been retained therein until then.

Note here that, in a case where the active level of the first control section is supplied from the column driver to the fourth wire, the binary logic level retained in the first retaining section is overwritten with the active level via the switching circuit, and thereafter the transfer section carries out the transfer operation, both the first retaining section and the second retaining section are in a state in which the first retaining section and the second retaining section retain a level which is inverse to the binary logic level obtained during writing. According to this, refresh can be carried out in a memory cell. The refresh can be repeated by repeating similar operation to the operation described above. According to the refresh, the binary logic level to be retained is inverted every time the refresh is carried out with respect to identical written data supplied from the column driver.

As described earlier, according to the arrangement, in a case where one and the other of the first electric potential level and the second electric potential level are supplied from the fourth wire and the voltage supply, respectively to each of the memory cells by no use of an inverter after binary logic data has been written to the first retaining section, a binary logic level corresponding to the binary logic data having been written to a memory cell can be refreshed while being subjected to a level inversion. Since a binary logic level which has been refreshed and is retained in the first retaining section and a binary logic level which has been refreshed and is retained in the second retaining section are equal to each other, the first retaining section and the second retaining section do not change in electric potential even if the transfer section carries out the transfer operation. This allows both the first retaining section and the second retaining section to retain the binary logic levels thus refreshed for a long time while the transfer section is in a state in which the transfer section carries out the transfer operation. In this case, since the first retaining section and the second retaining section are connected via the transfer section, occurrence of an off-leakage current in a transfer element of the transfer section is irrelevant to retention of the binary logic levels. The binary logic levels, which are retained in a mass by a large electric capacitance represented by a sum of the first retaining section and the second retaining section, are less likely to change in electric potential even by an influence of a noise from outside.

Accordingly, even if the off-leakage current occurs in the transfer element used in the transfer section, an electric potential of a retaining node which retains the binary logic level of the second retaining section is less likely to change since the electric potential is retained for a long time together with an electric potential of a retaining node of the first retaining section. According to a conventional memory cell, the binary logic levels which have been refreshed and are different from each other are retained for a long time in a state in which the first retaining section and the second retaining section are electrically separated from each other by the transfer element of the transfer section. Therefore, the off-leakage current of the transfer element has a great influence on the electric potential of the second retaining section.

Further, even if the electric potential of the retaining node of the second retaining section changes, a time for the change is not long enough for the control information for the first control section carrying out the first operation to change between the active level and the non-active level.

In a case where it is assumed that an inverter exists in the first control section, there exist two complementary levels of a High level and a Low level as active levels at each of which the inverter operates. Therefore, a range is narrow in which the electric potential of the second retaining section can exist as a level at which the inverter stably maintains an identical operation. For example, assume that the electric potential of the second retaining section is at the Low level. While the inverter is being operated so that a p-channel transistor turns on and an n-channel transistor turns off, it is feared that a slight increase in gate electric potential of the p-channel transistor may cause the n-channel transistor to turn on. However, in a case where the n-channel transistor is designed to have a large threshold voltage so as to avoid such a fear and the inverter is desired to operate so that the p-channel transistor turns off and the n-channel transistor turns on, a range becomes narrow in which the High level functions as the active level. In contrast, according to the invention, the active level of the first control section is one of the first electric potential level and the second electric potential level. Therefore, in a case where a broad range is secured in which the control information for the first control section exists as the non-active level, it is less feared that the non-active level may change to the active level. In contrast, in a case where the active level functions at an early stage of the active state of the first operation of the first control section, an object of the active level to be supplied from the voltage supply section to the first retaining section is easily attained. Therefore, even in a case where the active level finally changes to the non-active level, the change is less likely to cause an operation error in the first control section. Accordingly, even if the electric potential of the retaining node of the second retaining section changes, it is possible to carry out designing with such a large margin as to prevent the operation error in the first control section. For example, assume that the control information for the first control section is supplied to a gate of a transistor. Such designing corresponds to designing such that an increase in threshold voltage of the transistor causes a gate-source voltage to be less likely to exceed the threshold voltage of the transistor even if the electric potential of the second retaining section which electric potential should be at the non-active level changes.

Further, in a case where the electric potential of the retaining node of the second retaining section changes but the first control section carries out the second operation, no operation error occurs.

This yields an effect of providing a memory device such that, even if an off-leakage current occurs in a transfer element used in a transfer section which transfers binary logic data between two retaining sections, a circuit which carries out a refresh operation in accordance with a binary logic level retained in one of the two retaining sections can suitably carry out its original operation with no increase in consumption current and no operation error.

Advantageous Effects of Invention

As described above, a memory device of the present invention includes: a memory array in which memory cells are provided in a matrix pattern; a row driver which drives each row of the memory array; a column driver which drives each column of the memory array; a first wire which is provided for the each row and connects memory cells in an identical row; a second wire and a third wire each of which connects the memory cells; and a fourth wire which is provided for the each column and connects memory cells in an identical column, the fourth wire being driven by the column driver so that each of a first electric potential level and a second electric potential level each indicating a binary logic level is supplied to the fourth wire, the memory cells of the memory array each including: a switching circuit; a first retaining section; a transfer section; a second retaining section; and a first control section, the switching circuit being driven by the row driver via the first wire, so as to selectively turn on/off between the fourth wire and the first retaining section, the first retaining section retaining the binary logic level to be supplied thereto, the transfer section being driven via the second wire, so as to selectively carry out (i) a transfer operation in which the binary logic level retained in the first retaining section is transferred to the second retaining section in a state in which the binary logic level remains retained in the first retaining section and (ii) a non-transfer operation in which no transfer operation is carried out, the second retaining section retaining the binary logic level to be supplied thereto, the first control section being driven via the third wire, so as to be selectively controlled to be in a state in which the first control section carries out a first operation or a second operation, the first operation being an operation which is carried out by the first control section in (i) an active state in which the first control section receives an input thereto and supplies the input as an output thereof to the first retaining section or (ii) a non-active state in which the first control section stops carrying out an output, the active or non-active state having been selected in accordance with control information indicative of which of the first electric potential level and the second electric potential level is retained in the second retaining section as the binary logic level, the second operation being an operation in which the first control section stops carrying out the output regardless of the control information, and the memory device further comprising a voltage supply which supplies a set electric potential to an input of the first control section.

As described above, it is possible to yield an effect of providing a memory device such that, even if an off-leakage current occurs in a transfer element used in a transfer section which transfers binary logic data between two retaining sections, a circuit which carries out a refresh operation in accordance with a binary logic level retained in one of the two retaining sections can suitably carry out its original operation with no increase in consumption current and no operation error.

BRIEF DESCRIPTION OF DRAWINGS

FIG. 5, which shows the embodiment of the present invention, illustrates polarities of data.

DESCRIPTION OF EMBODIMENTS

[First Embodiment]

An embodiment of the present invention is described below with reference to FIG. 1 through FIG. 24 and FIG. 30 through FIG. 33.

The present embodiment discusses a memory device which is capable of writing and reading data.

Figure 21:
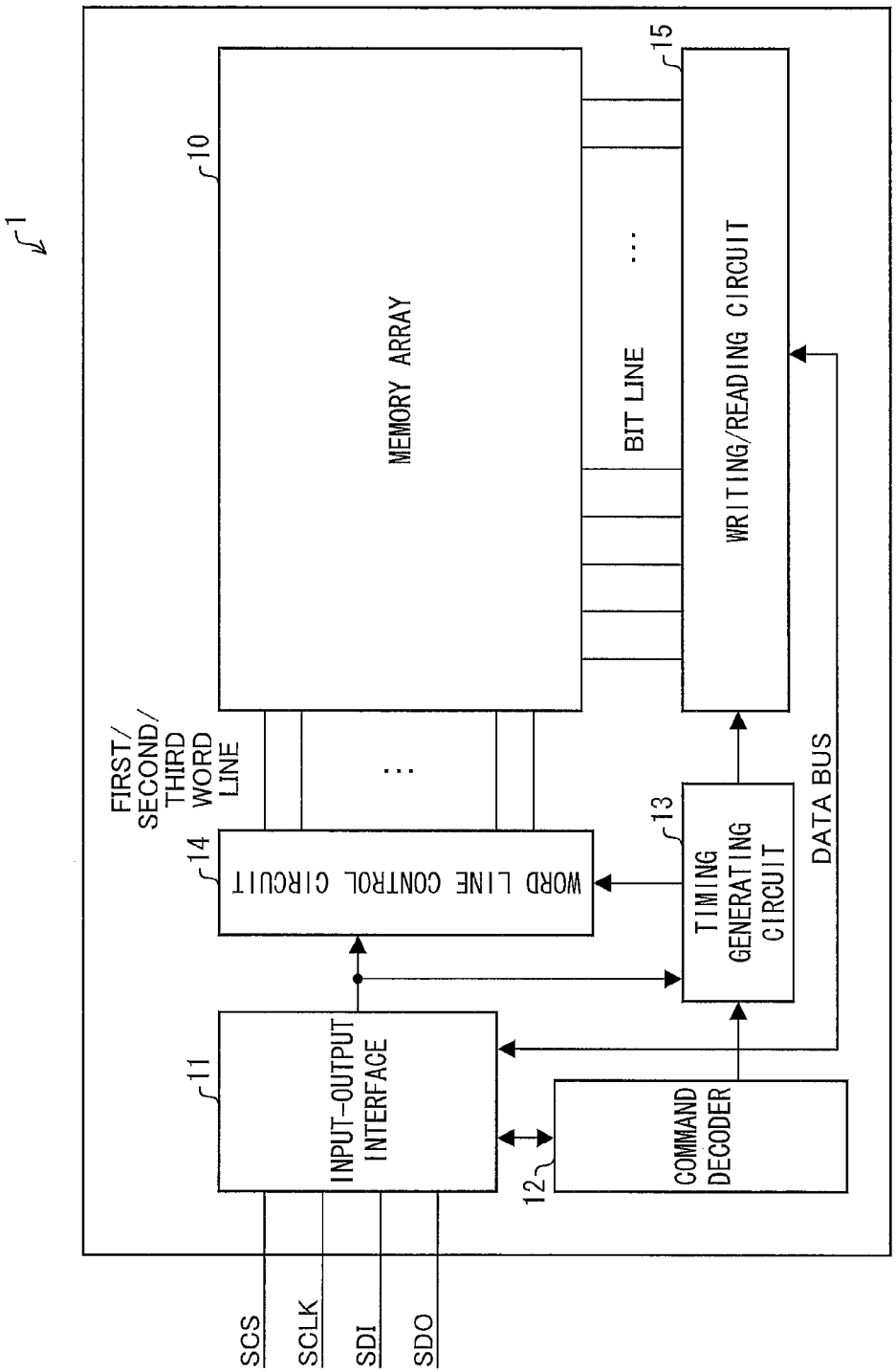
FIG. 21, which shows the embodiment of the present invention, is a block diagram illustrating an arrangement of a memory device.

FIG. 21 illustrates an arrangement of a memory device 1 of the present embodiment.

The memory device 1 includes a memory array 10, an input-output interface 11, a command decoder 12, a timing generating circuit 13, a word line control circuit 14, and a writing/reading circuit 15.

Figure 22:
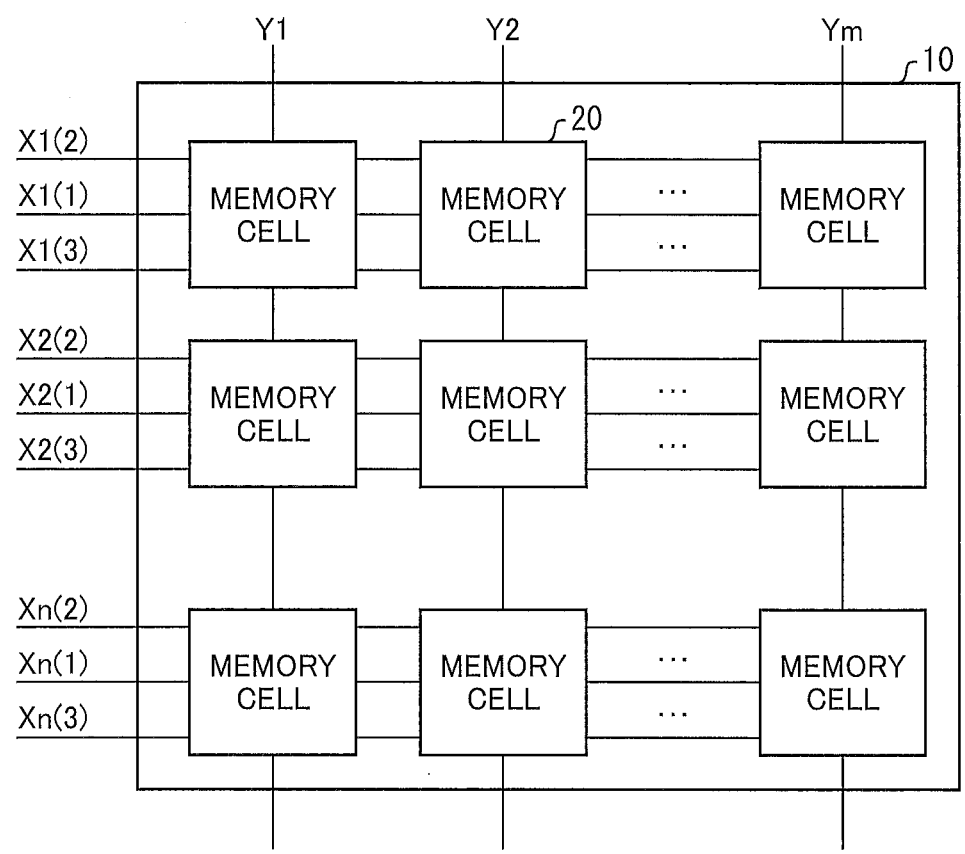
FIG. 22 is a block diagram illustrating how memory cells and wires of the memory device of FIG. 21 are arranged.

The memory array 10 is arranged such that memory cells 20 are provided in a matrix with n rows and m columns (see FIG. 22). Each of the memory cells 20 independently retains data. The first word line $Xi(1)$, the second word line $Xi(2)$, and the third word line $Xi(3)$ which are connected to the ith (i is an integer, $1 \leq i \leq n$) row, and a bit line Yj which is connected to the jth (j is an integer, $1 \leq j \leq m$) column control writing and reading of data with respect to a memory cell 20 located at an intersection of the ith row and the jth column.

The input-output interface 11 controls an input-output of data between the memory device 1 and an outside of the memory device 1. For example, a four-wire serial interface used as the input-output interface 11 controls a transmission of a serial chip select signal SCS, a serial clock signal SCLK, a serial data input signal SDI, and a serial data output signal SDO (see FIG. 21). According to this, the input-output interface 11 receives a writing/reading command and/or an address/data from outside and supplies, to the outside, data read out from the memory array 10. The input-output interface 11 is not limited to the four-wire serial interface but may be a parallel interface.

The command decoder 12 is connected to each of the input-output interface 11 and the timing generating circuit 13. The command decoder 12 is a circuit which interprets the command received from the input-output interface 11 and selects an operation mode in accordance with the interpretation, so as to transmit the operation mode thus selected to the timing generating circuit 13.

The timing generating circuit 13 is connected to each of the input-output interface 11, the command decoder 12, the word line control circuit 14, and the writing/reading circuit 15. In accordance with the operation mode determined by the command decoder 12, the timing generating circuit 13 generates an internal timing signal which is necessary for each operation. A clock signal which serves as a basis for a timing may be supplied from an external system via the input-output interface 11 or may be generated inside the memory device 1 or inside the timing generating circuit 13 by an oscillator or the like.

The word line control circuit (row driver) 14 is connected to each of the memory array 10, the input-output interface 11, and the timing generating circuit 13. In accordance with the internal timing signal generated by the timing generating circuit 13, the word line control circuit 14 controls a word line which is appropriately selected, in accordance with a writing/reading address to be supplied from the input-output interface 11, from among a plurality of kinds of word lines of the first word line $Xi(1)$, the second word line $Xi(2)$, and the third word line $Xi(3)$ (i is the row number) which are connected to each row of the memory array 10.

The writing/reading circuit (column driver) 15 is connected to each of the memory array 10, the input-output interface 11, and the timing generating circuit 13. In accordance with the internal timing signal generated by the timing generating circuit 13, the writing/reading circuit 15 controls the bit line Yj (j is the column number) which is connected to each column of the memory array 10. During writing of data, the writing/reading circuit 15 applies, to a bit line, a binary logic level in accordance with written data to be supplied from the input-output interface 11. During reading of data, the writing/reading circuit 15 senses an electric potential of each bit line and supplies data in accordance with a sensed value to the input-output interface 11. Binary logic levels are indicated by a first electric potential level and a second electric potential level. For example, one and the other of the first electric potential level and the second electric potential level are indicated by a High electric potential and a Low electric potential, respectively. The first electric potential level and the second electric potential level, which are logic levels, may have respective values falling within a given range.

Figure 23:
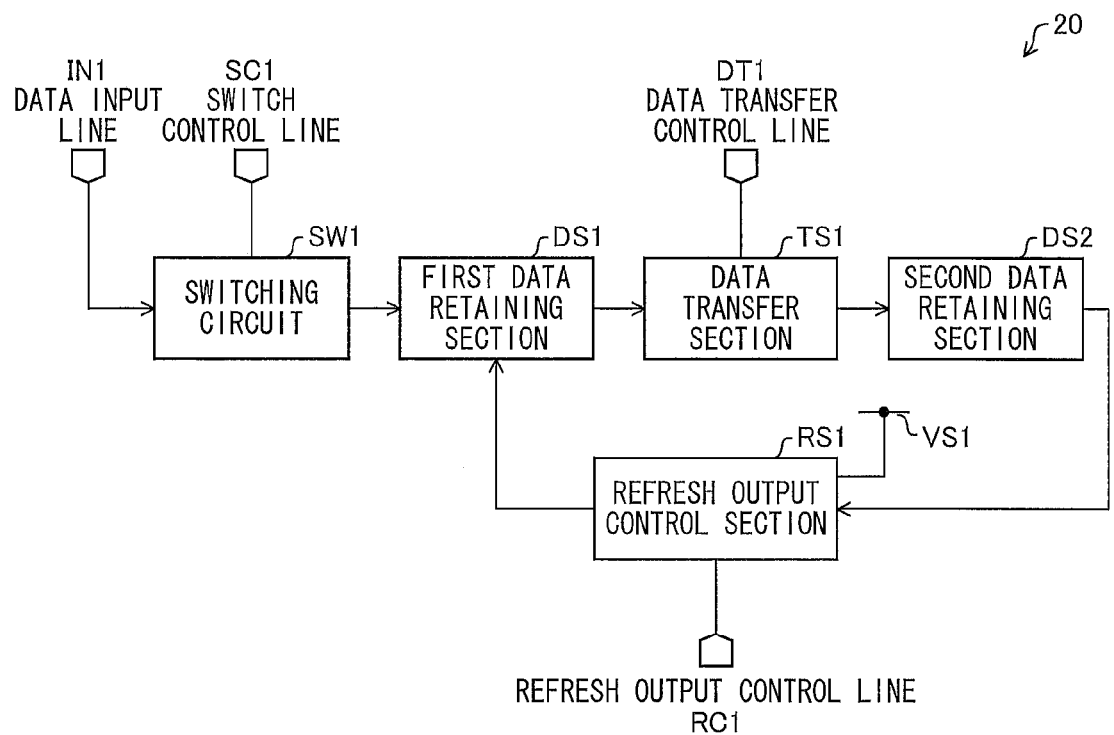
FIG. 23 is a block diagram illustrating an arrangement of a memory cell of FIG. 22.

FIG. 23 shows a concept of an arrangement of each of the memory cells 20.

A memory cell 20 includes a switching circuit SW1, a first data retaining section DS1, a data transfer section TS1, a second data retaining section DS2, a refresh output control section RS1, and a voltage supply VS1.

The memory array 10 includes a data input line IN1, a switch control line SC1, a data transfer control line DT1, and a refresh output control line RC1. In FIG. 22, the bit line Yj corresponds to the data input line IN1, the first word line $Xi(1)$ corresponds to the switch control line SC1, the second word line $Xi(2)$ corresponds to the data transfer control line DT1, and the third word line $Xi(3)$ corresponds to the refresh output control line RC1.

The switching circuit SW1 is driven by the word line control circuit 14 via the switch control line SC1 (a first wire), so as to selectively turn on/off between the data input line IN1 (a fourth wire) and the first data retaining section (first retaining section) DS1 (selectively electrically connect/disconnect the data input line IN1 (a fourth wire) and the first data retaining section (first retaining section) DS1 with/from each other).

The first data retaining section DS1 retains a binary logic level to be supplied thereto.

The data transfer section (transfer section) DT1 is driven by the word line control circuit 14 via the data transfer control line DT1 (a second wire), so as to selectively carry out (i) a transfer operation in which the binary logic level retained in the first data retaining section DS1 is transferred to the second data retaining section DS2 in a state in which the binary logic level remains retained in the first data retaining section DS1 and (ii) a non-transfer operation in which no transfer operation is carried out. Note that, since a signal to be supplied to the data transfer control line DT1 is shared by all the memory cells 20, the data transfer control line DT1 is not necessarily required to be provided for each row to be driven by the word line control circuit 14. The data transfer control line DT1 may be driven by the writing/reading circuit 15 or the like.

The second data retaining section (second retaining section) DS2 retains the binary logic level to be supplied thereto.

The refresh output control section (first control section) RS1 is driven by the word line control circuit 14 via the refresh output control line RC1 (a third wire), so as to be selectively controlled to be in a state in which the refresh output control section RS1 carries out a first operation or a second operation. Note that, since a signal to be supplied to the refresh output control line RC1 is shared by all the memory cells 20, the refresh output control line RC1 is not necessarily required to be provided for each row to be driven by the word line control circuit 14. The refresh output control line RC1 may be driven by the writing/reading circuit 15 or the like.

In the first operation, an active state or a non-active state is selected in accordance with control information indicative of which of the first electric potential level and the second electric potential level is retained in the second data retaining section DS2 as the binary logic level. In the active state, the refresh output control section RS1 receives an input thereto and supplies the input as an output thereof to the first data retaining section DS1. In the non-active state, the refresh output control section RS1 stops carrying out an output.

In the second operation, the refresh output control section RS1 stops carrying out the output regardless of the control information.

The voltage supply VS1 supplies a set electric potential to an input of the refresh output control section RS1.

Figure 24:
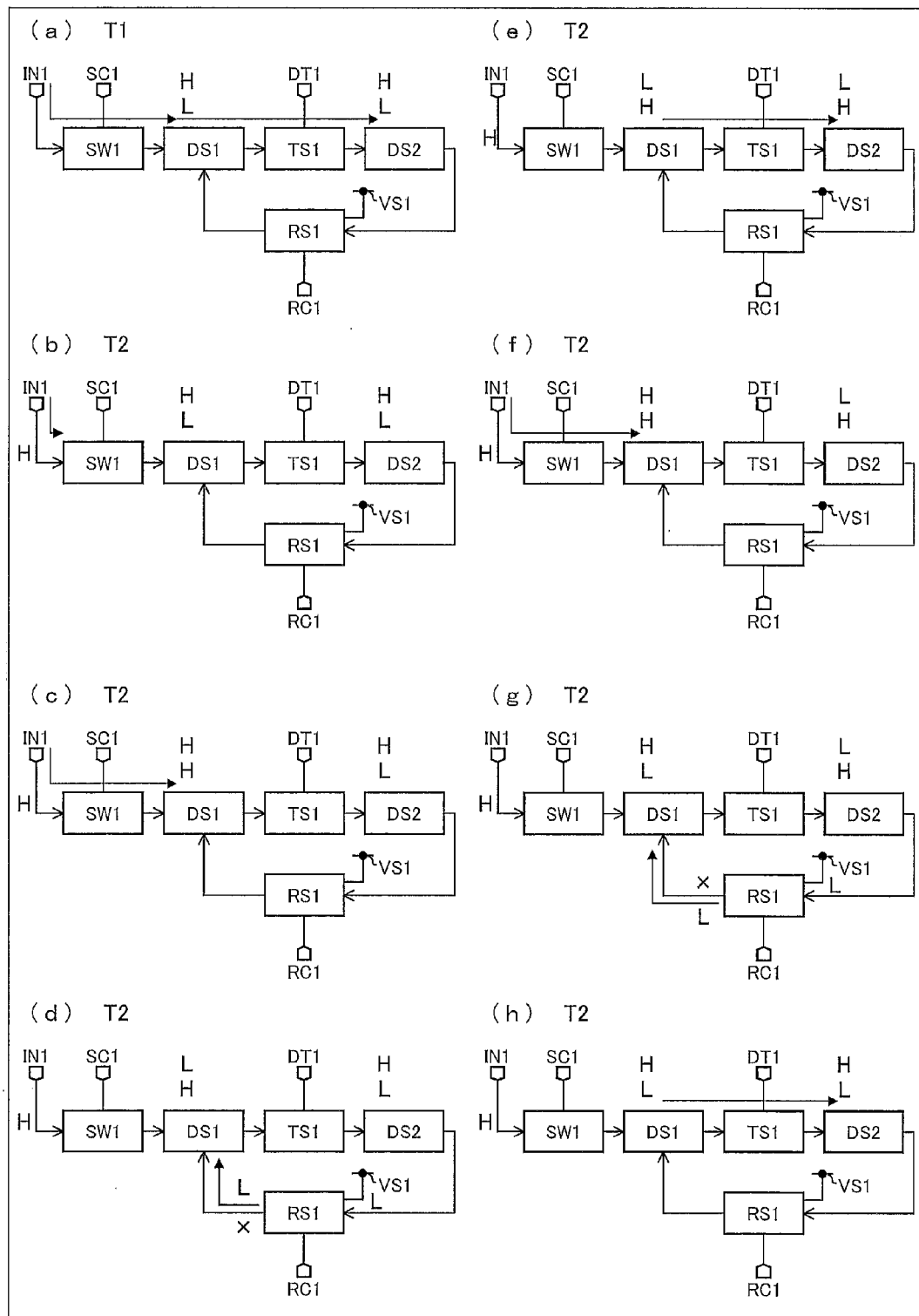
FIG. 24 illustrates operations of the memory cell of FIG. 23. (a) through (h) of FIG. 24 illustrate the respective operations.

Next, a transition of a state of the memory cell 20 is described below with reference to (a) through (h) of FIG. 24. Each of (a) through (h) of FIG. 24 illustrates "H" assuming that the first electric potential level is High and illustrates "L" assuming that the second electric potential level is Low. As for parts of FIG. 24 in each of which "H" and "L" are vertically juxtaposed to each other, the upper "H" or "L" shows a transition state of an electric potential level obtained during writing of "H" to the memory cell 20, and the lower "H" or "L" shows a transition state of an electric potential level obtained during writing of "L" to the memory cell 20.

First, a writing period T1 for writing data is set in a data writing mode.

In the writing period T1, the switch control line SC1 causes the switching circuit SW1 to turn on, and a binary logic level to be retained is supplied from the data input line IN1 via the switching circuit SW1 to the first data retaining section DS1, the binary logic level being indicated by the first electric potential level or the second electric potential level corresponding to data (see (a) of FIG. 24).

After the supply of the binary logic level to the first data retaining section DS1, the switch control line SC1 causes the switching circuit SW1 to turn off. In this case, the data transfer control line DT1 causes the data transfer section TS1 to turn on, i.e., to be in a state in which the data transfer section TS1 carries out the transfer operation, and the binary logic level having been supplied to the first data retaining section DS1 is transferred from the first data retaining section DS1 via the data transfer section TS1 to the second data retaining section DS2 in a state in which the binary logic level remains retained in the first data retaining section DS1. After the binary logic level has been transferred to the second data retaining section DS2, the data transfer section TS1 turns off, i.e., is in a state in which the data transfer section TS1 carries out the non-transfer operation.

A refresh period T2 is set following the writing period T1.

In the refresh period T2, the first electric potential level is first supplied from the writing/reading circuit 15 to the data input line IN1 (see (b) of FIG. 24).

Then, the switch control line SC1 causes the switching circuit SW1 to turn on, and the first electric potential level is supplied from the data input line IN1 via the switching circuit SW1 to the first data retaining section DS1 (see (c) of FIG. 24). After the supply of the first electric potential level to the first data retaining section DS1, the switch control line SC1 causes the switching circuit SW1 to turn off.

Next, the refresh output control line RC1 controls the refresh output control section RS1 to be in a state in which the refresh output control section RS1 carries out the first operation (see (d) of FIG. 24). The refresh output control section RS1 carries out the first operation differently in accordance with the control information indicative of which of the first electric potential level and the second electric potential level is retained in the second data retaining section DS2 as the binary logic level.

Namely, in a case where the first electric potential level is retained in the second data retaining section DS2 and first control information indicating that the first electric potential level is retained in the second data retaining section DS2 is transmitted from the second data retaining section DS2 to the refresh output control section RS1, the refresh output control section RS1 is in the active state, in which the refresh output control section RS1 receives the input thereto and supplies the input as the output thereof to the first data retaining section DS1. In a case where the refresh output control section RS1 carries out the first operation, the electric potential of the voltage supply VS1 is set so that the second electric potential level can be at least finally supplied to the input of the refresh output control section RS1 in a period during which the first control information is being transmitted to the refresh output control section RS1. In this case, the first data retaining section DS1 retains the second electric potential level in a state in which the binary logic level having been retained therein until then is overwritten with the second electric potential level having been supplied from the refresh output control section RS1.

In contrast, in a case where the second electric potential level is retained in the second data retaining section DS2, the refresh output control section RS1 is in the non-active state. In a case where second control information indicating that the second electric potential level is retained in the second data retaining section DS2 is transmitted from the second data retaining section DS2 to the refresh output control section RS1, the refresh output control section RS1 is in a state in which the refresh output control section RS1 stops carrying out the output (an "X" in FIG. 24). In this case, the first data retaining section DS1 continues retaining the first electric potential level having been retained therein until then.

Thereafter, the refresh output control line RC1 controls the refresh output control section RS1 to be in a state in which the refresh output control section RS1 carries out the second operation.

Subsequently, in the refresh period T2, the data transfer control line DT1 causes the data transfer section TS1 to be in the state in which the data transfer section TS1 carries out the transfer operation, and binary logic data having been retained in the first data retaining section DS1 until then is transferred from the first data retaining section DS1 via the data transfer section TS1 to the second data retaining section DS2 in a state in which the binary logic data remains retained in the first data retaining section DS1 (see (e) of FIG. 24). After the binary logic data has been transferred from the first data retaining section DS1 to the second data retaining section DS2, the data transfer section TS1 turns off, i.e., is in a state in which the data transfer section TS1 carries out the non-transfer operation.

Then, the switch control line SC1 causes the switching circuit SW1 to turn on, and the first electric potential level is supplied from the data input line IN1 via the switching circuit SW1 to the first data retaining section DS1 (see (f) of FIG. 24). After the supply of the first electric potential level to the first data retaining section DS1, the switch control line SC1 causes the switching circuit SW1 to turn off.

Next, the refresh output control line RC1 controls the refresh output control section RS1 to be in a state in which the refresh output control section RS1 carries out the first operation (see (g) of FIG. 24). In a case where the first electric potential level is retained in the second data retaining section DS2, the refresh output control section RS1 is in the active state, in which the refresh output control section RS1 supplies, to the first data retaining section DS1, the second electric potential level to be supplied from the voltage supply VS1. In this case, the first data retaining section DS1 retains the second electric potential level in a state in which the binary logic level having been retained therein until then is overwritten with the second electric potential level having been supplied from the refresh output control section RS1. In contrast, in a case where the second electric potential level is retained in the second data retaining section DS2, the refresh output control section RS1 is in the non-active state, in which the refresh output control section RS1 stops carrying out the output. In this case, the first data retaining section DS1 continues retaining the first electric potential level having been retained therein until then. Thereafter, the refresh output control line RC1 controls the refresh output control section RS1 to be in a state in which the refresh output control section RS1 carries out the second operation, so that the refresh output control section RS1 is in a state in which the refresh output control section RS1 stops carrying out the output.

Subsequently, the data transfer control line DT1 causes the data transfer section TS1 to be in the state in which the data transfer section TS1 carries out the transfer operation, and the binary logic level having been retained in the first data retaining section DS1 until then is transferred from the first data retaining section DS1 via the data transfer section TS1 to the second data retaining section DS2 in a state in which the binary logic level remains retained in the first data retaining section DS1 (see (h) of FIG. 24). After the binary logic level has been transferred from the first data retaining section DS1 to the second data retaining section DS2, the data transfer section TS1 turns off, i.e., is in a state in which the data transfer section TS1 carries out the non-transfer operation.

In (h) of FIG. 24, the above series of operations allows the binary logic level having been written in the writing period T1 of (a) of FIG. 24 to be restored in each of the first data retaining section DS1 and the second data retaining section DS2. Accordingly, data having been written in the writing period T1 is similarly restored even if the operations from (b) to (h) of FIG. 24 are repeated any number of times after the operation (h) of FIG. 24.

Note here that, in a case where the first electric potential level (High here) has been written in the writing period T1, the binary logic level is refreshed by being subjected to a level inversion carried out one time in each of (d) of FIG. 24 and (f) of FIG. 24, so that the binary logic level thus refreshed is restored to the first electric potential level. In a case where the second electric potential level (Low here) has been written in the writing period T1, the binary logic level is refreshed by being subjected to a level inversion carried out one time in each of (c) of FIG. 24 and (g) of FIG. 24, so that the binary logic level thus refreshed is restored to the second electric potential level.

Note that, in a case where the first electric potential level is Low and the second electric potential is High, it is only necessary that the above operation logic be inverted.

In the refresh period T2, the first electric potential level is supplied from the data input line IN1 to the first data retaining section DS1 (see (c) and (f) of FIG. 24), and the refresh output control section RS1 supplies the second electric potential level from the voltage supply VS1 to the first data retaining section DS1 (see (d) and (g) of FIG. 24). Therefore, unlike a conventional art, it is unnecessary to provide an inverter so as to carry out a refresh operation.

As described earlier, according to the memory device 1, in a case where one and the other of the first electric potential level and the second electric potential level are supplied from the data input line IN1 and the voltage supply VS1, respectively to each of the memory cells 20 by no use of an inverter after binary logic data has been written to the first data retaining section DS1, a binary logic level corresponding to the binary logic data having been written to a memory cell 20 can be refreshed while being subjected to a level inversion. Since a binary logic level which has been refreshed and is retained in the first data retaining section DS1 and a binary logic level which has been refreshed and is retained in the second data retaining section DS2 are equal to each other, the first data retaining section DS1 and the second data retaining section DS2 do not change in electric potential even if the data transfer section TS1 carries out the transfer operation. This allows both the first data retaining section DS1 and the second data retaining section DS2 to retain the binary logic levels thus refreshed for a long time while the data transfer section TS1 is in a state in which the data transfer section TS1 carries out the transfer operation. In this case, since the first data retaining section DS1 and the second data retaining section DS2 are connected via the data transfer section TS1, occurrence of an off-leakage current in a transfer element of the data transfer section TS1 is irrelevant to retention of the binary logic levels. The binary logic levels, which are retained in a mass by a large electric capacitance represented by a sum of the first data retaining section DS1 and the second data retaining section DS2, are less likely to change in electric potential even by an influence of a noise from outside.

Figure 29:
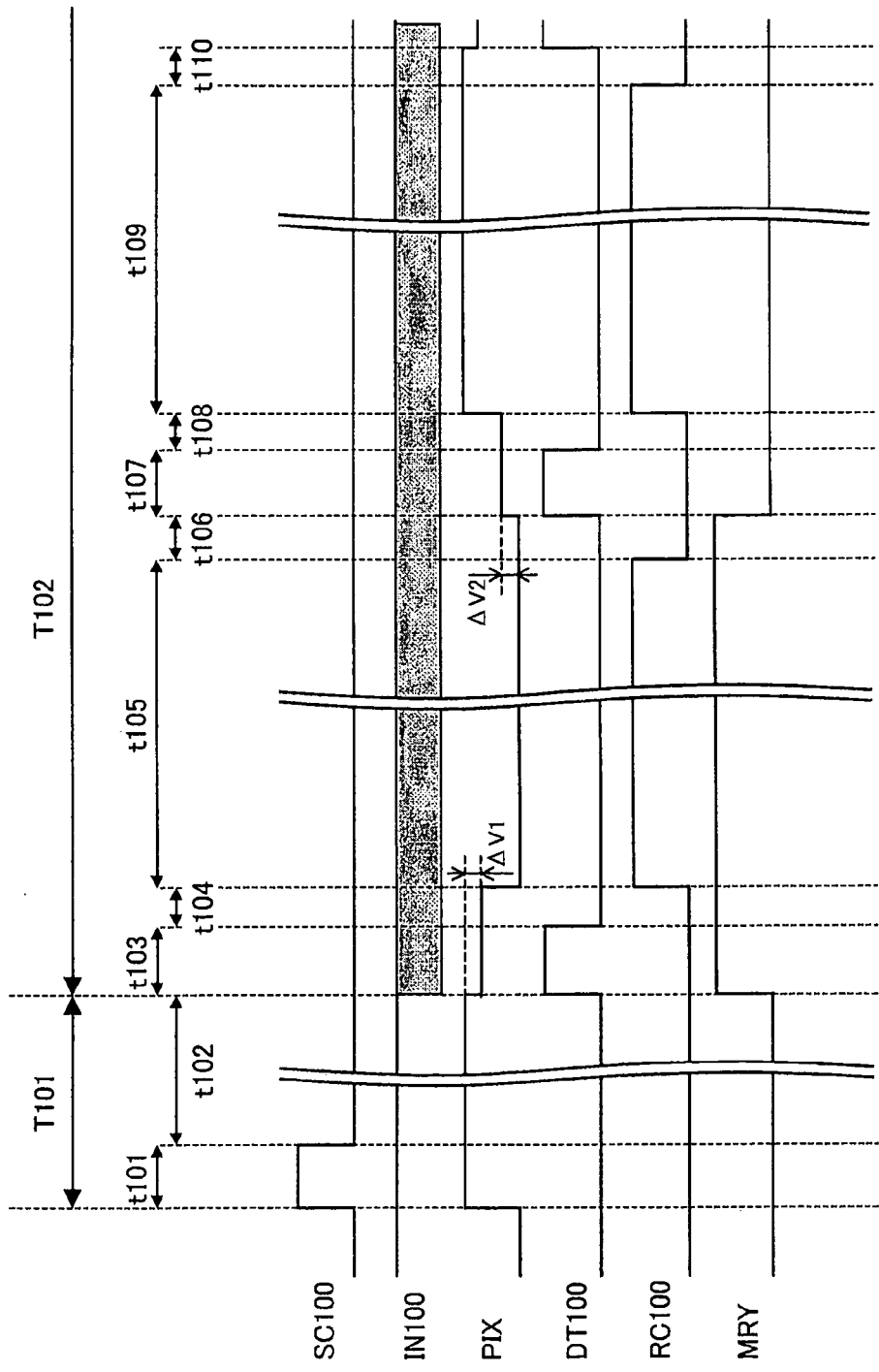
FIG. 29 is a signal diagram illustrating a writing operation of the memory circuit of FIG. 28.

Accordingly, even if the off-leakage current occurs in the transfer element used in the data transfer section TS1, an electric potential of a retaining node which retains the binary logic level of the second data retaining section DS2 is less likely to change since the electric potential is retained for a long time together with an electric potential of a retaining node of the first data retaining section DS1. According to a conventional memory cell, the binary logic levels which have been refreshed and are different from each other are retained for a long time in a state in which the first data retaining section DS1 and the second data retaining section DS2 are electrically separated from each other by the transfer element (transistor N101) of the data transfer section TS100 (see the period t105 and the period t109 which are illustrated in FIG. 29). Therefore, the off-leakage current of the transfer element has a great influence on the electric potential of the second data retaining section DS102.

Further, even if the electric potential of the retaining node of the second data retaining section DS2 changes, a time for the change is not long enough for the control information for the refresh control section RS1 carrying out the first operation to change between the active level and the non-active level.

In a case where it is assumed that an inverter exists in the refresh control section RS1, there exist two complementary levels of a High level and a Low level as active levels at each of which the inverter operates. Therefore, a range is narrow in which the electric potential of the second data retaining section DS2 can exist as a level at which the inverter stably maintains an identical operation. For example, assume that the electric potential of the second data retaining section DS2 is at the Low level. While the inverter is being operated so that a p-channel transistor turns on and an n-channel transistor turns off, it is feared that a slight increase in gate electric potential of the p-channel transistor may cause the n-channel transistor to turn on. However, in a case where the n-channel transistor is designed to have a large threshold voltage so as to avoid such a fear and the inverter is desired to operate so that the p-channel transistor turns off and the n-channel transistor turns on, a range becomes narrow in which the High level functions as the active level. In contrast, according to the present embodiment, the active level of the refresh control section RS1 is one of the first electric potential level and the second electric potential level. Therefore, in a case where a broad range is secured in which the control information for the refresh control section RS1 exists as the non-active level, it is less feared that the non-active level may change to the active level. In contrast, in a case where the active level functions at an early stage of the active state of the first operation of the refresh control section RS1, an object of the active level to be supplied from the voltage supply section VS1 to the first data retaining section DS1 is easily attained. Therefore, even in a case where the active level finally changes to the non-active level, the change is less likely to cause an operation error in the refresh control section RS1. Accordingly, even if the electric potential of the retaining node of the second data retaining section DS2 changes, it is possible to carry out designing with such a large margin as to prevent the operation error in the refresh control section RS1. For example, assume that the control information for the refresh control section RS1 is supplied to a gate of a transistor. Such designing corresponds to designing such that an increase in threshold voltage of the transistor causes a gate-source voltage to be less likely to exceed the threshold voltage of the transistor even if the electric potential of the second data retaining section DS2 which electric potential should be at the non-active level changes.

Further, in a case where the electric potential of the retaining node of the second data retaining section DS2 changes but the refresh output control section RS1 carries out the second operation, no operation error occurs.

Accordingly, it is possible to provide a memory device such that, even if an off-leakage current occurs in a transfer element used in a transfer section which transfers binary logic data between two retaining sections, a circuit which carries out a refresh operation in accordance with a binary logic level retained in one of the two retaining sections can suitably carry out its original operation with no increase in consumption current and no operation error.

Next, the following description specifically discusses an arrangement and an operation of the memory cell 20 with reference to Examples.

FIRST EXAMPLE

Figure 1:
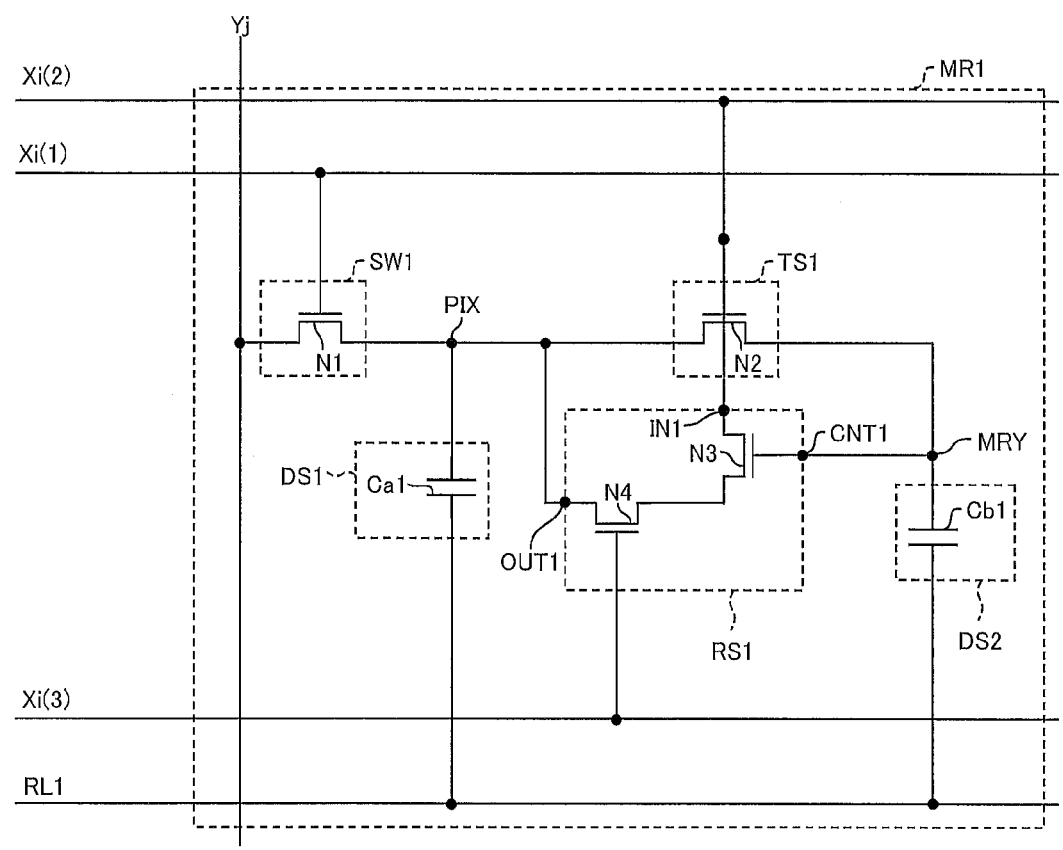
FIG. 1, which shows an embodiment of the present invention, is a circuit diagram illustrating a configuration of a first memory circuit.

FIG. 1 illustrates an arrangement of the memory cell of the present Example in the form of a memory circuit MR1 which is an equivalent circuit.

As described above, the memory circuit MR1 includes a switching circuit SW1, a first data retaining section DS1, a data transfer section TS1, a second data retaining section DS2, and a refresh output control section RS1.

The switching circuit SW1 includes a transistor N1 which is an N-channel TFT. The first data retaining section DS1 includes a capacitor (first capacitor) Ca1. The data transfer section TS1 includes a transistor (third switch) N2 which is an N-channel TFT serving as a transfer element. The second data retaining section DS2 includes a capacitor (second capacitor) Cb1. The refresh output control section RS1 includes a transistor (first switch) N3 which is an N-channel TFT and a transistor (second switch) N4 which is an N-channel TFT. The capacitor Ca1 has a larger capacitance than the capacitor Cb1.

Namely, in FIG. 1, all the transistors constituting the memory circuit are N-channel TFTs (field-effect transistors). Accordingly, the memory circuit MR1 can be easily built into amorphous silicon.

As wires for driving each memory circuit MR1, the memory device 1 includes a reference electric potential wire RL1 in addition to the first word line Xi(1), the second word line Xi(2), the third word line Xi(3), and the bit line Yj.

One and the other of drain/source terminals of a field-effect transistor such as a TFT mentioned above are hereinafter referred to as a first drain/source terminal and a second drain/source terminal, respectively. The same applies to the other Examples.

The transistor N1 has a gate terminal which is connected to the first word line Xi(1), a first drain/source terminal which is connected to the bit line Yj, and a second drain/source terminal which is connected to a node (retaining node) PIX (first connection point) which is one end of the capacitor Ca1. The other end of the capacitor Ca1 is connected to the reference electric potential wire RL1. When the transistor N1 is on, the switching circuit SW1 turns on. Meanwhile, when the transistor N1 is off, the switching circuit SW1 turns off.

The transistor N2 has a gate terminal which is connected to the second word line Xi(2), a first drain/source terminal which is connected to the node PIX, and a second drain/source terminal which is connected to a node (retaining node) MRY which is one end of the capacitor Cb1. The other end of the capacitor Cb1 is connected to the reference electric potential wire RL1. When the transistor N2 is on, the data transfer section TS1 is in a state in which the data transfer section TS1 carries out the transfer operation. Meanwhile, when the transistor N2 is off, the data transfer section TS1 is in a state in which the data transfer section TS1 carries out the non-transfer operation.

The transistor N3 has a gate terminal which is connected, as a control terminal CNT1 of the refresh output control section RS1, to the node MRY, a first drain/source terminal which is connected, as an input terminal IN1 of the refresh output control section RS1, to the second word line Xi(2), and a second drain/source terminal which is connected to a first drain/source terminal of the transistor N4. The transistor N4 has a gate terminal which is connected to the third word line Xi(3), and a second drain/source terminal which is connected, as an output terminal OUT1 of the refresh output control section RS1, to the node PIX. That is, the transistor N3 and the transistor N4 are connected in series to each other between an input of the refresh output control section RS1 and an output of the refresh output control section RS1 so that the transistor N3 is located closer to the input of the refresh output control section RS1. Note that the location of the transistor N3 may be replaced with that of the transistor N4 in the above example. Namely, it is only necessary that the transistor N3 and the transistor N4 be connected in series to each other between the input of the refresh output control section RS1 and the output of the refresh output control section RS1.

When the transistor N4 is on, the refresh output control section RS1 is controlled to be in a state in which the refresh output control section RS1 carries out the first operation. Meanwhile, when the transistor N4 is off, the refresh output control section RS1 is controlled to be in a state in which the refresh output control section RS1 carries out the second operation. Since the transistor N3 is an N-channel TFT, control information which causes the refresh output control section RS1 to be in an active state during the first operation, i.e., an active level is High, and control information which causes the refresh output control section RS1 to be in a non-active state during the first operation, i.e., a non-active level is Low.

The following description discusses operation of the memory circuit MR1 configured as above.

First, a writing operation of the memory circuit MR1 is to be described.

The writing operation is carried out as follows. Specifically, the input-output interface 11 receives a writing command and a writing address from an outside of the memory device 1 via a transmission line, and the command decoder 12 interprets the command and changes to be in a writing mode. In accordance with a signal indicative of the writing mode of the command decoder 12, the timing generating circuit 13 generates an internal timing signal for the writing operation. The word line control circuit 14 controls a first word line Xi(1), a second word line Xi(2), and a third word line Xi(3) that are selected by the writing address to be supplied from the input-output interface 11. The writing/reading circuit 15 controls all the bit lines Yj. In the following description, the first word line Xi(1), the second word line Xi(2), and the third word line Xi(3) that are selected by the writing address are referred to as a first word line Xiw(1), a second word line Xiw(2), and a third word line Xiw(3), respectively.

Figure 2:
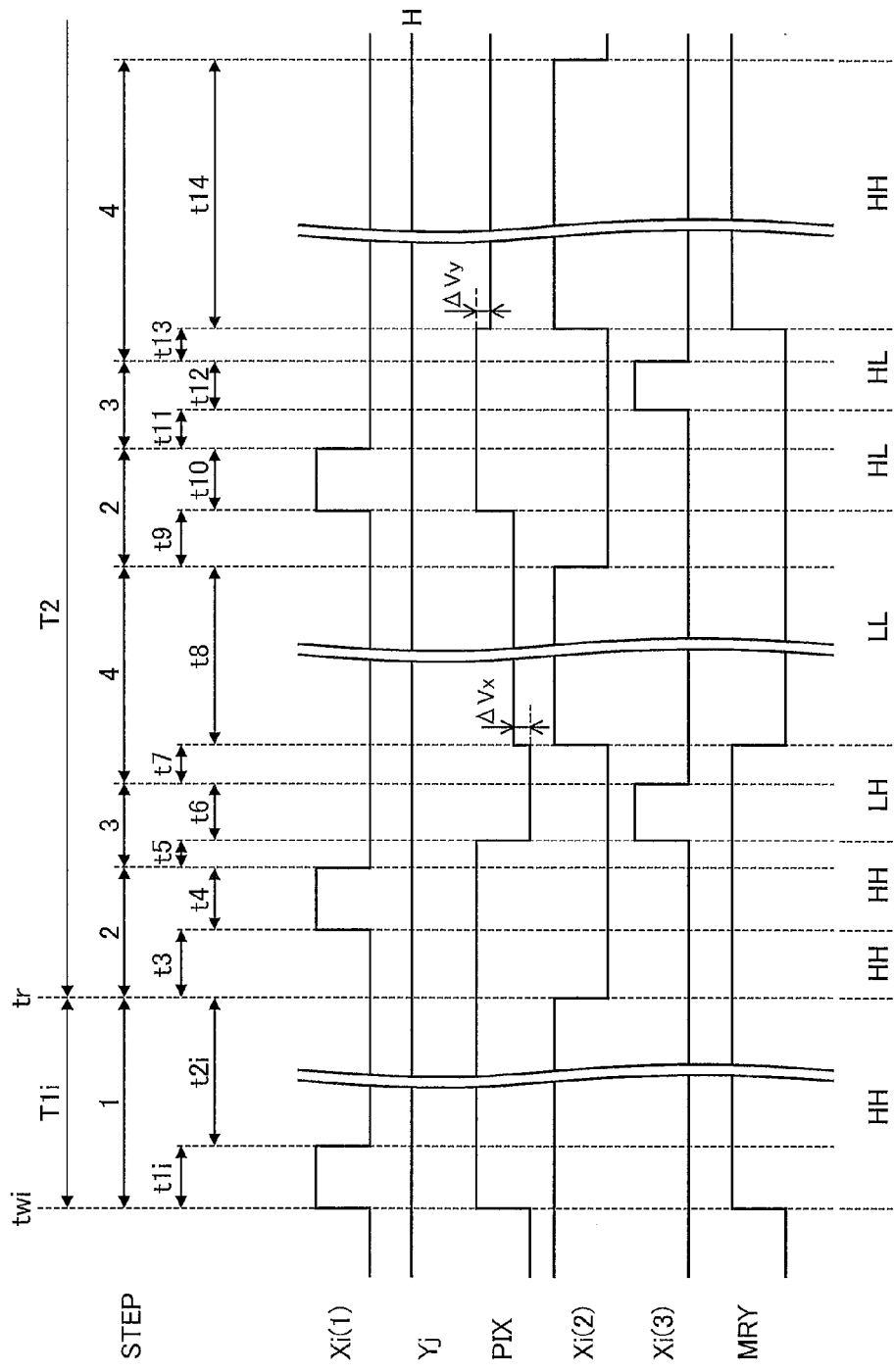
FIG. 2 is a signal diagram illustrating a writing operation of the memory circuit of FIG. 1.
Figure 3:
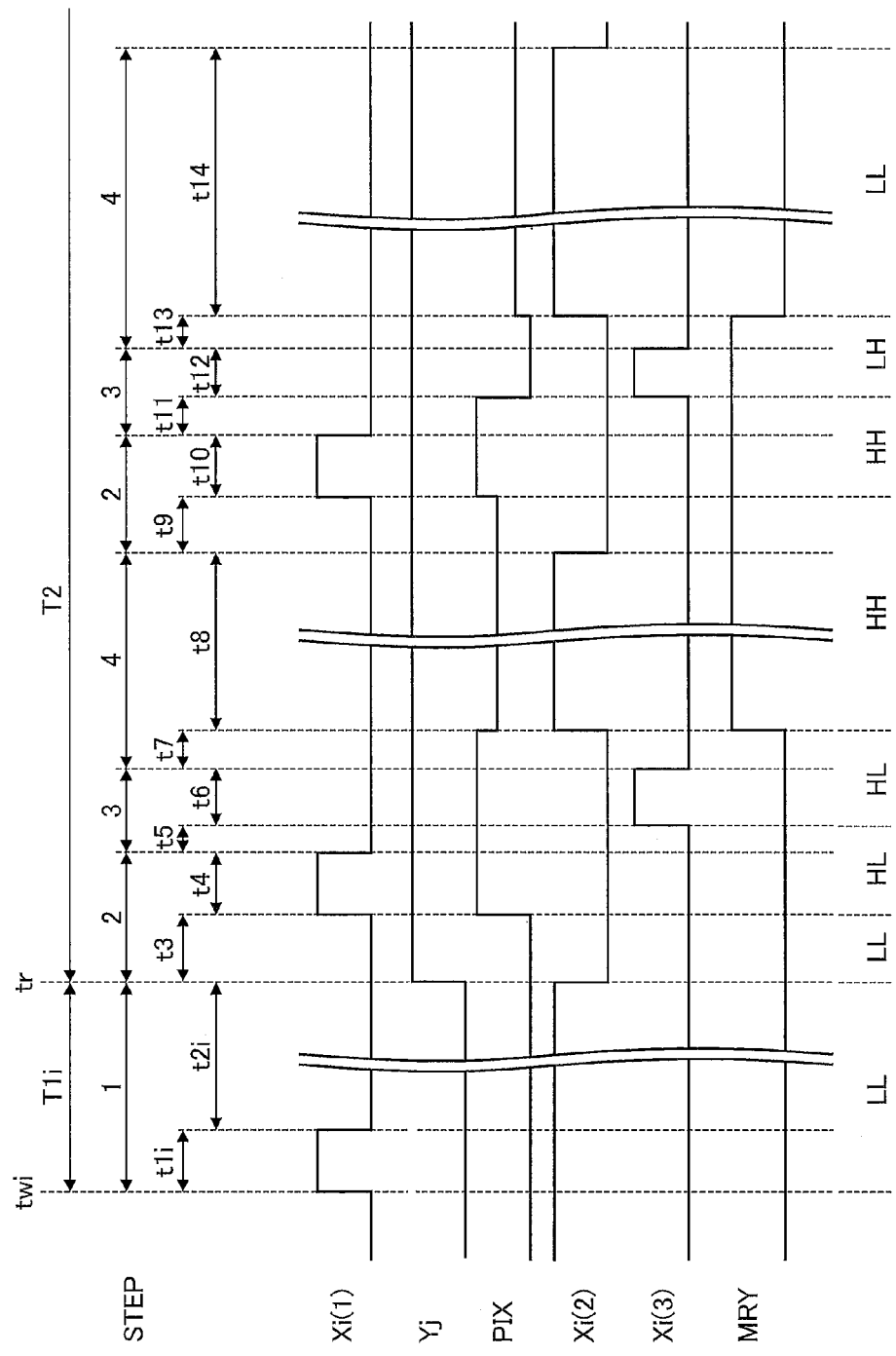
FIG. 3 is a signal diagram illustrating another writing operation of the memory circuit of FIG. 1.

Each of FIG. 2 and FIG. 3 illustrates the data writing operation of the memory circuit MR1. According to the present Example, in order to write any data to memory circuits MR1 of respective rows which are different from each other, the memory circuit MR1 line-sequentially drives the rows of the memory array 10 which correspond to the writing address. Accordingly, a writing period T1 is determined for each row, and a writing period T1 of an ith row is referred to as T1i. FIG. 2 illustrates a case where High as the first electric potential level is written in the writing period T1i, and FIG. 3 illustrates a case where Low as the second electric potential level is written in the writing period T1i. In addition, FIG. 2 and FIG. 3 illustrate, in their respective lower parts, electric potentials of the node PIX (left side) and the node MRY (right side), respectively, the electric potentials being obtained in periods corresponding to respective (a) through (h) of FIG. 24.

In FIG. 2, an electric potential of binary levels which are High (an active level) and Low (a non-active level) is applied from the word line control circuit 14 to each of the first word line Xiw(1), the second word line Xiw(2), and the third word line Xiw(3). The electric potential of the binary levels, i.e., the High electric potential and the Low electric potential may be set individually for each of the lines. To the bit line Yj, binary logic levels which are High lower than the High electric potential of the first word line Xiw(1) and Low are supplied from the writing/reading circuit 15. The High electric potential of the second word line Xiw(2) is equal to the High electric potential of the bit line Yj or the High electric potential of the first word line Xi(1), and the Low electric potential of the second word line Xiw(2) is equal to the Low electric potential of the binary logic levels. The reference electric potential wire RL1 supplies a constant electric potential.

The writing period T1i and the refresh period T2 are set for the data writing operation. The writing period T1i starts at a time twi which is determined for the each row. After the writing of data to the memory circuits MR1 in the rows corresponding to the writing address is finished, the refresh period T2 starts at a time tr simultaneously for all the rows including rows which do not correspond to the writing address. The writing period T1i is a period in which a binary logic level corresponding to data to be retained in the memory circuit MR1 is written and which has a period t1i and a period t2i that are successive. The refresh period T2 is a period in which the binary logic level written to the memory circuit MR1 is retained while being refreshed and which has a period t3 through a period t14 that are successive.

In the period t1i of the writing period T1i, both the electric potential of the first word line Xiw(1) and the electric potential of the second word line Xiw(2) are High. The electric potential of the third word line Xiw(3) is Low. This causes the transistors N1 and N2 to turn on, which causes the switching circuit SW1 to turn on and causes the data transfer section TS1 to be in the state in which the data transfer section TS1 carries out the transfer operation. Thus, the first electric potential level (High here) supplied to the bit line Yj is written to the node PIX. In the period t2i, the electric potential of the first word line Xiw(1) is Low, whereas the electric potential of the second word line Xiw(2) is maintained at High. The electric potential of the third word line Xiw(3) is Low. This causes the transistor N1 to turn off, which causes the switching circuit SW1 to turn off. Since the transistor N2 continues to be on, the data transfer section TS1 continues to be in the state in which the data transfer section TS1 carries out the transfer operation. Accordingly, the first electric potential level is transferred from the node PIX to the node MRY, and each of the nodes PIX and MRY is disconnected from the bit line Yj. The above process corresponds to the state in (a) of FIG. 24.

Next, the refresh period T2 starts. In the refresh period T2, the electric potential of the bit line Yj is High which is the first electric potential level. As for the first word line Xi(1), the second word line Xi(2), and the third word line Xi(3), driving described below is carried out for all the values of i (1≤i≤n). That is, the refresh operation is carried out simultaneously for all the memory cells 20 (this may be hereinafter referred to as an "entire refresh operation").

In the period t3 of the refresh period T2, the electric potential of the first word line Xi(1) is Low, the electric potential of the second word line Xi(2) is Low, and the electric potential of the third word line Xi(3) is Low. This causes the transistor N2 to turn off, which causes the data transfer section TS1 to be in the state in which the data transfer section TS1 carries out the non-transfer operation. Thus, the node PIX and the node MRY are disconnected from each other. High is retained in both the node PIX and the node MRY. The above process corresponds to the state in (b) of FIG. 24.

In the period t4, the electric potential of the first word line Xi(1) is High, the electric potential of the second word line Xi(2) is maintained at Low, and the electric potential of the third word line Xi(3) is maintained at Low. This causes the transistor N1 to turn on, which causes the switching circuit SW1 to turn on. Thus, the High electric potential is written to the node PIX from the bit line Yj again.

In the period t5, the electric potential of the first word line Xi(1) is Low, the electric potential of the second word line Xi(2) is maintained at Low, and the electric potential of the third word line Xi(3) is maintained at Low. This causes the transistor N1 to turn off, which causes the switching circuit SW1 to turn off. Thus, the node PIX is disconnected from the bit line Yj and then retains High.

The process in the period t4 through the period t5 corresponds to the state in (c) of FIG. 24.

In the period t6, the electric potential of the first word line Xi(1) is maintained at Low, the electric potential of the second word line Xi(2) is maintained at Low, and the electric potential of the third word line Xi(3) is High. This causes the transistor N4 to turn on, which causes the refresh output control section RS1 to carry out the first operation. Since the electric potential of the node MRY is High, the transistor N3 is on. Therefore, the refresh output control section RS1 is in the active state, and a Low electric potential is supplied from the second word line Xi(2) via the transistors N3 and N4 to the node PIX. The second word line Xi(2) serves also as the voltage supply VS1 in FIG. 23.

In the period t7, the electric potential of the first word line Xi(1) is maintained at Low, the electric potential of the second word line Xi(2) is maintained at Low, and the electric potential of the third word line Xi(3) is Low. This causes the transistor N4 to turn off, which causes the refresh output control section RS1 to carry out the second operation. The node PIX is disconnected from the second word line Xi(2) and then retains Low.

The process in the period t6 through the period t7 corresponds to the state in (d) of FIG. 24.

In the period t8, the electric potential of the first word line Xi(1) is maintained at Low, the electric potential of the second word line Xi(2) is High, and the electric potential of the third word line Xi(3) is maintained at Low. This causes the transistor N2 to turn on, which causes the data transfer section TS1 to be in the state in which the data transfer section TS1 carries out the transfer operation. In this case, movement of an electric charge occurs between the capacitor Ca1 and the capacitor Cb1. This causes both the electric potential of the node PIX and the electric potential of the node MRY to be Low. The electric potential of the node PIX rises by a slight amount of voltage of $\Delta Vx$ due to movement of a positive electric charge from the capacitor Cb1 to the capacitor Ca1 via the transistor N2, but falls within a range of a Low electric potential.

The period t8 is a period in which refreshed binary logic data is retained in both the first data retaining section DS1 and the second data retaining section DS2 which are connected to each other via the data transfer section TS1, and the period t8 can be set long. The same applies to subsequent Examples and Embodiments.

In the period t9, the electric potential of the first word line Xi(1) is maintained at Low, the electric potential of the second word line Xi(2) is Low, and the electric potential of the third word line Xi(3) is maintained at Low. This causes the transistor N2 to turn off, which causes the data transfer section TS1 to be in the state in which the data transfer section TS1 carries out the non-transfer operation. Thus, the node PIX and the node MRY are disconnected from each other. Then, Low is retained in both the electric potential of the node PIX and the node MRY. The above process in the period t8 through the period t9 corresponds to the state in (e) of FIG. 24.

In the period t10, the electric potential of the first word line Xi(1) is High, the electric potential of the second word line Xi(2) is maintained at Low, and the electric potential of the third word line Xi(3) is maintained at Low. This causes the transistor N1 to turn on, which causes the switching circuit SW1 to turn on. Thus, the High electric potential is written to the node PIX from the bit line Yj again.

In the period t11, the electric potential of the first word line Xi(1) is Low, the electric potential of the second word line Xi(2) is maintained at Low, and the electric potential of the third word line Xi(3) is maintained at Low. This causes the transistor N1 to turn off, which causes the switching circuit SW1 to turn off. Thus, the node PIX is disconnected from the bit line Yj and then retains High.

The process in the period t10 through the period t11 corresponds to the state in (f) of FIG. 24.

In the period t12, the electric potential of the first word line Xi(1) is maintained at Low, the electric potential of the second word line Xi(2) is maintained at Low, and the electric potential of the third word line Xi(3) is High. This causes the transistor N4 to turn on, which causes the refresh output control section RS1 to be in a state in which the refresh output control section RS1 carries out the first operation. Since the electric potential of the node MRY is Low, the transistor N3 is off. This causes the refresh output control section RS1 to be in the non-active state, in which the refresh output control section RS1 stops carrying out the output. Accordingly, the node PIX continues to retain High.

In the period t13, the electric potential of the first word line Xi(1) is maintained at Low, the electric potential of the second word line Xi(2) is maintained at Low, and the electric potential of the third word line Xi(3) is Low. This causes the transistor N4 to turn off, which causes the refresh output control section RS1 to be in the state in which the refresh output control section RS1 carries out the second operation. Then, the node PIX retains High.

The above process in the period t12 through the period t13 corresponds to the state in (g) of FIG. 24.

In the period t14, the electric potential of the first word line Xi(1) is maintained at Low, the electric potential of the second word line Xi(2) is High, and the electric potential of the third word line Xi(3) is maintained at Low. This causes the transistor N2 to turn on, which causes the data transfer section TS1 to be in the state in which the data transfer section TS1 carries out the transfer operation. In this case, movement of an electric charge occurs between the capacitor Ca1 and the capacitor Cb1. This causes both the electric potential of the node PIX and the electric potential of the node MRY to be High. The electric potential of the node PIX is reduced by a slight amount of voltage of $\Delta Vy$ by movement of a positive electric charge from the capacitor Ca1 to the capacitor Cb1 via the transistor N2, but falls within a range of a High electric potential. The above process corresponds to the state in (h) of FIG. 24.

The period t14 is a period in which refreshed binary logic data is retained in both the first data retaining section DS1 and the second data retaining section DS2 which are connected to each other via the data transfer section TS1, and the period t14 can be set long. The same applies to subsequent Examples and Embodiments.

As a result of the above operation, the electric potential of the node PIX is High in the period t1i through the period t5 and the period t10 through the period t14 and is Low in the period t6 through the period t9, and the electric potential of the node MRY is High in the period t1i through the period t7 and the period t14 and is Low in the period t8 through the period t13.

Thereafter, in order to continue the refresh period T2, the command decoder 12 repeats the operation in the period t3 through the period t14. In order to write new data or read out data, the command decoder 12 finishes the refresh period T2 so as to terminate the entire refresh operation mode.

The above description has discussed the case of FIG. 2.

Note that the command to carry out the entire refresh operation may be generated not from an externally supplied signal but from a clock which is internally generated by an oscillator or the like. This makes it unnecessary for an external system to input a refresh command at regular time intervals. This brings about an advantage of allowing flexible system construction. According to a dynamic memory circuit using the memory cell 20 in accordance with the present Example, it is unnecessary to carry out the entire refresh operation by scanning each word line, and the entire refresh operation can be carried out with respect to an entire array at one time. This can eliminate the need for a peripheral circuit which is necessary, in a common conventional dynamic memory circuit, for refreshing an electric potential of a bit line Yj while carrying out destructive reading.

Next, the following description discusses the case of FIG. 3.

In FIG. 3, Low as the second electric potential level is written to the memory cell 20 in the writing period T1i. However, in FIG. 3, the first word line Xi(1), the second word line Xi(2), and the third word line Xi(3) change in electric potential in each of the periods as in the case of FIG. 2 except that the electric potential of the bit line Yj is Low in the writing period T1i.

According to this, the electric potential of the node PIX is Low in the period t1i through the period t3 and the period t12 through the period t14 and is High in the period t4 through the period t11, and the electric potential of the node MRY is Low in the period t1i through the period t7 and the period t14 and is High in the period t8 through the period t13.

Note that (a) through (h) of FIG. 24 illustrate transition of the state of the memory cell 20. However, the operation of the memory circuit MR1 in FIG. 2 and FIG. 3 can be classified into the following operation steps.

(1) First Step (Period t1i through Period t2i (Writing Period T1i))

In a first step, in a state in which (i) the binary logic level corresponding to the data is being supplied from the writing/reading circuit 15 to the bit line Yj and (ii) the refresh output control section RS1 is carrying out the second operation, the memory circuit MR1 causes the switching circuit SW1 to turn on, so as to write the binary logic level to the memory cell 20. Then, in a state in which (i) the binary logic level has been written to the memory cell 20 and (ii) the refresh output control section RS1 is carrying out the second operation, the memory circuit MR1 causes the data transfer section TS1 to carry out the transfer operation.

(2) Second Step (Each of Period t3 through Period t4 and Period t9 through Period t10)

In a second step following the first step, in a state in which (i) the refresh output control section RS1 is carrying out the second operation and (ii) the data transfer section TS1 is carrying out the non-transfer operation, the memory circuit MR1 causes the switching circuit SW1 to turn on, so as to supply, to the first data retaining section DS1 via the bit line Yj, the binary logic level which is equal to a level that is equivalent to control information which causes the refresh output control section RS1 to be in the active state.

(3) Third Step (Each of Period t5 through Period t6 and Period t11 through Period t12)

In a third step following the second step, in a state in which (i) the switching circuit SW1 is off and (ii) the data transfer section TS1 is carrying out the non-transfer operation, the memory circuit MR1 causes the refresh output control section RS1 to carry out the first operation. By the time the first operation is finished, the memory circuit MR1 causes the binary logic level to be supplied from the voltage supply VS1 to the input of the refresh output control section RS1, the binary logic level being inverse to the level that is equivalent to the control information which causes the refresh output control section RS1 to be in the active state.

(4) Fourth Step (Each of Period t7 through Period T8 and Period t13 through Period t14)

In a fourth step following the third step, in a state in which (i) the switching circuit SW1 is off and (ii) the refresh output control section RS1 is carrying out the second operation, the memory circuit MR1 causes the data transfer section TS1 to carry out the transfer operation.

As for the entire writing operation, the memory circuit MR1 carries out the first step first, and following the first step, the memory circuit MR1 carries out, at least one time, a series of operations from the start of the second step to the end of the fourth step (the period t3 through the period t8).

Next, the reading operation of the memory circuit MR1 is to be described.

The reading operation is carried out as follows. Specifically, the input-output interface 11 receives a reading command and a reading address from an outside of the memory device 1 via a transmission line, and the command decoder 12 interprets the command and changes to be in a reading mode. In accordance with a signal indicative of the reading mode of the command decoder 12, the timing generating circuit 13 generates an internal timing signal for the reading operation. The word line control circuit 14 controls a first word line Xi(1), a second word line Xi(2), and a third word line Xi(3) that are selected by the reading address to be supplied from the input-output interface 11. The writing/reading circuit 15 controls all the bit lines Yj. In the following description, the first word line Xi(1), the second word line Xi(2), and the third word line Xi(3) that are selected by the reading address are referred to as a first word line Xir(1), a second word line Xir(2), and a third word line Xir(3), respectively.

The operation of the memory cell 20 is described with reference to FIG. 4.

Figure 4:
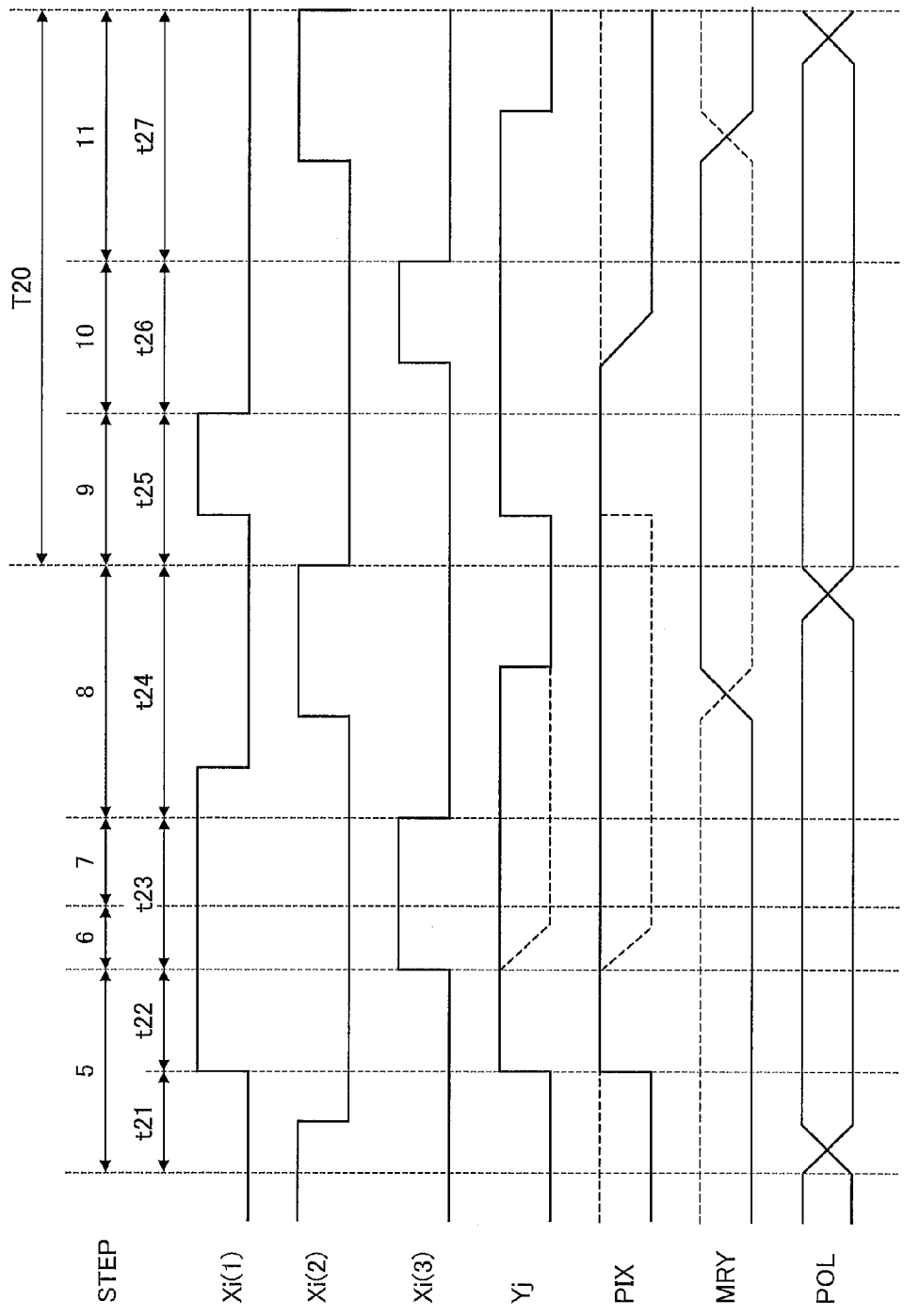
FIG. 4 is a signal diagram illustrating a reading operation of the memory circuit of FIG. 1.

FIG. 4 illustrates electric potential waveforms of the first word line Xir(1), the second word line Xir(2), the third word line Xir(3), each bit line Yj, the node PIX, and the node MRY, and a waveform of a polarity signal POL.

The polarity signal POL is an internal signal indicative of a polarity of data retained in the node PIX. In the memory cell 20 of the present embodiment, an electric potential level of the node PIX is inverted from High to Low or Low to High every time the refresh operation is carried out. Therefore, a polarity of current data of the memory cell 20 is retained by use of the polarity signal POL. Namely, a polarity of the polarity signal POL is reversed every refresh operation. According to this, even in a case where a data polarity is reversed every refresh, it is possible to correctly read whether data written at a given timing is "0" or "1". The polarity signal POL may be controlled by the writing/reading circuit 15 or may be controlled by the timing generating circuit 13.

FIG. 5 shows an example of how the polarity signal POL, data, and the electric potential of the bit line Yj are associated with each other. The polarity signal POL changes between "0" and "1" every time the data is retained and refreshed in the memory cell 20. For example, assume that data which has been written to the memory cell 20 in a case where the polarity signal POL is 0 is "0" and a binary logic level which has been supplied so as to correspond to the data is "L". In this case, a binary logic level of "L" is retained in the memory cell 20 in a case where the polarity signal POL is "0", whereas a binary logic level of "H" is retained in the memory cell 20 in a case where the polarity signal POL is "1".

In the reading mode, a first set period t21, a pre-charge period t22, a sense period t23, a second set period t24, and a refresh period T20 are set in this order. The refresh period T20 may be carried out simultaneously with respect to all the rows corresponding to the reading address after successive operations in the first set period t21, the pre-charge period t22, the sense period t23, and the second set period t24 are carried out sequentially for each of the rows corresponding to the reading address. Alternatively, successive operations in the first set period t21, the pre-charge period t22, the sense period t23, the second set period t24, and the refresh period T20 may be carried out sequentially for each of the rows corresponding to the reading address.

When the reading mode starts, the first set period t21 starts first in which the memory cell 20 reverses the polarity of the polarity signal POL and then causes the electric potential of the second word line Xir(2) to be Low.

Next, the pre-charge period t22 starts in which the memory cell 20 causes the electric potential of the first word line Xir(1) to be High and causes electric potentials of all the bit lines Yj to be High (the binary logic level which is equal to the level that is equivalent to the control information which causes the refresh control section RS1 to be in the active state during the first operation). Further, the writing/reading circuit 15 causes all the bit lines Yj to be in a high impedance state.

Next, the sense period t23 starts in which the memory cell 20 causes the electric potential of the third word line Xir(3) to be High. This causes the transistor N4 to turn on, which causes the refresh output control section RS1 to be in the state in which the refresh output control section RS1 carries out the first operation. In this case, if an electric potential retained in the node MRY is High, the refresh output control section RS1 is in the active state, and the transistor N3 is on. This causes a positive electric charge of the bit line Yj to be discharged into the second word line Xir(2), so as to cause the bit line Yj to be Low (see the broken line in FIG. 4). Meanwhile, in this case, if the electric potential retained in the node MRY is Low, the refresh output control section RS1 is in the non-active state, and the transistor N3 is off. Therefore, the bit line Yj maintains the High electric potential (see the solid line in FIG. 4).

Accordingly, data of a selected address can be read by causing the writing/reading circuit 15 to sense an electric potential of each bit line Yj which electric potential is obtained in this case and determining output data in accordance with the polarity signal POL as shown in FIG. 5. The data thus read is supplied to an outside by the input-output interface 11. At the end of the sense period t23, the memory cell 20 causes the electric potential of the third word line Xir(3) to be Low and causes the transistor N4 to turn off, so as to cause the refresh output control section RS1 to be in the state in which the refresh output control section RS1 carries out the second operation.

Next, the second set period t24 starts. In the second set period t24, the memory cell 20 first causes the electric potential of the first word line Xir(1) to be Low. This causes the transistor N1 to turn off, i.e., causes the switching circuit SW1 to turn off. Subsequently, in this state, the memory cell 20 causes the electric potential of the second word line Xir(2) to be High, so as to cause the transistor N2 to turn on. This causes the data transfer section TS1 to be in the state in which the data transfer section TS1 carries out the transfer operation, and causes the node PIX and the node MRY to be connected to each other. Therefore, a binary logic level is transferred from the node PIX to the node MRY, so that a data polarity of the node MRY becomes identical to a data polarity of the node PIX. As a result, a state is obtained in which the data polarities retained in the nodes PIX and MRY before the reading are reversed. Subsequently, the writing/reading circuit 15 causes the electric potential of the each bit line Yj to be Low. Before the end of the second set period t24, the memory cell 20 reverses the polarity of the polarity signal POL.

Next, the refresh period T20 starts. In the refresh period T20, in order to return the polarities of the nodes PIX and MRY to their original polarities, the polarities having been reversed by the reading operation, the memory cell 20 carries out the refresh operation with respect to only one address by controlling only a word line corresponding to a selected address. In the refresh period T20, the memory cell 20 carries out similar operation to the refresh operation in the writing mode described with reference to FIG. 2 and FIG. 3.

First, the period t25 starts in which the electric potential of the second word line Xir(2) is Low. This causes the transistor N2 to turn off, which causes the data transfer section TS1 to be in the state in which the data transfer section TS1 carries out the non-transfer operation. Next, the electric potential of the first word line Xir(1) becomes High, and the writing/reading circuit 15 causes the electric potential of the each bit line Yj to be High. This change in electric potential of the bit line Yj may be made from the start of the refresh period t25 as in the cases of FIG. 2 and FIG. 3. This causes the transistor N1 to turn on, i.e., causes the switching circuit SW1 to turn on, so that the electric potential of the node PIX becomes High.

Next, the period t26 starts in which the electric potential of the third word line Xir(3) is High. This causes the transistor N4 to turn on, i.e., causes the refresh output control section RS1 to be in a state in which the refresh output control section RS1 carries out the first operation. Here, in a case where the electric potential of the node MRY is High, the transistor N3 is on. This causes the refresh output control section RS1 to be in the active state, so that the node PIX is charged to Low which is the electric potential of the second word line Xir(2). Meanwhile, in a case where the electric potential of the node MRY is Low, the transistor N3 is off. This causes the refresh output control section RS1 to be in the non-active state, so that the node PIX retains the High electric potential.

Next, the period t27 starts in which the electric potential of the third word line Xir(3) is Low. This causes the transistor N4 to turn off, i.e., causes the refresh output control section RS1 to be in the state in which the refresh output control section RS1 carries out the second operation. Subsequently, the electric potential of the second word line Xir(2) becomes High. This causes the transistor N2 to turn on, i.e., causes the data transfer section TS1 to be in the state in which the data transfer section TS1 carries out the transfer operation. Thus, data of the node PIX is transferred to the node MRY, so that the polarities of the nodes PIX and MRY are refreshed to those identical to the electric potentials obtained immediately before the reading. The electric potential of the each bit line Yj is returned to Low. Before the end of the period t27, the memory cell 20 reverses the polarity of the polarity signal POL.

This period in which the electric potential of the second word line Xir(2) is High out of the period t27 is a period in which refreshed binary logic data is retained in both the first data retaining section DS1 and the second data retaining section DS2 that are connected to each other via the data transfer section TS1, and this period can be set long as in the case of the writing operation. This stabilizes the electric potentials of the nodes PIX and MRY. Consequently, an operation error is less likely to occur in the memory cell 20.

The refresh operation of the memory cell 20 corresponding to the reading address may end after the operation in the period T20 is carried out one time or subsequently the refresh operation which is identical to that carried out in the period T20 may be repeated. In a case where the identical refresh operation is repeated, the electric potential polarities of the respective nodes PIX and MRY are reversed one time every time the refresh operation is carried out one time.

In the reading mode, data is read in a state in which the capacitor of the bit line Yj is sufficiently charged. Therefore, in restoring data after the reading, it is unnecessary to provide a peripheral circuit which is necessary, in a common conventional dynamic memory circuit, for refreshing an electric potential of a bit line while carrying out destructive reading.

The operation of the memory circuit MR1 in FIG. 4 can be classified into the following operation steps.

(1) Fifth Step (Period t21 through Period t22)

In a fifth step, in a state in which (i) the binary logic level which is equal to the level that is equivalent to the control information which causes the refresh output control section RS1 to be in the active state is being supplied from the writing/reading circuit 15 to the bit line Yj, (ii) the data transfer section TS1 is carrying out the non-transfer operation, and (iii) the refresh output control section RS1 is carrying out the second operation, the memory circuit MR1 causes the switching circuit SW1 to turn on, so as to write the binary logic level to the memory cell 20.

(2) Sixth Step (Period t23)

In a sixth step following the fifth step, in a state in which (i) the switching circuit SW1 is on and (ii) the data transfer section TS1 is carrying out the non-transfer operation, the memory circuit MR1 causes the refresh output control section RS1 to carry out the first operation.

(3) Seventh Step (Period t23)

In a seventh step following the sixth step, in the state in which (i) the switching circuit SW1 is on and (ii) the data transfer section TS1 is carrying out the non-transfer operation, the memory circuit MR1 causes the writing/reading circuit 15 to sense the electric potential of the bit line Yj, so as to determine data retained in the memory cell 20.

(4) Eighth Step (Period t24)

In an eighth step following the seventh step, in a state in which (i) the switching circuit SW1 is off and (ii) the refresh output control section RS1 is carrying out the second operation, the memory circuit MR1 causes the data transfer section TS1 to carry out the transfer operation.

(5) Ninth Step (Period t25)

In a ninth step following the eighth step, in a state in which (i) the data transfer section TS1 is carrying out the non-transfer operation, (ii) the binary logic level which is equal to the level that is equivalent to the control information which causes the refresh output control section RS1 to be in the active state is being supplied from the writing/reading circuit 15 to the bit line Yj, and (iii) the refresh output control section RS1 is carrying out the second operation, the memory circuit MR1 causes the switching circuit SW1 to turn on.

(6) Tenth Step (Period t26)

In a tenth step following the ninth step, in a state in which (i) the switching circuit SW1 is off and (ii) the data transfer section TS1 is carrying out the non-transfer operation, the memory circuit MR1 causes the refresh output control section RS1 to carry out the first operation.

(7) Eleventh Step (Period t27)

In an eleventh step following the tenth step, in a state in which (i) the switching circuit SW1 is off and (ii) the refresh output control section RS1 is carrying out the second operation, the memory circuit MR1 causes the data transfer section TS1 to carry out the transfer operation.

As for the entire reading operation, the memory circuit MR1 carries out the fifth step through the eighth step first, and following the eighth step, the memory circuit MR1 carries out, at least one time, a series of operations from the start of the ninth step to the end of the eleventh step (the period t25 through the period t27 (the refresh period T20)).

The following description discusses a modification of the present Example.

Figure 6:
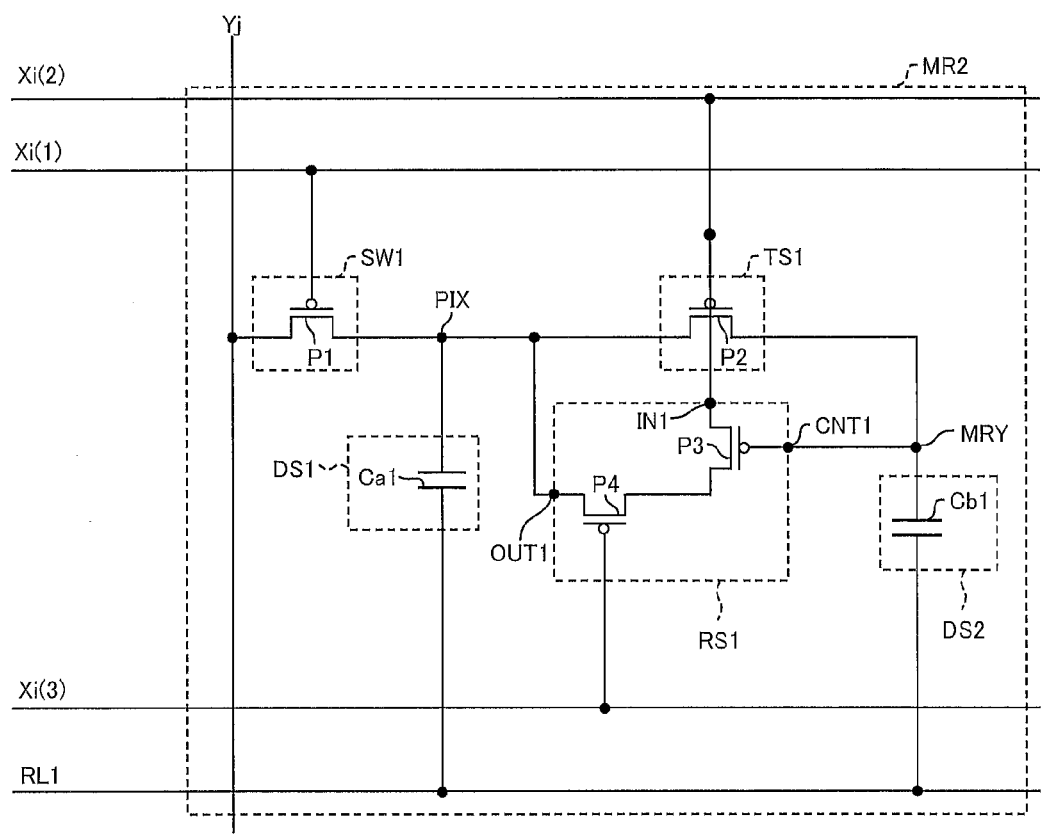
FIG. 6, which shows the embodiment of the present invention, is a circuit diagram illustrating a configuration of a second memory circuit.

FIG. 6 illustrates an arrangement of the memory cell 20 of the modification in the form of a memory circuit MR2 which is an equivalent circuit.

As described above, the memory circuit MR2 includes a switching circuit SW1, a first data retaining section DS1, a data transfer section TS1, a second data retaining section DS2, and a refresh output control section RS1.

The switching circuit SW1 includes a transistor P1 which is a P-channel TFT and with which the transistor N1 of FIG. 1 has been replaced. The data transfer section TS1 includes a transistor (third switch) P2 which is a P-channel TFT and with which the transistor N2 of FIG. 1 has been replaced. The refresh output control section RS1 includes a transistor (first switch) P3 which is a P-channel TFT and with which the transistor N3 of FIG. 1 has been replaced and a transistor (second switch) P4 which is a P-channel TFT and with which the transistor N4 of FIG. 1 has been replaced. The first data retaining section DS1 and the second data retaining section DS2 are arranged as in the case of FIG. 1.

Namely, in FIG. 6, all the transistors constituting the memory circuit are P-channel TFTs (field-effect transistors).

When the transistor P1 is on, the switching circuit SW1 turns on. Meanwhile, when the transistor P1 is off, the switching circuit SW1 turns off. When the transistor P2 is on, the data transfer section TS1 is in a state in which the data transfer section TS1 carries out the transfer operation. Meanwhile, when the transistor P2 is off, the data transfer section TS1 is in a state in which the data transfer section TS1 carries out the non-transfer operation.

When the transistor P4 is on, the refresh output control section RS1 is controlled to be in a state in which the refresh output control section RS1 carries out the first operation. Meanwhile, when the transistor P4 is off, the refresh output control section RS1 is controlled to be in a state in which the refresh output control section RS1 carries out the second operation. Since the transistor P3 is a P-channel TFT, control information which causes the refresh output control section RS1 to be in an active state during the first operation, i.e., active level is Low, and control information which causes the refresh output control section RS1 to be in a non-active state during the first operation, i.e., a non-active level is High.

As in the case of FIG. 1, as wires for driving each memory circuit MR2, the memory device 1 includes a reference electric potential wire RL1 in addition to the first word line Xi(1), the second word line Xi(2), the third word line Xi(3), and the bit line Yj. Driving waveforms of these wires are described below since the driving waveforms are different from the driving waveforms of FIG. 2 and FIG. 3.

Figure 7:
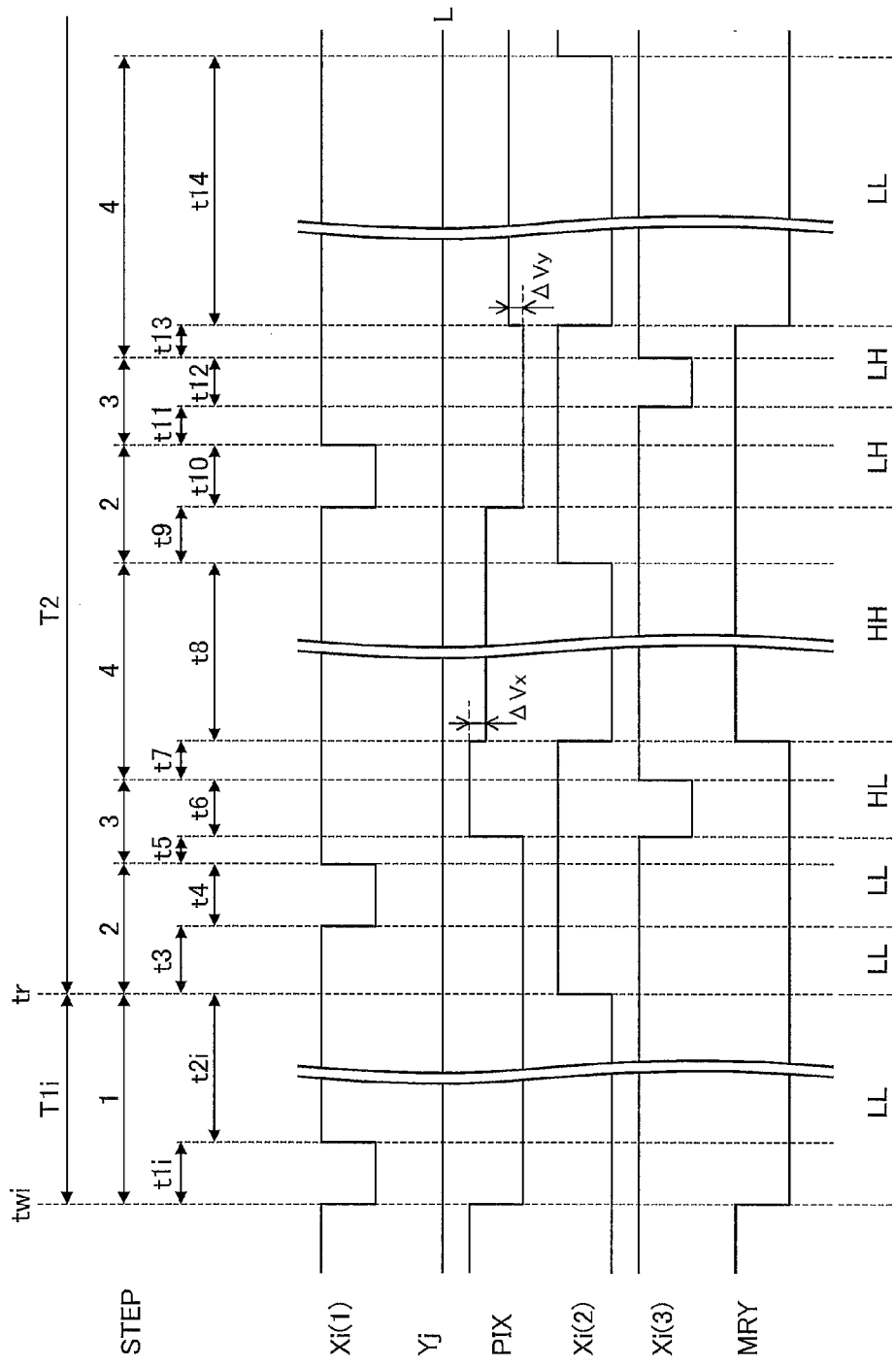
FIG. 7 is a signal diagram illustrating a writing operation of the memory circuit of FIG. 6.

FIG. 7 illustrates a writing operation of the memory circuit MR2.

It is assumed in FIG. 7 that electric potential waveforms of the first word line Xi(1), the second word line Xi(2), and the third word line Xi(3) are obtained by inverting, between High and Low, the electric potential waveforms of FIG. 2. It is also assumed, as an example, that a Low electric potential is written to the memory circuit MR2 via the bit line Yj in the period t1i. Further, it is assumed that the bit line Yj has a Low electric potential in the period T2.

According to this, electric potential waveforms of the node PIX and the node MRY are obtained by vertically inverting the electric potential waveforms of FIG. 2 on an axis at a center of High and Low levels.

Accordingly, the electric potential of the node PIX is Low in the period t1i through the period t5 and the period t10 through the period t14 and is High in the period t6 through the period t9, and the electric potential of the node MRY is Low in the period t1i through the period t7 and the period t14 and is High in the period t8 through the period t13.

Though not illustrated, in a case where a High electric potential is written to the memory circuit MR2 via the bit line Yj in the period t1i, electric potential waveforms of the node PIX and the node MRY are obtained by vertically inverting the electric potential waveforms of FIG. 3 on an axis at a center of High and Low levels.

Accordingly, the electric potential of the node PIX is High in the period t1i through the period t3 and the period t12 through the period t14 and is Low in the period t4 through the period t11, and the electric potential of the node MRY is High in the period t1i through the period t7 and the period t14 and is Low in the period t8 through the period t13.

Though not illustrated, in FIG. 4, a reading operation of the memory circuit MR2 is carried out assuming that electric potential waveforms of the first word line Xi(1), the second word line Xi(2), and the third word line Xi(3) are inverted between High and Low.

SECOND EXAMPLE

Figure 8:
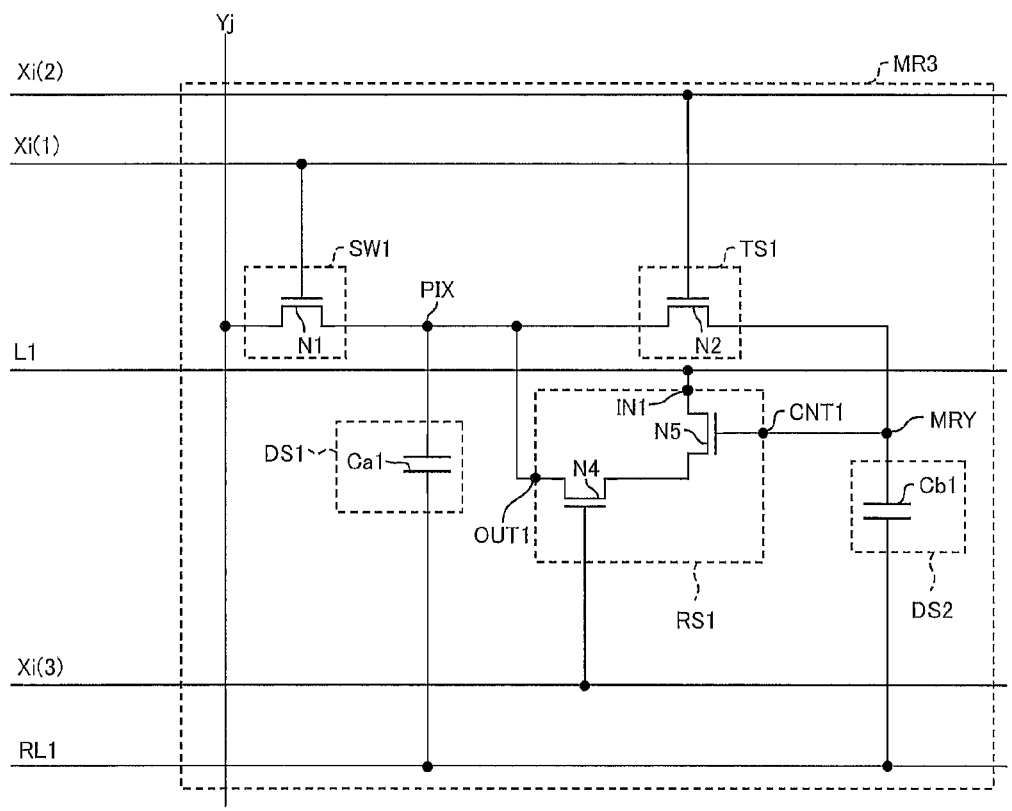
FIG. 8, which shows the embodiment of the present invention, is a circuit diagram illustrating a configuration of a third memory circuit.

FIG. 8 illustrates an arrangement of the memory cell 20 of the present Example in the form of a memory circuit MR3 which is an equivalent circuit.

As described above, the memory circuit MR3 includes a switching circuit SW1, a first data retaining section DS1, a data transfer section TS1, a second data retaining section DS2, and a refresh output control section RS1.

The switching circuit SW1, the first data retaining section DS1, the data transfer section TS1, and the second data retaining section DS2 are arranged as in the case of the memory circuit MR1 of FIG. 1. The refresh output control section RS1 is obtained by replacing the transistor N3 of the memory circuit MR1 with a transistor (first switch) N5 which is an N-channel TFT (field-effect transistor).

As wires for driving each memory circuit MR3, the memory device 1 includes a first word line Xi(1), a second word line Xi(2), a third word line Xi(3), a bit line Yj, a reference electric potential wire RL1, and a control line L1.

The transistor N5 has a gate terminal which is connected, as a control terminal CNT1 of the refresh output control section RS1, to a node MRY, a first drain/source terminal which is connected, as an input terminal IN1 of the refresh output control section RS1, to the control line L1, and a second drain/source terminal which is connected to a first drain/source terminal of the transistor N4.

Since the transistor N5 is an N-channel TFT, control information which causes the refresh output control section RS1 to be in an active state during the first operation, i.e., an active level is High, and control information which causes the refresh output control section RS1 to be in a non-active state during the first operation, i.e., a non-active level is Low.

The present Example uses the control line L1 as a supply source for supplying second logic data to the refresh output control section RS1. A Low electric potential is supplied to the control line L1 from, for example, a writing/reading circuit 15 or a word line control circuit 14.

Figure 9:
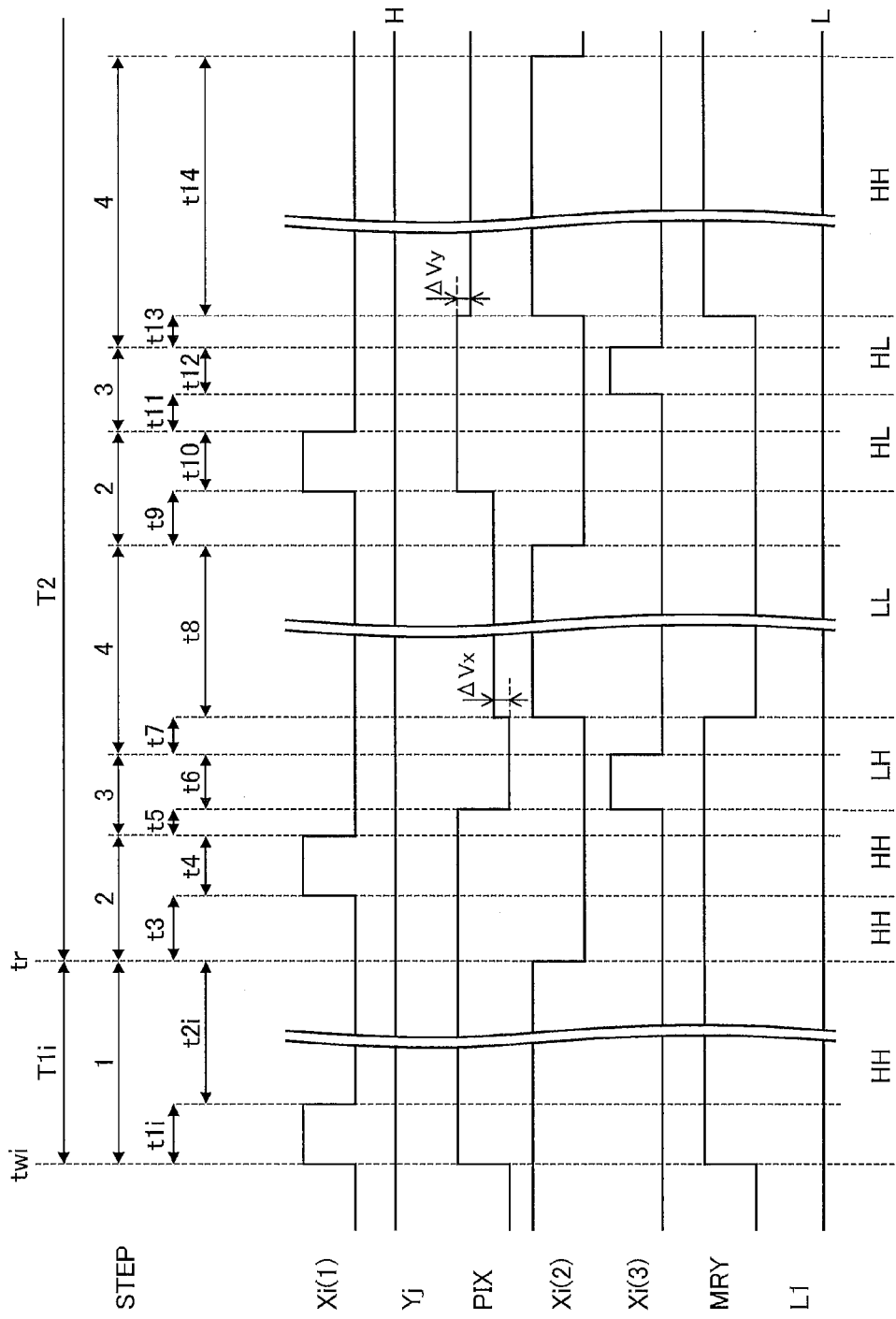
FIG. 9 is a signal diagram illustrating a writing operation of the memory circuit of FIG. 8.

FIG. 9 illustrates a writing operation of the memory circuit MR3.

Specific explanation of waveforms of FIG. 9 is omitted here since the waveforms of FIG. 9 are identical to the waveforms of FIG. 2, except that the control line L1 has a Low electric potential. In a case where a Low electric potential is written to the memory circuit MR3 via the bit line Yj in the period t1i, the waveforms of FIG. 9 are identical to the waveforms of FIG. 3, except that the control line L1 has a Low electric potential.

A reading operation of the memory circuit MR3 is carried out as in the case of FIG. 4.

The following description discusses a modification of the present Example.

Figure 10:
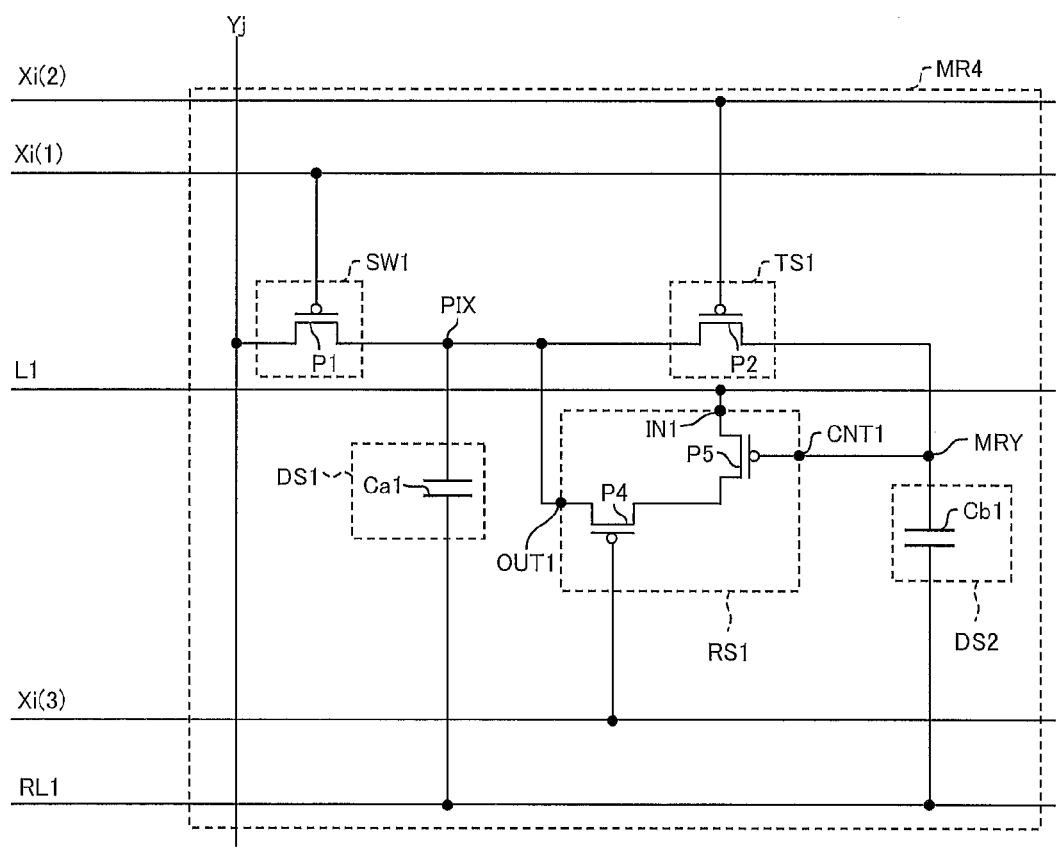
FIG. 10, which shows the embodiment of the present invention, is a circuit diagram illustrating a configuration of a fourth memory circuit.

FIG. 10 illustrates an arrangement of the memory cell 20 of the modification in the form of a memory circuit MR4 which is an equivalent circuit.

As described above, the memory circuit MR4 includes a switching circuit SW1, a first data retaining section DS1, a data transfer section TS1, a second data retaining section DS2, and a refresh output control section RS1.

The switching circuit SW1 includes a transistor P1 which is a P-channel TFT and with which the transistor N1 of FIG. 8 has been replaced. The data transfer section TS1 includes a transistor P2 which is a P-channel TFT and with which the transistor N2 of FIG. 8 has been replaced. The refresh output control section RS1 includes a transistor P4 which is a P-channel TFT and with which the transistor N4 of FIG. 8 has been replaced and a transistor (first second switch) P5 which is a P-channel TFT and with which the transistor N5 of FIG. 8 has been replaced. The first data retaining section DS1 and the second data retaining section DS2 are arranged as in the case of FIG. 8.

Namely, in FIG. 10, all the transistors constituting the memory circuit are P-channel TFTs (field-effect transistors).

Since the transistor P5 is a P-channel TFT, control information which causes the refresh output control section RS1 to be in an active state during the first operation, i.e., an active level is Low, and control information which causes the refresh output control section RS1 to be in a non-active state during the first operation, i.e., a non-active level is High.

As in the case of FIG. 8, as wires for driving each memory circuit MR4, the memory device 1 includes a first word line Xi(1), a second word line Xi(2), a third word line Xi(3), a bit line Yj, a reference electric potential wire RL1, and a control line L1. Driving waveforms of these wires are described below since the driving waveforms are different from the driving waveforms of FIG. 9.

Figure 11:
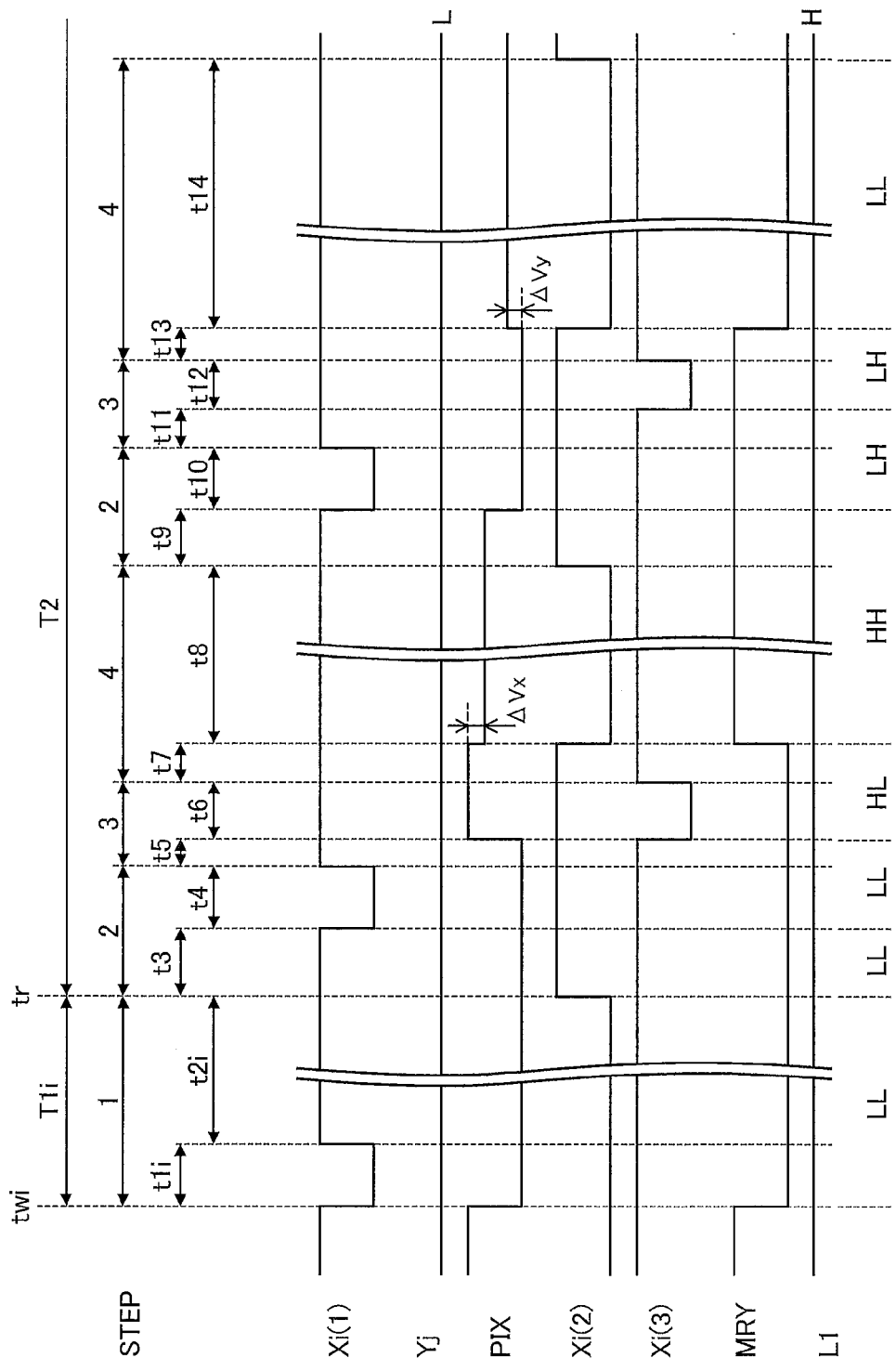
FIG. 11 is a signal diagram illustrating a writing operation of the memory circuit of FIG. 10.

FIG. 11 illustrates a writing operation of the memory circuit MR4.

It is assumed in FIG. 11 that electric potential waveforms of the first word line Xi(1), the second word line Xi(2), and the third word line Xi(3) are obtained by inverting, between High and Low, the electric potential waveforms of FIG. 9. It is also assumed, as an example, that a Low electric potential is written to the memory circuit MR4 via the bit line Yj in the period t1i. Further, it is assumed that the bit line Yj has a Low electric potential in the period T2.

According to this, electric potential waveforms of a node PIX and a node MRY are obtained by vertically inverting the electric potential waveforms of FIG. 9 (i.e., FIG. 2) on an axis at a center of High and Low levels.

In a case where a High electric potential is written to the memory circuit MR4 via the bit line Yj in the period t1i, electric potential waveforms of the node PIX and the node MRY are obtained by vertically inverting the electric potential waveforms of FIG. 3 on an axis at a center of High and Low levels.

Though not illustrated, in FIG. 4, a reading operation of the memory circuit MR4 is carried out assuming that electric potential waveforms of the first word line Xi(1), the second word line Xi(2), and the third word line Xi(3) are inverted between High and Low.

THIRD EXAMPLE

Figure 12:
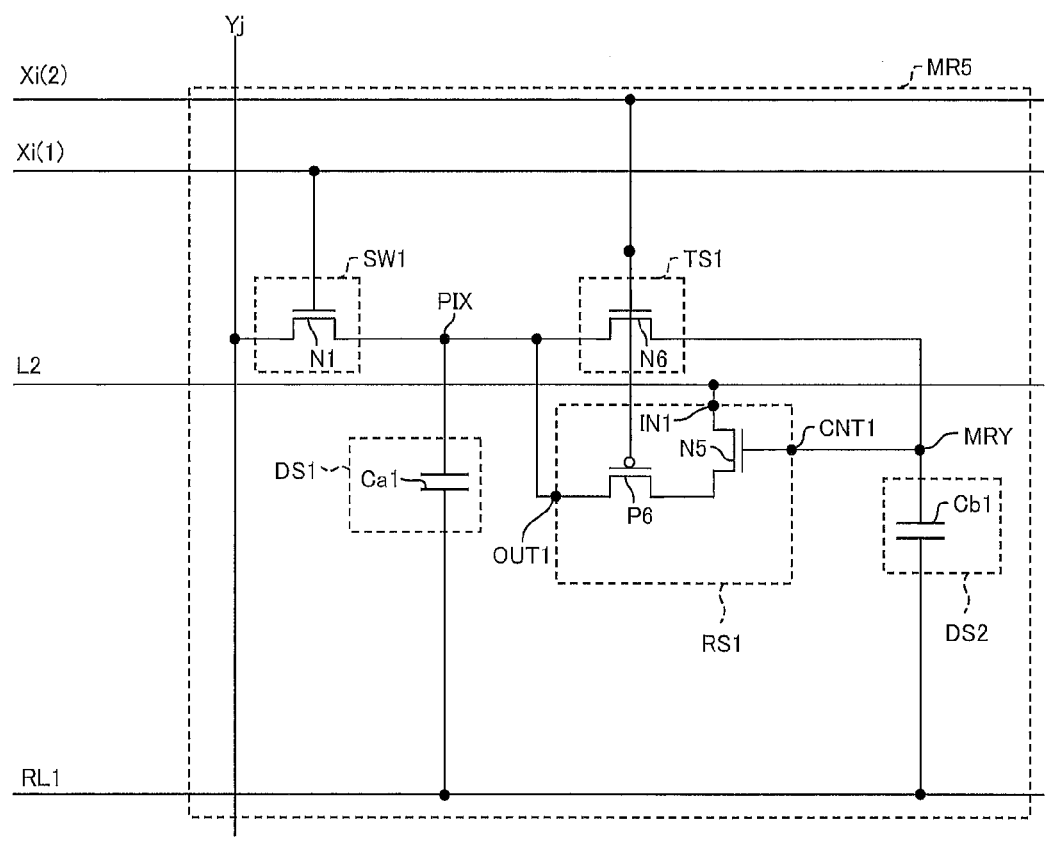
FIG. 12, which shows the embodiment of the present invention, is a circuit diagram illustrating a configuration of a fifth memory circuit.

FIG. 12 illustrates an arrangement of the memory cell 20 of the present Example in the form of a memory circuit MR5 which is an equivalent circuit.

As described above, the memory circuit MR5 includes a switching circuit SW1, a first data retaining section DS1, a data transfer section TS1, a second data retaining section DS2, and a refresh output control section RS1.

The switching circuit SW1 includes a transistor N1 which is an N-channel TFT. The first data retaining section DS1 includes a capacitor Ca1. The data transfer section TS1 includes a transistor (third switch) N6 which is an N-channel TFT. The second data retaining section DS2 includes a capacitor Cb1. The refresh output control section RS1 includes a transistor (first switch) N5 which is an N-channel TFT and a transistor (second switch) P6 which is a P-channel TFT. The capacitor Ca1 has a larger capacitance than the capacitor Cb1. It is only necessary that all the TFTs referred to in the present Example be field-effect transistors.

As wires for driving each memory circuit MR5, the memory device 1 includes a first word line Xi(1), a second word line Xi(2), a bit line Yj, a reference electric potential wire RL1, and a control line (supply source) L2. Note that the second word line Xi(2) serves also as a third word line Xi(3) here. Alternatively, the third word line Xi(3) which is identical in electric potential to the second word line Xi(2) may be separately provided.

The transistor N1 has a gate terminal which is connected to the first word line Xi(1), a first drain/source terminal which is connected to the bit line Yj, and a second drain/source terminal which is connected to a node PIX which is one end of the capacitor Ca1. The other end of the capacitor Ca1 is connected to the reference electric potential wire RL1.

The transistor N6 has a gate terminal which is connected to the second word line Xi(2), a first drain/source terminal which is connected to the node PIX, and a second drain/source terminal which is connected to a node MRY which is one end of the capacitor Cb1. The other end of the capacitor Cb1 is connected to the reference electric potential wire RL1.

The transistor N5 has a gate terminal which is connected, as a control terminal CNT1 of the refresh output control section RS1, to the node MRY, a first drain/source terminal which is connected, as an input terminal IN1 of the refresh output control section RS1, to the control line (supply source) L2, and a second drain/source terminal which is connected to a first drain/source terminal of the transistor P6. The transistor P6 has a gate terminal which is connected to the second word line Xi(2), and a second drain/source terminal which is connected, as an output terminal OUT1 of the refresh output control section RS1, to the node PIX. That is, the transistor N5 and the transistor P6 are connected in series to each other between an input of the refresh output control section RS1 and an output of the refresh output control section RS1 so that the transistor N5 is located closer to the input of the refresh output control section RS1. Note that the location of the transistor N5 may be replaced with that of the transistor P6 in the above example. Namely, it is only necessary that the transistor N5 and the transistor P6 be connected in series to each other between the input of the refresh output control section RS1 and the output of the refresh output control section RS1.

When the transistor N1 is on, the switching circuit SW1 turns on. Meanwhile, when the transistor N1 is off, the switching circuit SW1 turns off. When the transistor N6 is on, the data transfer section TS1 is in a state in which the data transfer section TS1 carries out the transfer operation. Meanwhile, when the transistor N6 is off, the data transfer section TS1 is in a state in which the data transfer section TS1 carries out the non-transfer operation.

When the transistor P6 is on, the refresh output control section RS1 is controlled to be in a state in which the refresh output control section RS1 carries out the first operation. Meanwhile, when the transistor P6 is off, the refresh output control section RS1 is controlled to be in a state in which the refresh output control section RS1 carries out the second operation. Since the transistor P5 is an N-channel TFT, control information which causes the refresh output control section RS1 to be in an active state during the first operation, i.e., an active level is High, and control information which causes the refresh output control section RS1 to be in a non-active state during the first operation, i.e., a non-active level is Low.

The following description discusses operation of the memory circuit MR5 configured as above.

First, a writing operation of the memory circuit MR5 is to be described.

The writing operation is carried out as follows. Specifically, the input-output interface 11 receives a writing command and a writing address from an outside of the memory device 1 via a transmission line, and the command decoder 12 interprets the command and changes to be in a writing mode. In accordance with a signal indicative of the writing mode of the command decoder 12, the timing generating circuit 13 generates an internal timing signal for the writing operation. The word line control circuit 14 controls a first word line Xi(1) and a second word line Xi(2) that are selected by the writing address to be supplied from the input-output interface 11. The writing/reading circuit 15 controls all the bit lines Yj. In the following description, the first word line Xi(1) and the second word line Xi(2) that are selected by the writing address are referred to as a first word line Xiw(1) and a second word line Xiw(2), respectively.

Figure 13:
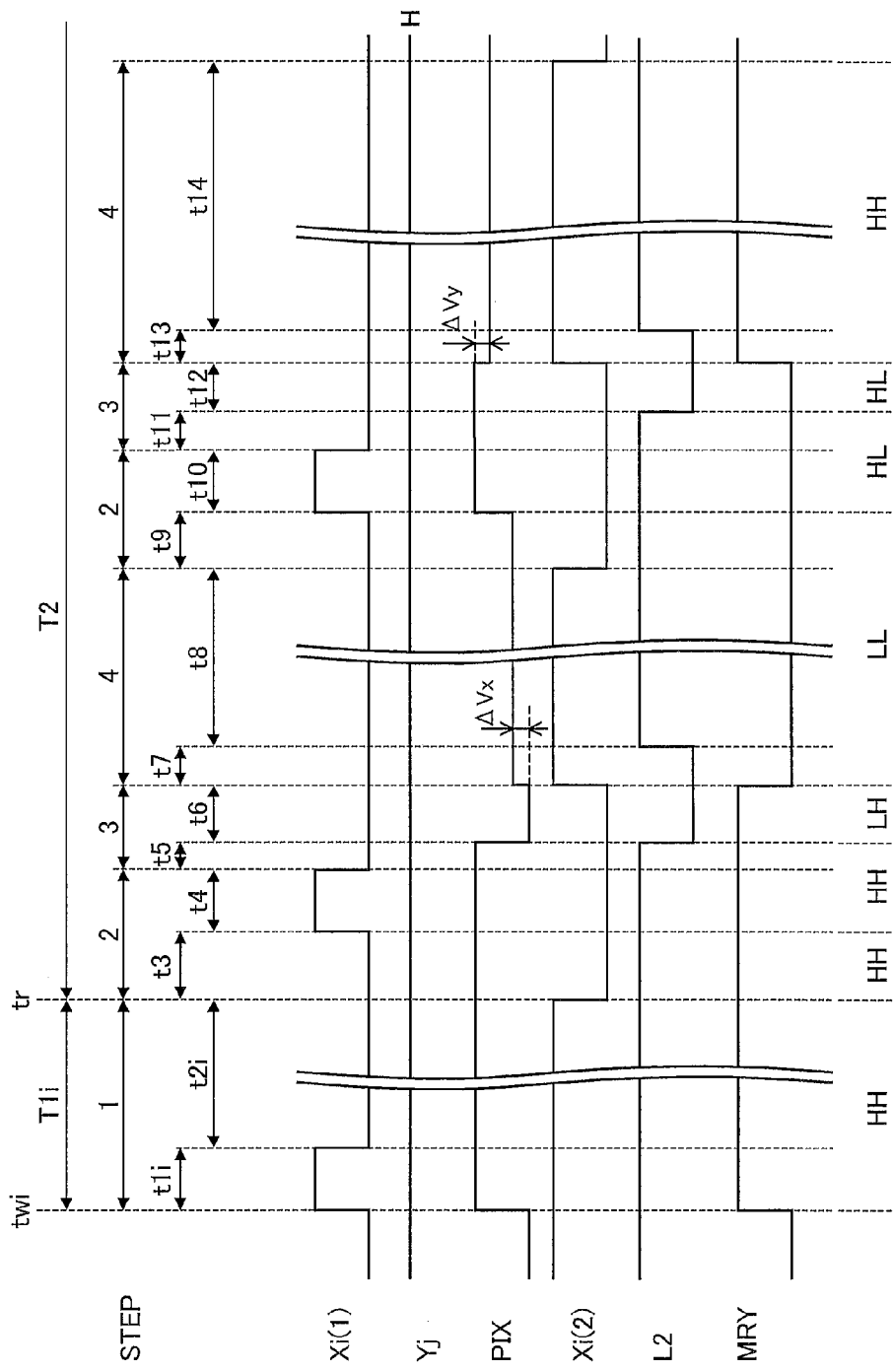
FIG. 13 is a signal diagram illustrating a writing operation of the memory circuit of FIG. 12.
Figure 14:
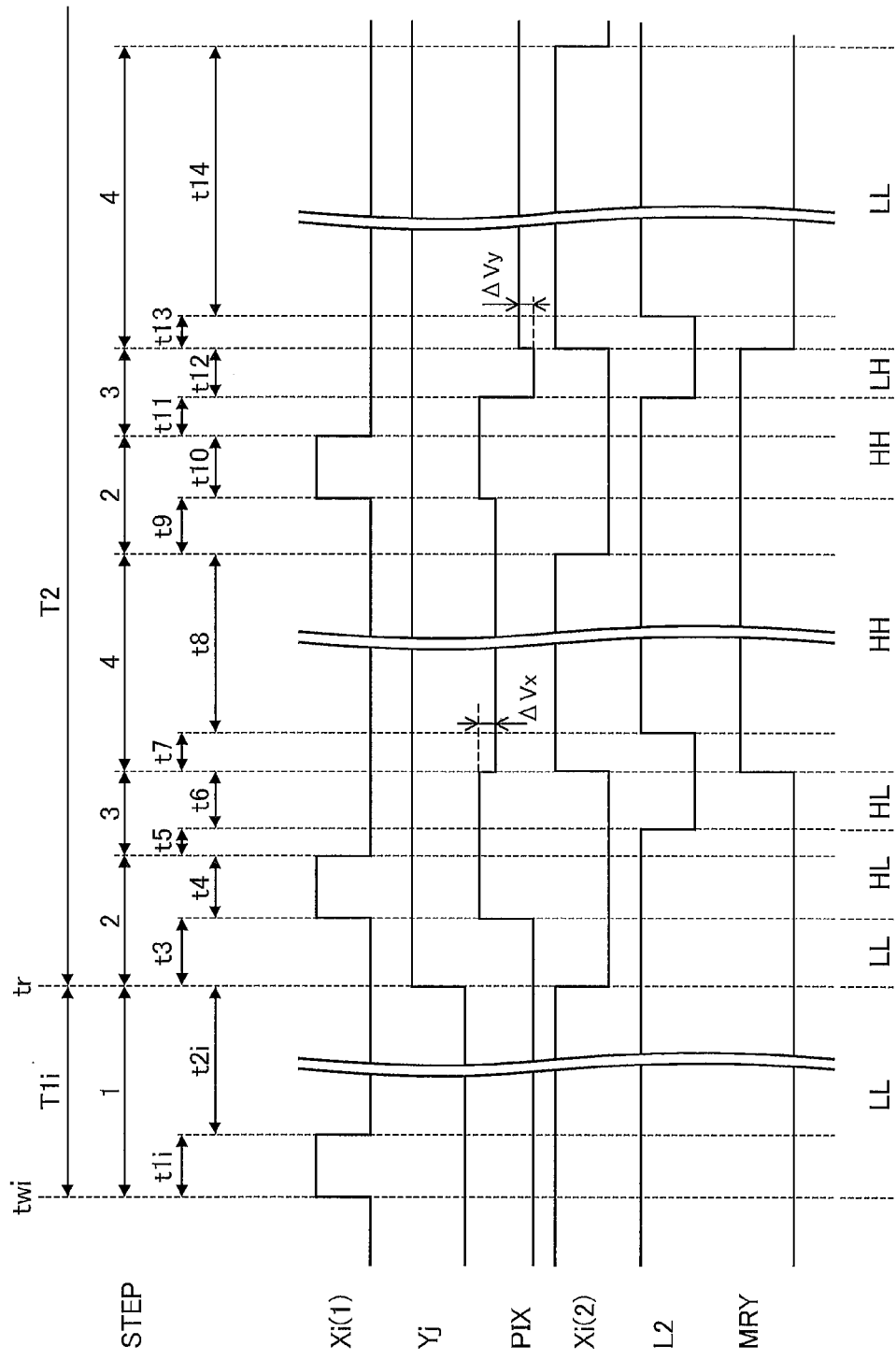
FIG. 14 is a signal diagram illustrating another writing operation of the memory circuit of FIG. 12.

Each of FIG. 13 and FIG. 14 illustrates the data writing operation of the memory circuit MR5. According to the present Example, in order to write any data to memory circuits MR1 of respective rows which are different from each other, the memory circuit MR5 line-sequentially drives the rows of the memory array 10 which correspond to the writing address. Therefore, the rows cannot overlap each other in a period in which data is written in a state in which switching circuits SW1 in different rows are simultaneously on. Accordingly, a writing period T1 differs for each row, and a writing period T1 of an ith row is referred to as T1i. FIG. 13 illustrates a case where High as the first electric potential level is written in the writing period T1i, and FIG. 14 illustrates a case where Low as the second electric potential level is written in the writing period T1i. In addition, FIG. 13 and FIG. 14 illustrate, in their respective lower parts, electric potentials of the node PIX (left side) and the node MRY (right side), respectively, the electric potentials being obtained in periods corresponding to respective (a) through (h) of FIG. 24.

In FIG. 13, an electric potential of binary levels which are High (an active level) and Low (a non-active level) is applied from the word line control circuit 14 to each of the first word line Xiw(1) and the second word line Xiw(2). The electric potential of the binary levels, i.e., the High electric potential and the Low electric potential may be set individually for each of the lines. To the bit line Yj, binary logic levels which are High lower than the High electric potential of the first word line Xiw(1) and Low are supplied from the writing/reading circuit 15. The High electric potential of the second word line Xiw(2) is equal to the High electric potential of the bit line Yj or the High electric potential of the first word line Xi(1), and the Low electric potential of the second word line Xiw(2) is lower than the Low electric potential of the binary logic levels. The reference electric potential wire RL1 supplies a constant electric potential.

The writing period T1i and the refresh period T2 are set for the data writing operation. The writing period T1i starts at a time twi which differs for the each row. After the writing of data to the memory circuits MR5 in the rows corresponding to the writing address is finished, the refresh period T2 starts at a time tr simultaneously for all the rows including rows which do not correspond to the writing address. The writing period T1i is a period in which data to be retained in the memory circuit MR5 is written and which has a period t1i and a period t2i that are successive. The refresh period T2 is a period in which a binary logic level corresponding to the data written to the memory circuit MR5 is retained while being refreshed and which has a period t3 through a period t14 that are successive.

In the period t1i of the writing period T1i, both the electric potential of the first word line Xiw(1) and the electric potential of the second word line Xiw(2) are High. This causes the transistors N1 and N6 to turn on, which causes the switching circuit SW1 to turn on and causes the data transfer section TS1 to be in the state in which the data transfer section TS1 carries out the transfer operation. Thus, the first electric potential level (High here) supplied to the bit line Yj is written to the node PIX. In the period t2i, the electric potential of the first word line Xiw(1) is Low, whereas the electric potential of the second word line Xiw(2) is maintained at High. This causes the transistor N1 to turn off, which causes the switching circuit SW1 to turn off. Since the transistor N6 continues to be on, i.e., the data transfer section TS1 continues to be in the state in which the data transfer section TS1 carries out the transfer operation, the first electric potential level is transferred from the node PIX to the node MRY, and each of the nodes PIX and MRY is disconnected from the bit line Yj. In the writing period T1i, an electric potential of the control line L2 is High. The above process corresponds to the state in (a) of FIG. 24.

Next, the refresh period T2 starts. In the refresh period T2, the electric potential of the bit line Yj is High which is the first electric potential level. As for the first word line Xi(1) and the second word line Xi(2), driving described below is carried out for all the values of i (1≤i≤n). That is, the entire refresh operation is carried out for all the memory cells 20.

In the period t3 of the refresh period T2, the electric potential of the first word line Xi(1) is Low, the electric potential of the second word line Xi(2) is Low, and the electric potential of the control line L2 is maintained at High. This causes the transistor N6 to turn off, i.e., causes the data transfer section TS1 to be in the state in which the data transfer section TS1 carries out the non-transfer operation. Thus, the node PIX and the node MRY are disconnected from each other. Though the transistor P6 turns on, the refresh output control section RS1 carries out the second operation. This is because the transistor N5 is off regardless of the electric potential of the node MRY since both the electric potential of the node PIX and the electric potential of the control line L2 are High. High is retained in both the node PIX and the node MRY. The above process corresponds to the state in (b) of FIG. 24.

In the period t4, the electric potential of the first word line Xi(1) is High, the electric potential of the second word line Xi(2) is maintained at Low, and the electric potential of the control line L2 is maintained at High. This causes the transistor N1 to turn on, i.e., causes the switching circuit SW1 to turn on. Thus, the High electric potential is written to the node PIX from the bit line Yj again.

In the period t5, the electric potential of the first word line Xi(1) is Low, the electric potential of the second word line Xi(2) is maintained at Low, and the electric potential of the control line L2 is maintained at High. This causes the transistor N1 to turn off, i.e., causes the switching circuit SW1 to turn off. Thus, the node PIX is disconnected from the bit line Yj and then retains High.

The process in the period t4 through the period t5 corresponds to the state in (c) of FIG. 24.

In the period t6, the electric potential of the first word line Xi(1) is maintained at Low, the electric potential of the second word line Xi(2) is maintained at Low, and the electric potential of the control line L2 is Low. This causes the transistor P6 to turn on, i.e., causes the refresh output control section RS1 to be in a state in which the refresh output control section RS1 carries out the first operation. Since the electric potential of the node MRY is High, the transistor N5 is on. Therefore, the refresh output control section RS1 is in the active state, and a Low electric potential is supplied from the control line L2 via the transistors N5 and N6 to the node PIX. The control line L2 corresponds to the voltage supply VS1 in FIG. 23.

The process in the period t6 corresponds to the state in (d) of FIG. 24.

In the period t7, the electric potential of the first word line Xi(1) is maintained at Low, the electric potential of the second word line Xi(2) is High, and the electric potential of the control line L2 is maintained at Low. This causes the transistor N6 to turn on, i.e., causes the data transfer section TS1 to be in the state in which the data transfer section TS1 carries out the transfer operation. This causes the transistor P6 to turn off, i.e., causes the refresh output control section RS1 to be in a state in which the refresh output control section RS1 carries out the second operation. Thus, the second electric potential level (Low here) is transferred from the node PIX to the node MRY. In this case, movement of an electric charge occurs between the capacitor Ca1 and the capacitor Cb1. This causes both the electric potential of the node PIX and the electric potential of the node MRY to be Low. The electric potential of the node PIX rises by a slight amount of voltage of ΔVx due to movement of a positive electric charge from the capacitor Cb1 to the capacitor Ca1 via the transistor N2, but falls within a range of a Low electric potential.

In the period t8, the electric potential of the first word line Xi(1) is maintained at Low, the electric potential of the second word line Xi(2) is maintained at High, and the electric potential of the control line L2 is High. This causes the transistor N6 and the transistor P6 to continue to be off. Thus, Low is retained in both the node PIX and the node MRY. Accordingly, the node PIX is not influenced by a change in electric potential of the control line L2.

In the period t9, the electric potential of the first word line Xi(1) is maintained at Low, the electric potential of the second word line Xi(2) is Low, and the electric potential of the control line L2 is maintained at High. This causes the transistor N6 to turn off, i.e., causes the data transfer section TS1 to be in the state in which the data transfer section TS1 carries out the non-transfer operation. This causes the transistor P6 to turn on, i.e., causes the refresh output control section RS1 to be in the state in which the refresh output control section RS1 carries out the first operation. Thus, the node PIX and the node MRY are disconnected from each other. In this case, since the electric potential of the node MRY is Low, the transistor N5 is off and the refresh output control section RS1 is accordingly in the non-active state. Therefore, Low is retained in both the node PIX and the node MRY.

The above process in the period t7 through the period t9 corresponds to the state in (e) of FIG. 24.

In the period t10, the electric potential of the first word line Xi(1) is High, the electric potential of the second word line Xi(2) is maintained at Low, and the electric potential of the control line L2 is maintained at High. This causes the transistor N1 to turn on, i.e., causes the switching circuit SW1 to turn on. Thus, the High electric potential is written to the node PIX from the bit line Yj again.

In the period t11, the electric potential of the first word line Xi(1) is Low, the electric potential of the second word line Xi(2) is maintained at Low, and the electric potential of control line L2 is maintained at High. This causes the transistor N1 to turn off, i.e., causes the switching circuit SW1 to turn off. Thus, the node PIX is disconnected from the bit line Yj and then retains High.

The above process in the period t10 through the period t11 corresponds to the state in (f) of FIG. 24.

In the period t12, the electric potential of the first word line Xi(1) is maintained at Low, the electric potential of the second word line Xi(2) is maintained at Low, and the electric potential of the control line L2 is maintained at Low. In this case, the transistor P6 is on, whereas the transistor N5 if off since the electric potential of the node MRY is Low. This causes the refresh output control section RS1 to continue to be in the non-active state, in which the refresh output control section RS1 stops carrying out the output. Accordingly, the node PIX continues to retain High.

The above process in the period t12 corresponds to the state in (g) of FIG. 24.

In the period t13, the electric potential of the first word line Xi(1) is maintained at Low, the electric potential of the second word line Xi(2) is High, and the electric potential of the control line is maintained at Low. This causes the transistor N6 to turn on, i.e., causes the data transfer section TS1 to be in the state in which the data transfer section TS1 carries out the transfer operation. This causes the transistor P6 to turn off, i.e., causes the refresh output control section RS1 to be in the state in which the refresh output control section RS1 carries out the second operation. Thus, the first electric potential level (High here) is transferred from the node PIX to the node MRY. In this case, movement of an electric charge occurs between the capacitor Ca1 and the capacitor Cb1. This causes both the electric potential of the node PIX and the electric potential of the node MRY to be High. In this case, the electric potential of the node PIX is reduced by a slight amount of voltage of $\Delta Vy$ by movement of a positive electric charge from the capacitor Ca1 to the capacitor Cb1 via the transistor N2, but falls within a range of a High electric potential.

In the period t14, the electric potential of the first word line Xi(1) is maintained at Low, the electric potential of the second word line Xi(2) is maintained at High, and the electric potential of the control line L2 is High. According to this, High is retained in both the node PIX and the node MRY.

The above process in the period t13 through the period t14 corresponds to the state in (h) of FIG. 24.

As a result of the above operation, the electric potential of the node PIX is High in the period t1i through the period t5 and the period t10 through the period t14 and is Low in the period t6 through the period t9, and the electric potential of the node MRY is High in the period t1i through the period t6 and the period t13 through the period t14 and is Low in the period t7 through the period t12.

Thereafter, in order to continue the refresh period T2, the command decoder 12 repeats the operation in the period t3 through the period t14. In order to write new data or read out data, the command decoder 12 finishes the refresh period T2 so as to terminate the entire refresh operation mode.

The above description has discussed the case of FIG. 13.

Note that the command to carry out the entire refresh operation may be generated not from an externally supplied signal but from a clock which is internally generated by an oscillator or the like. This makes it unnecessary for an external system to input a refresh command at regular time intervals. This brings about an advantage of allowing flexible system construction. According to a dynamic memory circuit using the memory cell 20 in accordance with the present Example, it is unnecessary to carry out the entire refresh operation by scanning each word line, and the entire refresh operation can be carried out with respect to an entire array at one time. This can eliminate the need for a peripheral circuit which is necessary, in a common conventional dynamic memory circuit, for refreshing an electric potential of a bit line Yj while carrying out destructive reading.

Next, the following description discusses the case of FIG. 14.

In FIG. 14, Low as the second electric potential level is written in the writing period T1i. However, in FIG. 14, the first word line Xi(1), the second word line Xi(2), and the third word line Xi(3) change in electric potential in each of the periods as in the case of FIG. 13 except that the electric potential of the bit line Yj is Low in the writing period T1i.

According to this, the electric potential of the node PIX is Low in the period t1i through the period t3 and the period t12 through the period t14 and is High in the period t4 through the period t11, and the electric potential of the node MRY is Low in the period t1i through the period t6 and the period t13 through the period t14 and is High in the period t7 through the period t12.

Note that (a) through (h) of FIG. 24 illustrate transition of the state of the memory cell 20. However, the operation of the memory circuit MR5 in FIG. 13 and FIG. 14 can be classified into the following operation steps.

(1) First Step (Period t11 through Period t2i (Writing Period T1i))

In a first step, in a state in which (i) the binary logic level corresponding to the data is being supplied from the writing/reading circuit 15 to the bit line Yj and (ii) the refresh output control section RS1 is carrying out the second operation, the memory circuit MR5 causes the switching circuit SW1 to turn on, so as to write the binary logic level to the memory cell 20. Then, in a state in which (i) the binary logic level has been written to the memory cell 20 and (ii) the refresh output control section RS1 is carrying out the second operation, the memory circuit MR5 causes the data transfer section TS1 to carry out the transfer operation.

(2) Second Step (Each of Period t3 through Period t4 and Period t9 through Period t10)

In a second step following the first step, in a state in which (i) the refresh output control section RS1 is carrying out the second operation and (ii) the data transfer section TS1 is carrying out the non-transfer operation, the memory circuit MR5 causes the switching circuit SW1 to turn on, so as to supply, to the first data retaining section DS1 via the bit line Yj, the binary logic level which is equal to a level that is equivalent to control information which causes the refresh output control section RS1 to be in the active state.

(3) Third Step (Each of Period t5 through Period t6 and Period t11 through Period t12)

In a third step following the second step, in a state in which (i) the switching circuit SW1 is off and (ii) the data transfer section TS1 is carrying out the non-transfer operation, the memory circuit MR5 causes the refresh output control section RS1 to carry out the first operation. By the time the first operation is finished, the memory circuit MR5 causes the binary logic level to be supplied from the voltage supply VS1 to the input of the refresh output control section RS1, the binary logic level being inverse to the level that is equivalent to the control information which causes the refresh output control section RS1 to be in the active state.

(4) Fourth Step (Each of Period t7 through Period t8 and Period t13 through Period t14)

In a fourth step following the third step, in a state in which (i) the switching circuit SW1 is off and (ii) the refresh output control section RS1 is carrying out the second operation, the memory circuit MR5 causes the data transfer section TS1 to carry out the transfer operation.

As for the entire writing operation, the memory circuit MR5 carries out the first step first, and following the first step, the memory circuit MR5 carries out, at least one time, a series of operations from the start of the second step to the end of the fourth step (the period t3 through the period t8).

The following description discusses a first modification of the present Example.

Figure 15:
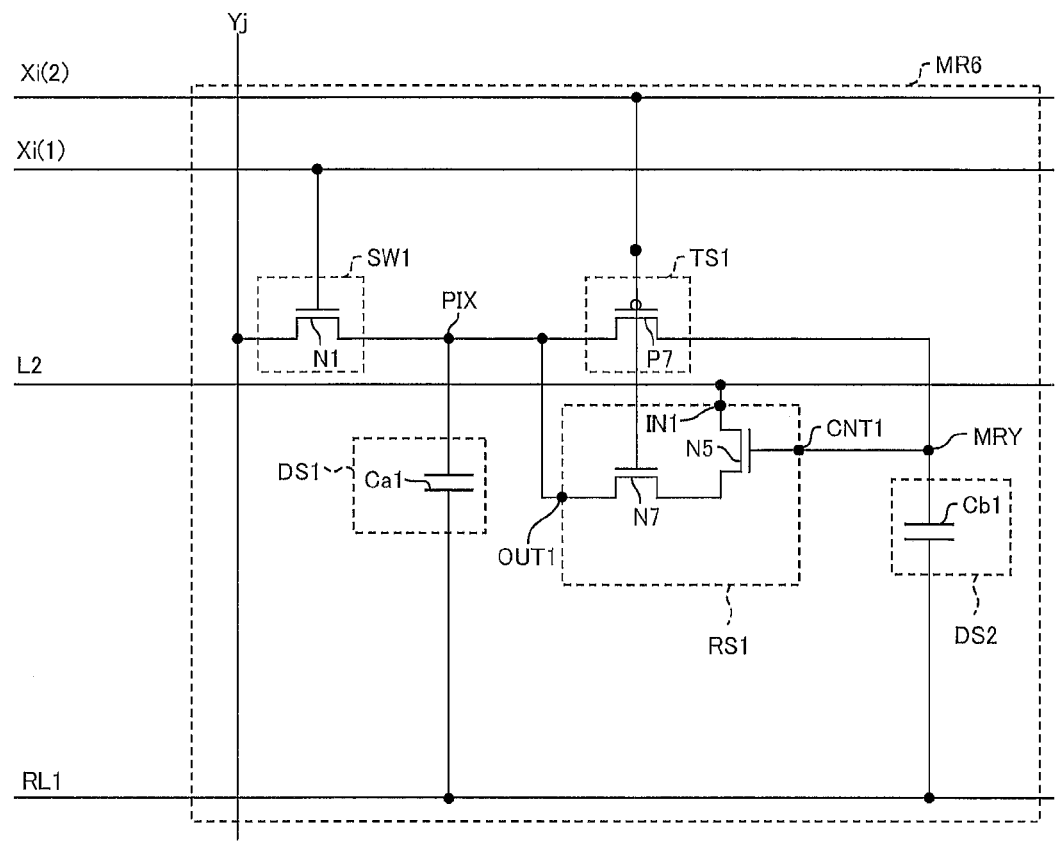
FIG. 15, which shows the embodiment of the present invention, is a circuit diagram illustrating a configuration of a sixth memory circuit.

FIG. 15 illustrates an arrangement of the memory cell 20 of the first modification in the form of a memory circuit MR6 which is an equivalent circuit.

The memory circuit MR6 is obtained by causing the memory circuit MR5 of FIG. 12 to include a transistor (third switch) P7 which is a P-channel TFT and with which the transistor N6 of FIG. 12 has been replaced and a transistor (second switch) N7 which is an N-channel TFT and with which the transistor P6 of FIG. 12 has been replaced.

When the transistor P7 is on, the data transfer section TS1 is in the state in which the data transfer section TS1 carries out the transfer operation. Meanwhile, when the transistor P7 is off, the data transfer section TS1 is in the state in which the data transfer section TS1 carries out the non-transfer operation.

When the transistor N7 is on, the refresh output control section RS1 is controlled to be in the state in which the refresh output control section RS1 carries out the first operation. Meanwhile, when the transistor N7 is off, the refresh output control section RS1 is controlled to be in the state in which the refresh output control section RS1 carries out the second operation.

Figure 16:
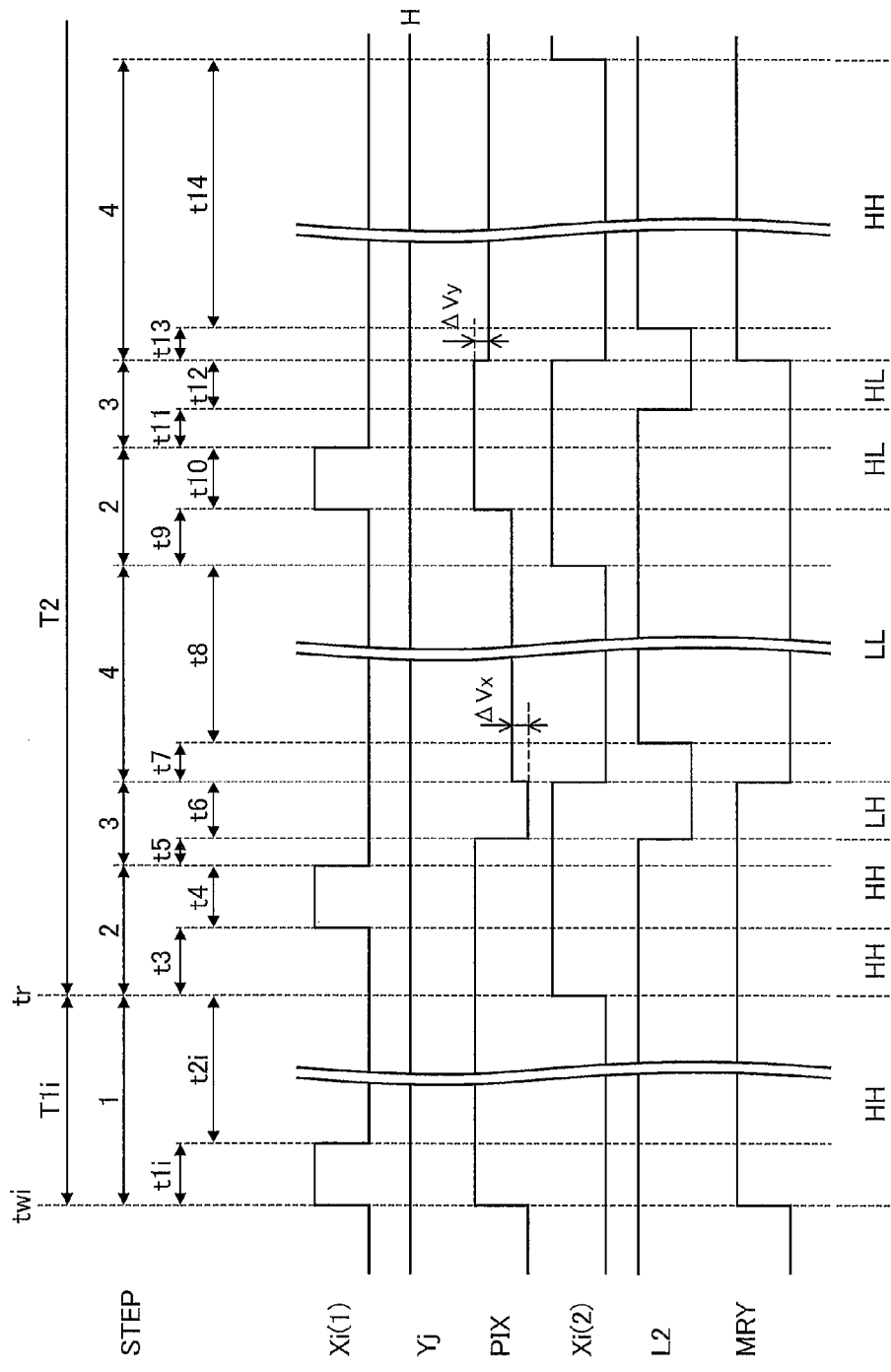
FIG. 16 is a signal diagram illustrating a writing operation of the memory circuit of FIG. 15.

FIG. 16 illustrates operation of the memory circuit MR6.

Electric potential waveforms of driving wires of FIG. 16 are identical to the electric potential waveforms of FIG. 13 except that the electric potential waveform of the second word line Xi(2) of FIG. 16 is obtained by inverting, between High and Low, the electric potential waveform of the second word line Xi(2) of FIG. 13.

According to this, the electric potential of the node PIX is High in the period t1i through the period t5 and the period t10 through the period t14 and is Low in the period t6 through the period t9, and the electric potential of the node MRY is High in the period t1i through the period t6 and the period t13 through the period t14 and is Low in the period t7 through the period t12.

The following description discusses a second modification of the present Example.

Figure 17:
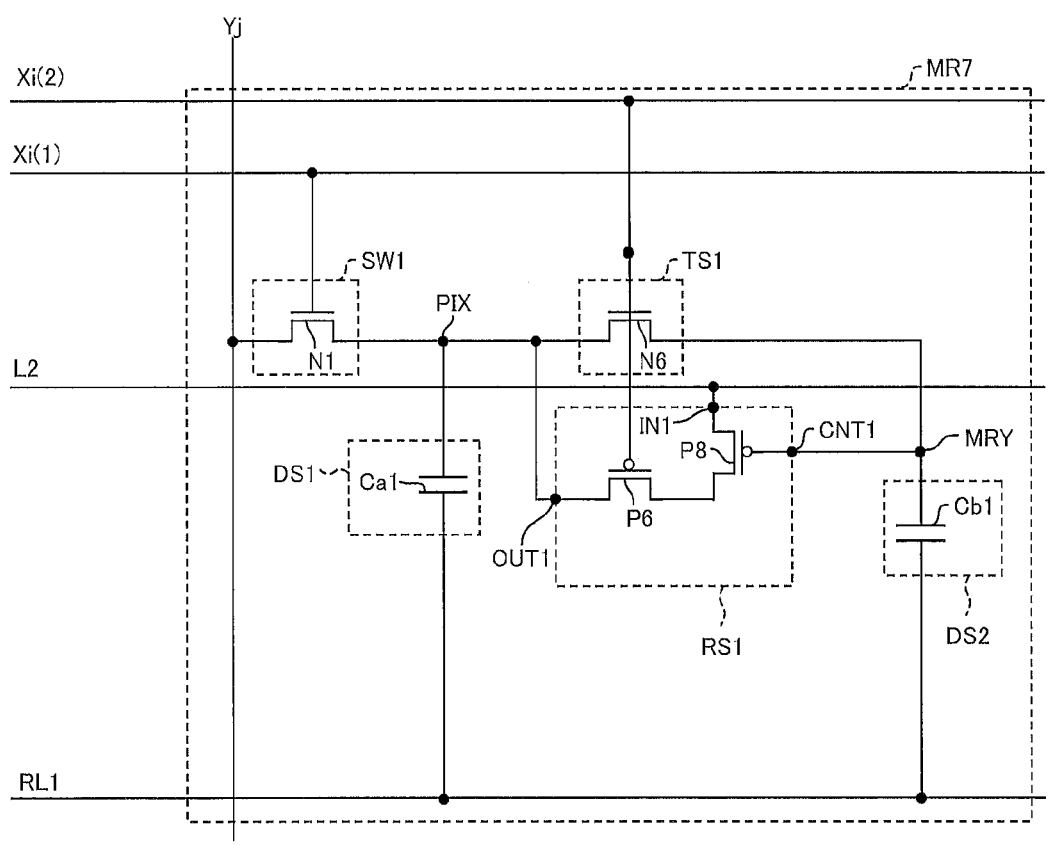
FIG. 17, which shows the embodiment of the present invention, is a circuit diagram illustrating a configuration of a seventh memory circuit.

FIG. 17 illustrates an arrangement of the memory cell 20 of the second modification in the form of a memory circuit MR7 which is an equivalent circuit.

The memory circuit MR7 is obtained by causing the memory circuit MR5 of FIG. 12 to include a transistor (first switch) P8 which is a P-channel TFT and with which the transistor N5 of FIG. 12 has been replaced.

Since the transistor P8 is a P-channel TFT, control information which causes the refresh output control section RS1 to be in an active state during the first operation, i.e., an active level is Low, and control information which causes the refresh output control section RS1 to be in a non-active state during the first operation, i.e., a non-active level is High. The Low electric potential of the second word line Xiw(2) is equal to the Low electric potential of the binary logic levels. In the case of the configuration of FIG. 17, all the control lines can have electric potentials of the binary logic levels.

Figure 18:
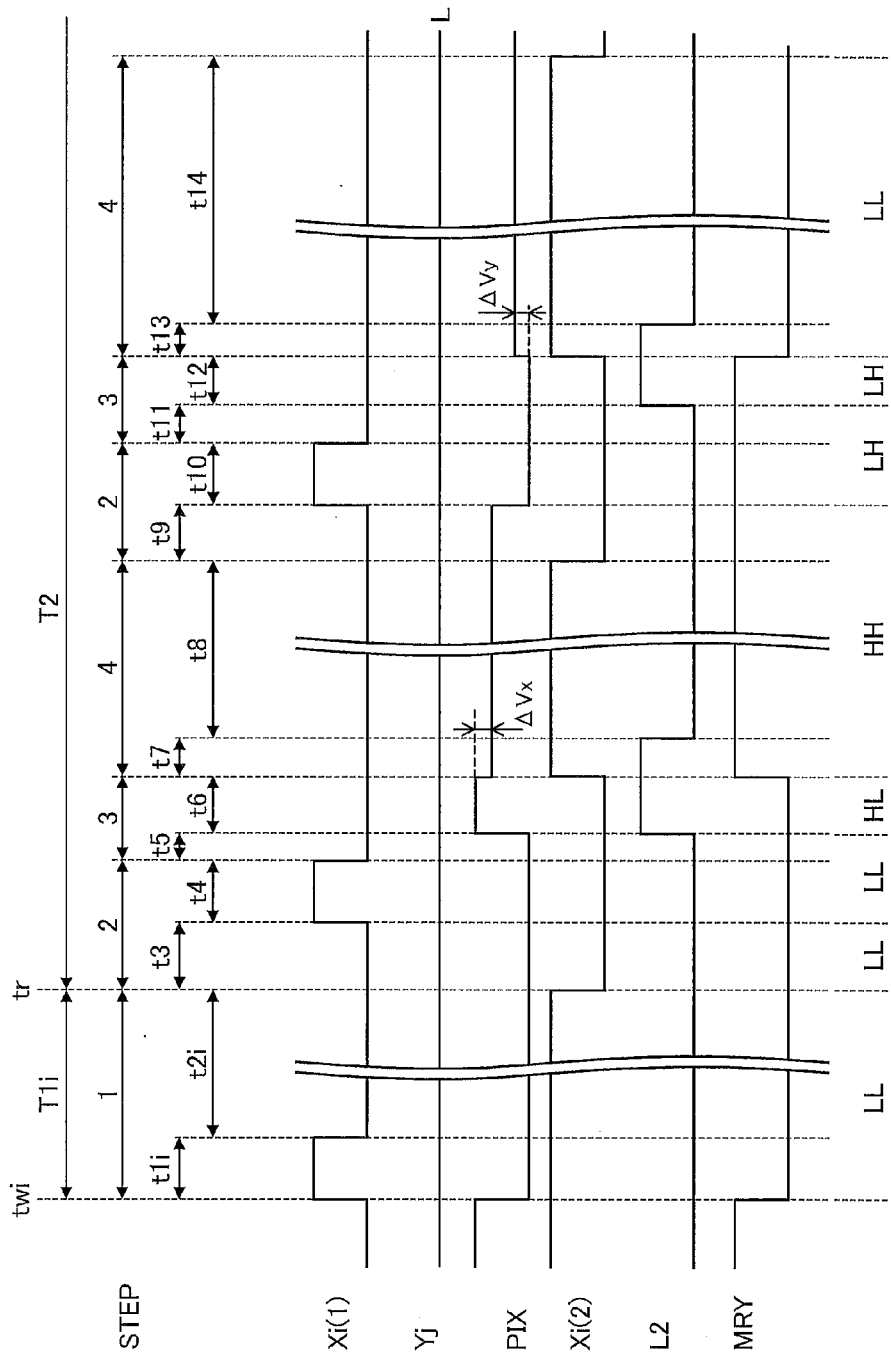
FIG. 18 is a signal diagram illustrating a writing operation of the memory circuit of FIG. 17.

FIG. 18 illustrates operation of the memory circuit MR7.

Electric potential waveforms of driving wires of FIG. 18 are identical to the electric potential waveforms of FIG. 13 except that the electric potential waveform of the control line L2 of FIG. 18 is obtained by inverting, between High and Low, the electric potential waveform of the control line L2 of FIG. 13. Electric potential waveforms of the node PIX and the node MRY are obtained by vertically inverting the electric potential waveforms of FIG. 13 on an axis at a center of High and Low levels.

According to this, the electric potential of the node PIX is Low in the period t1i through the period t5 and the period t10 through the period t14 and is High in the period t6 through the period t9, and the electric potential of the node MRY is Low in the period t1i through the period t6 and the period t13 through the period t14 and is High in the period t7 through the period t12.

FOURTH EXAMPLE

Figure 19:
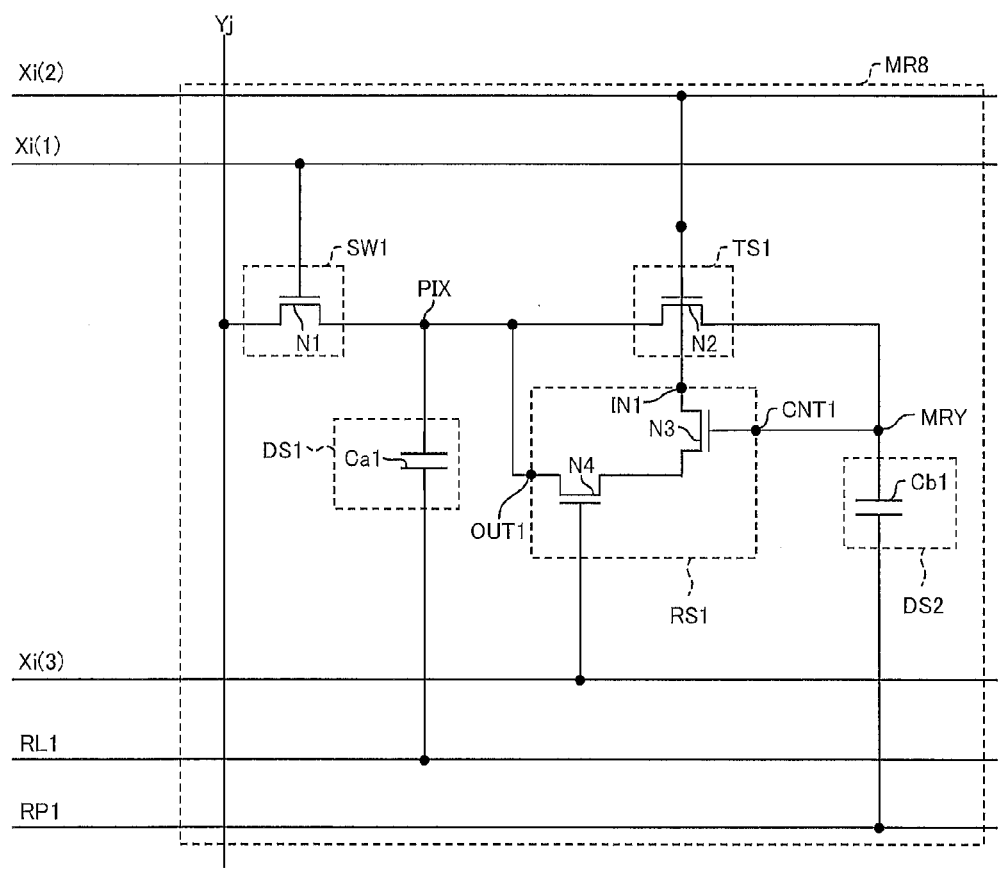
FIG. 19, which shows the embodiment of the present invention, is a circuit diagram illustrating a configuration of an eighth memory circuit.

FIG. 19 illustrates an arrangement of a memory cell 20 of the present Example in the form of a memory circuit MR8 which is an equivalent circuit.

The memory circuit MR8 is obtained by causing the memory circuit MR1 of FIG. 1 to further include a refresh pulse line (fifth wire) RP1 to which the other end of the capacitor Cb1 is connected, the other end having been connected to the reference electric potential wire RL1 of FIG. 1. The refresh pulse line RP1, which is provided for each row, is driven by a row driver such as a word line control circuit. Note that, since a signal to be supplied to the refresh pulse line RP1 is shared by all the memory cells 20, the refresh pulse line RP1 is not necessarily required to be provided for each row to be driven by a word line control circuit 14. The refresh pulse line RP1 may be driven by a writing/reading circuit 15 or the like. It is assumed that a High electric potential of a second word line Xi(2) is equal to a High electric potential to be retained in a node PIX.

Figure 20:
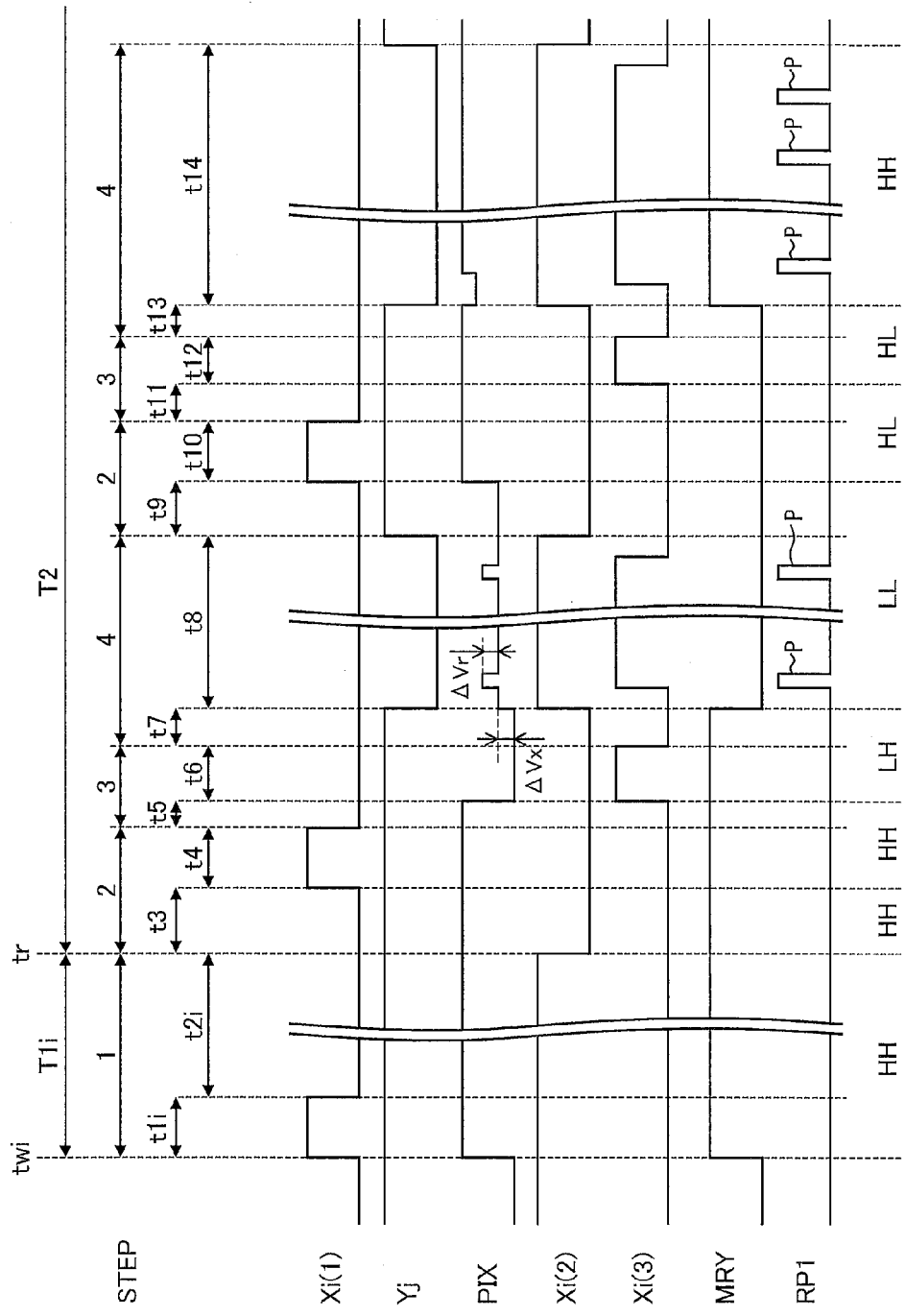
FIG. 20 is a signal diagram illustrating a writing operation of the memory circuit of FIG. 19.

FIG. 20 illustrates operation of the memory circuit MR8.

In FIG. 20, a first period in which an electric potential of a bit line Yj is Low and an electric potential of a third word line Xi(3) is High is set for each of the period t8 and the period t14 in the electric potential waveforms of FIG. 2. Then, in each of the period t8 and the period t14, a positive pulse P which rises from Low to High and has a short duration is supplied to the refresh pulse line RP1 on a predetermined cycle only in a period in which the electric potential of the third word line Xi(3) is High.

In the fourth step, the first period is set after the memory circuit MR8 temporarily causes a data transfer section TS1 to carry out the transfer operation in a state in which (i) a switching circuit SW1 is off and (ii) a refresh output control section RS1 is carrying out the second operation, the first period being a period in which the memory circuit MR8 subsequently causes the refresh output control section RS1 to carry out the first operation in a state in which (i) the switching circuit SW1 is off and (ii) the data transfer section TS1 is carrying out the transfer operation. It is only necessary that a period in which the electric potential of the bit line Yj is Low include the first period.

Operation in the period t1 through the period t7 and the period t9 through the period t13 is identical to the operation illustrated in FIG. 2.

In FIG. 2, the node PIX is floating since the transistor N1 and the transistor N4 are off in the period t8 and the period t14. However, the electric potential of the node PIX may change due to an off-leakage of the transistor N1 and an off-leakage of the transistor N4.

In contrast, the electric potential of the bit line Yj is Low in the period t8 of FIG. 20. Therefore, an increase in electric potential of the node PIX can be prevented in a case where the electric potential of the node PIX is Low and the transistor N1 whose off-leakage is originally large is used or in a case where the electric potential of the node PIX is Low and an off-leakage of the transistor N1 increases toward the bit line Yj when the Low electric potential of the bit line Yj becomes lower than the Low electric potential of the node PIX.

In a case where in the period t8, the electric potential of the third word line Xi(3) is High and the positive pulse is supplied to the refresh pulse line RP1, the electric potential of the node MRY is increased by $\Delta Vr = Cb1/(Ca1+Cb1) \times$ (an amplitude of a change in electric potential of the refresh pulse line RP1). Note that Ca1 and Cb1 are capacitances of the capacitor Ca1 and the capacitor Cb1, respectively. Assume that the electric potential of the node MRY is VL when the electric potential of the refresh pulse line RP1 is Low. Since the node PIX and the node MRY are connected to each other, each of the electric potential of the node PIX and the electric potential of the node MRY is $VL+\Delta Vr$. Note here that a transistor N3 has a first drain/source terminal whose electric potential is High, a gate terminal whose electric potential is $VL+\Delta Vr$, and a second drain/source terminal whose electric potential is $VL+\Delta Vr$. Therefore, the transistor N3 continues to be off, and no charge is carried out from the second word line Xi(2) to the node PIX. When the electric potential of the refresh pulse line RP1 becomes Low, the electric potential of the node PIX returns to VL which has not been boosted. Namely, the electric potential of the node PIX is maintained at Low.

In the period t14, in a case where the electric potential of the node PIX is a High electric potential$-\Delta Vy$ (changes when the transistor N2 turns on), the refresh operation is carried out with respect to a homopolarity (High) by use of the refresh pulse line RP1. In a case where in the period t14, in a period in which the electric potential of the third word line Xi(3) is High the electric potential of the refresh pulse line RP1 is High and the positive pulse is supplied to the refresh pulse line RP1, the electric potential of the node MRY is increased by $\Delta Vr = Cb1/(Ca1+Cb1) \times$ (an amplitude of a change in electric potential of the refresh pulse line RP1).

In a case where the electric potential of the node MRY is VH when the electric potential of the refresh pulse line RP1 is Low, the electric potential of the node MRY becomes $VH+\Delta Vr$. When $VH+\Delta Vr$ exceeds (a gate electric potential of the transistor N2)$-$Vth, the transistor N2 turns off. Note here that the gate electric potential of the transistor N2 is the electric potential of the second word line Xi(2) and Vth is a threshold voltage of the transistor N2.

Further, when $VH+\Delta Vr$ exceeds a source electric potential of the transistor N3+Vth, the transistor N3 turns on. Note here that the source electric potential of the transistor N3 is the electric potential of the first drain/source terminal of the transistor N3, i.e., the electric potential of the second word line Xi(2). Accordingly, the node PIX is connected to the second word line Xi(2), so that the electric potential of the node PIX is refreshed to a High electric potential. When the electric potential of the refresh pulse line RP1 becomes Low, the electric potential of the node MRY becomes a High electric potential$-$Vth. Note here that Vth is the threshold voltage of the transistor N2. As described earlier, the High electric potential of the node PIX can be refreshed every time the positive pulse is supplied to the refresh pulse line RP1.

Note that an amplitude of the positive pulse which is supplied to the refresh pulse line RP1 so as to refresh, to High, the node PIX which has a High potential needs to be set so that the electric potential of the node MRY exceeds (a High electric potential desired to be obtained by refresh)+Vth. Note here that Vth is a threshold voltage of the transistor N3.

In the period t8 of FIG. 20, the operation is carried out in which the electric potential of the node PIX is maintained at Low. In a case where the electric potential of the node PIX is High in the period t8, the refresh operation can be carried out with respect to a homopolarity (High) as in the case of the period t14 of FIG. 20. In a case where the electric potential of the node PIX is Low in the period t14, the electric potential of the node PIX can be maintained at Low as in the case of the period t8 of FIG. 20.

Assume that a memory circuit uses a transistor whose channel polarity is reverse to a channel polarity of a transistor of the memory circuit MR8 of FIG. 19 and carries out a logic operation which is inverse to a logic operation of FIG. 20. In the period t8 and the period t14, a negative pulse which falls from High to Low is applied to the refresh pulse line RP1. In this case, in the period t8 and the period t14, a High level retained in each of the node PIX and the node MRY is retained as it is and a Low level retained in the node PIX is refreshed to a Low electric potential by the second word line Xi(2). In a case where the electric potential of the node PIX is refreshed to the Low electric potential, the electric potential of the node MRY becomes a Low electric potential+Vth when the electric potential of the refresh pulse line RP1 becomes Low.

Namely, in a case where control information which causes the refresh output control section RS1 to be in an active state during the first operation is a higher level of a first electric potential level and a second electric potential level, a pulse which causes the electric potential of the refresh pulse line RP1 to rise from a Low electric potential to a High electric potential is supplied to the refresh pulse line RP1. In a case where control information which causes the refresh output control section RS1 to be in the active state during the first operation is a lower level of the first electric potential level and the second electric potential level, a pulse which causes the electric potential of the refresh pulse line RP1 to fall from a High electric potential to a Low electric potential is supplied to the refresh pulse line RP1.

In the first period, the binary logic level which is equal to a level that is equivalent to the control information which causes the refresh output control section RS1 to be in a non-active state during the first operation is supplied to the bit line Yj.

According to the present Example, a High electric potential of the node PIX, i.e., a High electric potential and a Low electric potential of a first data retaining section DS1 can be retained for a long term. This allows a reduction in frequency of polarity reversal of data to be retained. Since polarity reversal produces a consumption current associated with charge and discharge of the capacitor Ca1 and the capacitor Cb1, a consumption current can be reduced in proportion to a reduction in number of times of charge and discharge.

FIFTH EXAMPLE

Figure 30:
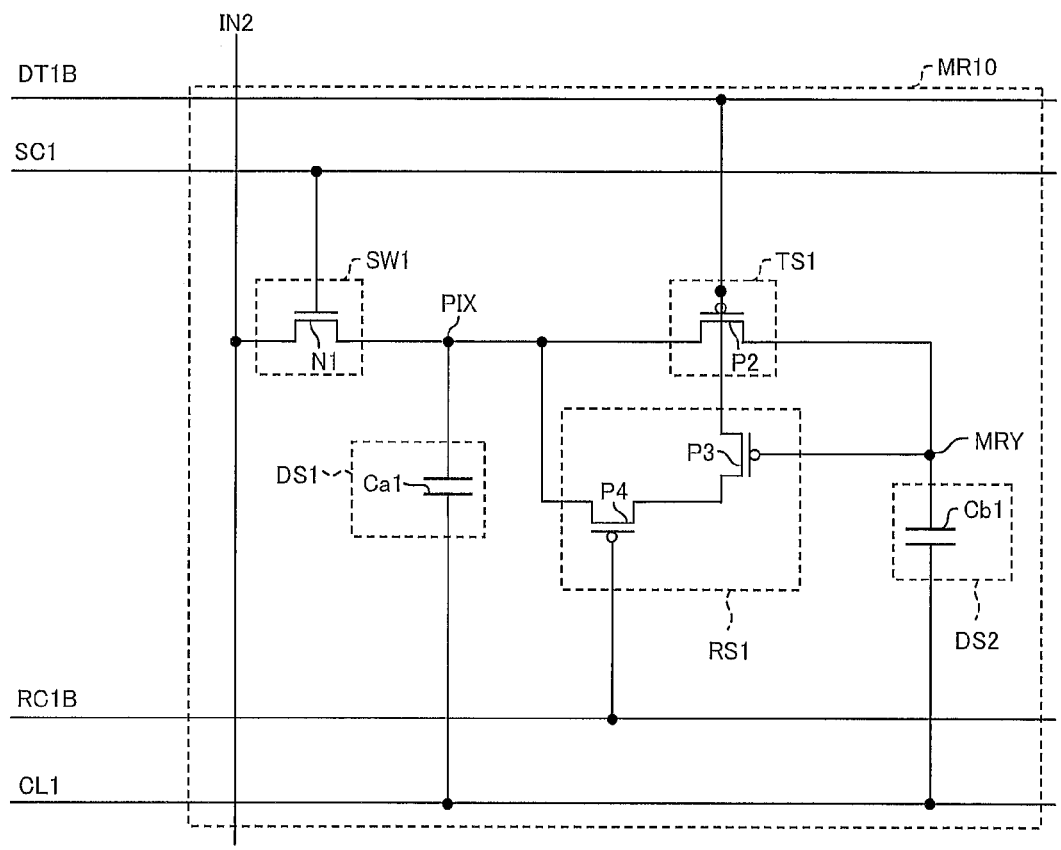
FIG. 30, which shows the embodiment of the present invention, is a circuit diagram illustrating a configuration of a ninth memory circuit.

FIG. 30 illustrates an arrangement of a memory cell 20 of the present Example in the form of a memory circuit MR10 which is an equivalent circuit.

The memory circuit MR10 is obtained by causing the memory circuit MR1 of FIG. 1 to include a transistor P2 which is a P-channel TFT and with which the transistor N2 of FIG. 1 has been replaced, a transistor P3 which is a P-channel TFT and with which the transistor N3 of FIG. 1 has been replaced, and a transistor P4 which is a P-channel TFT and with which the transistor N4 of FIG. 1 has been replaced. The memory circuit MR10 includes a data transfer control line DT1B as the data transfer control line DT1 of FIG. 23, includes a refresh output control line RC1B as the refresh output control line RC1 of FIG. 23, and includes a data input line IN2 as the data input line IN of FIG. 23. The memory circuit MR10 further includes a storage capacitor line CL1 with which the reference electric potential wire RL1 of FIG. 1 has been replaced.

Figure 31:
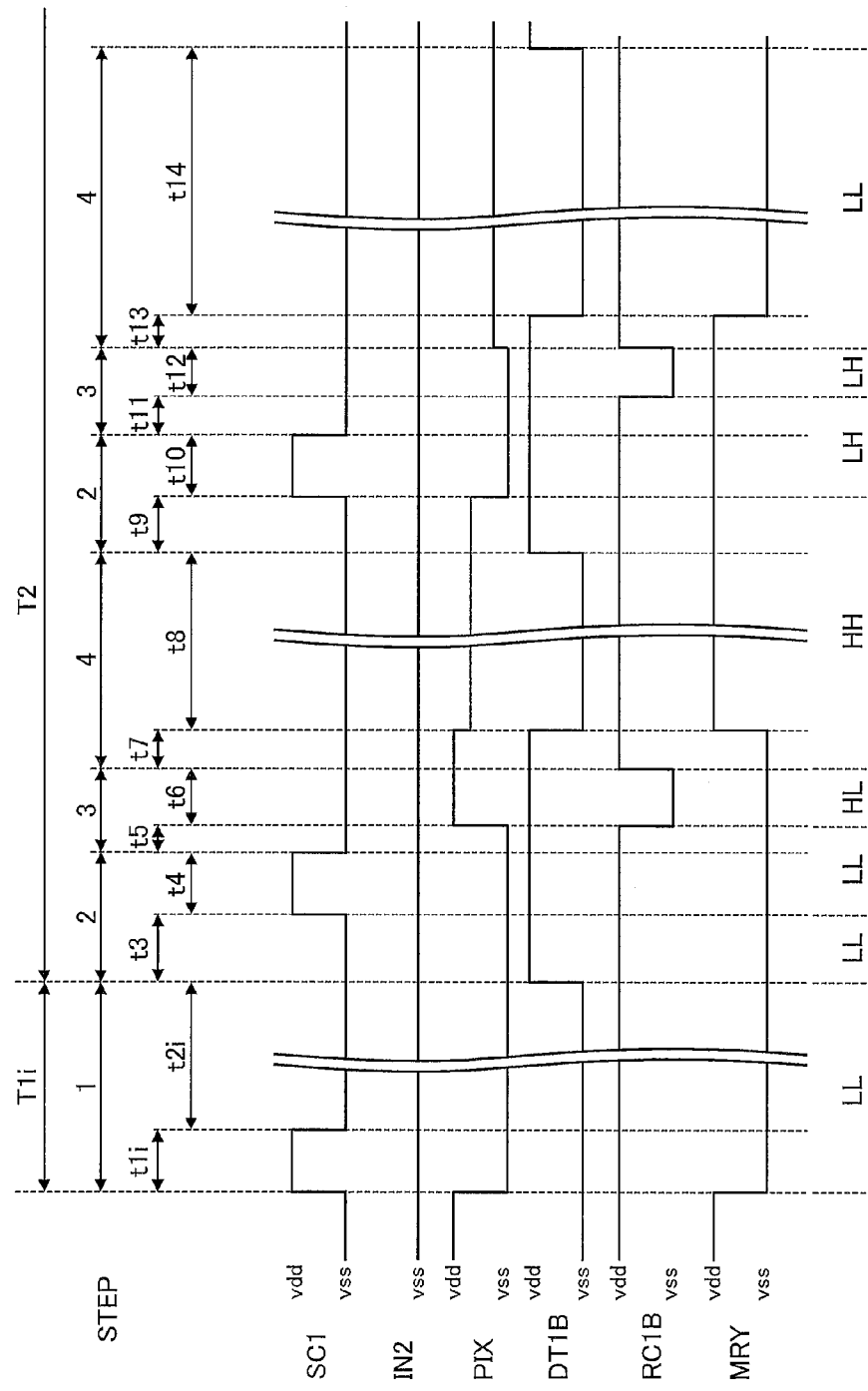
FIG. 31 is a signal diagram illustrating a writing operation of the memory circuit of FIG. 30.

The memory cell 20 can be operated by two logic voltage supplies of a High-level voltage supply vdd and a Low-level voltage supply vss (see a signal diagram of FIG. 31 illustrating a writing operation). Note that the storage capacitor line CL1 has a constant electric potential.

To a switch control line SC1, an electric potential vdd which causes the switch control line SC1 to be at an active level is supplied in the period t1i, the period t4, and an electric potential vss which causes the switch control line SC1 to be at a non-active level is supplied in the other periods.

An electric potential of the data input line IN2 is vss in the refresh period T2.

To the data transfer control line DT1B, an electric potential vss which causes the data transfer control line DT1B to be at an active level is supplied in the period t1i, the period t2i, the period t8, and the period t14, and an electric potential vdd which causes the data transfer control line DT1B to be at a non-active level is supplied in the other periods.

To the refresh output control line RC1B, an electric potential vss which causes the refresh output control line RC1B to be at an active level is supplied in the period the period t6 and the period t12, and an electric potential vdd which causes the refresh output control line RC1B to be at a non-active level is supplied in the other periods.

According to the arrangement, the electric potential of the data input line IN2 is vss in the refresh period T2. This causes a transistor N1 to turn on when the electric potential of the switch control line SC1 is vdd, so that vss can be written from the data input line IN2 to a node PIX.

The electric potential vss can also be written from the data input line IN2 in the writing period T1 when the electric potential of the switch control line SC1 is vdd. In a case where the electric potential of the node PIX preliminarily falls within a range of a Low level, the transistor N1 turns on when the electric potential of the switch control line SC1 is vdd, so that the electric potential vdd can be written from the data input line IN2. In the case of writing of the electric potential vdd, the electric potential of the node PIX rises to vdd−Vth to which the electric potential vdd has decreased by a threshold voltage Vth of the transistor N1 (n-channel transistor).

In a case where the electric potential of the data transfer control line DT1B is vss and either the electric potential of the node PIX or an electric potential of a node MRY falls within a range of a High level, the transistor P2 turns on. In this case, if the electric potential of the node PIX is vss, vss is to be written from the node PIX to the node MRY, and the electric potential of the node MRY decreases from vdd to vss+Vth which is higher than vss by a threshold voltage Vth of the transistor P2 (P-channel transistor) (see the period t14).

In a case where the electric potential of the node MRY is vss+Vth and vdd−(vss+Vth)>Vth, the transistor P3 turns on when the electric potential of the data transfer control line DT1B is vdd, so that the transistor P3 can output the electric potential vdd from its source to its drain. In this case, if the electric potential of the refresh output control line RC1B becomes vss, the transistor P4 turns on, so that the electric potential vdd of the data transfer control line DT1B is written to the node PIX via the transistor P3 and the transistor P4 (see the period t6).

As described earlier, in a case where the electric potential vdd is supplied from the data input line IN2 to the node PIX in the writing period T1i, the electric potential of the node PIX is vdd−Vth. Given that a transfer from the node PIX to the node MRY hardly reduces the electric potential of the node PIX, the electric potential of the node MRY is substantially vdd−Vth. This allows the transistor P3 to be barely off. In this case, if the electric potential of the node MRY is further boosted by use of a separately prepared voltage supply in the period t5, the electric potential of the node MRY is higher than vdd−Vth. This allows the transistor P3 to be off without fail.

As described earlier, according to the present Example, control necessary for a memory operation can be carried out by use of two electric potentials. This means that, since logic control can be carried out by use of electric potentials which are equal to binary logic levels retained in a pixel, an additional voltage supply for logic control is unnecessary and electric power consumption can be reduced in a voltage supply. In a case where the memory circuit MR10 is applied to a display device of an embodiment described later and no multilevel display is carried out, a logic operation can be carried out at a minimum voltage supply.

According to the configuration, except for a case where the node PIX is subjected to a change in electric potential due to an off-leakage and/or a parasitic capacitor, High/Low can be written to the node PIX in the refresh period T2 in a state in which the node PIX is not influenced by a threshold voltage of a transistor. Namely, the circuit configuration of the present Example allows obtainment of an electric potential, as the electric potential of the node PIX, identical to the electric potential obtained by the circuit configuration of each of the First through Fourth Examples.

Figure 32:
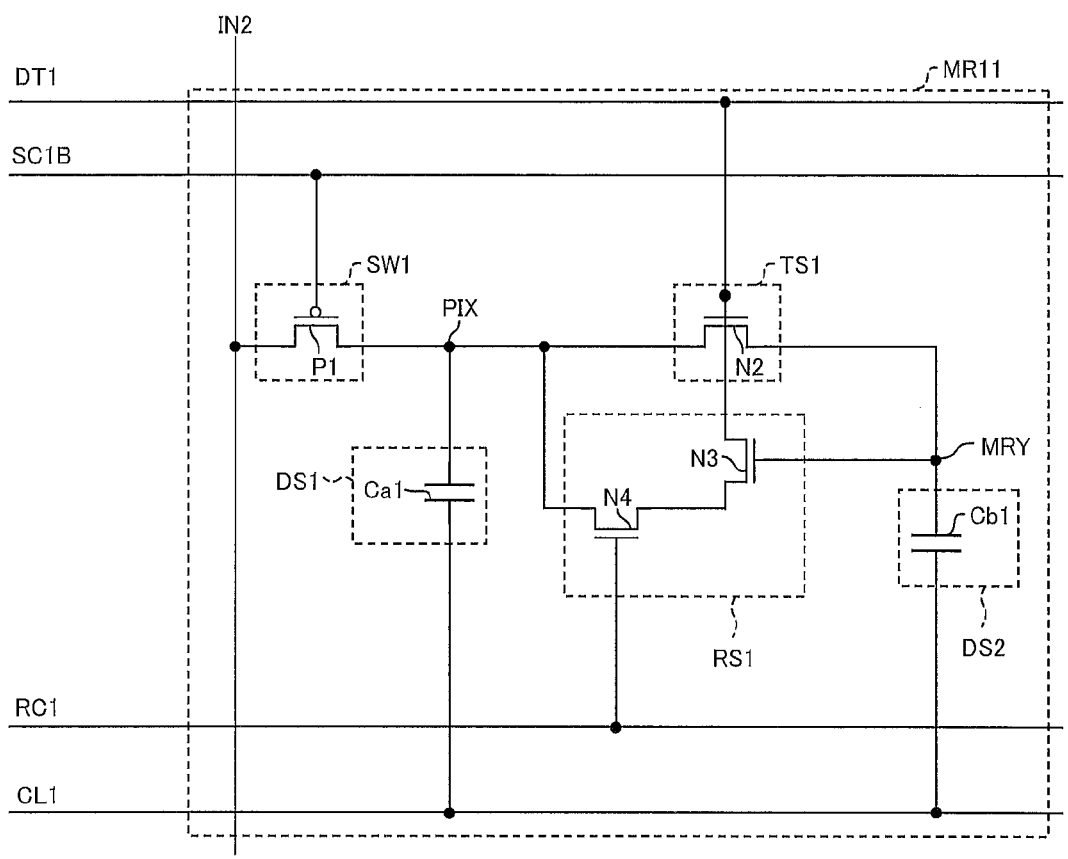
FIG. 32, which shows the embodiment of the present invention, is a circuit diagram illustrating a configuration of a tenth memory circuit.
Figure 33:
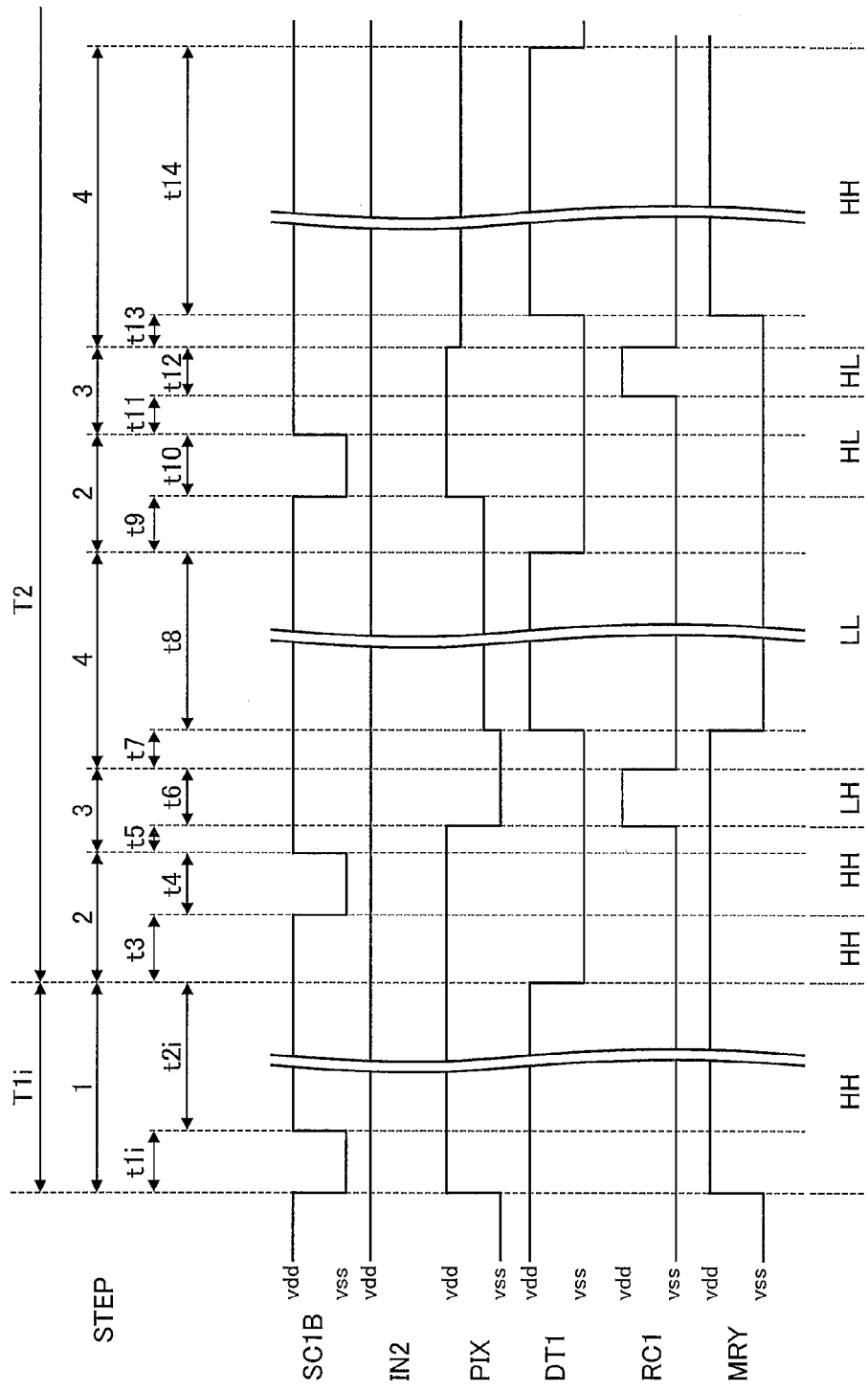
FIG. 33 is a signal diagram illustrating a writing operation of the memory circuit of FIG. 32.

Next, FIG. 32 illustrates a configuration of a memory circuit MR11 which is a modification of the memory circuit MR10.

The memory circuit MR11 is obtained by inverting an operation logic of the memory circuit MR10 and causing the memory circuit MR10 to include a transistor P1 which is a P-channel TFT and with which the transistor N1 of FIG. 30 has been replaced, a transistor N2 which is an N-channel TFT and with which the transistor P2 of FIG. 30 has been replaced, and a transistor N4 which is an N-channel TFT and with which the transistor P4 of FIG. 30 has been replaced.

The memory circuit MR11 includes a data transfer control line DT1 with which the data transfer control line DT1B of FIG. 30 has been replaced, a switch control line SC1B with which the switch control line SC1 of FIG. 30 has been replaced, and a refresh output control line RC1 with which the refresh output control line RC1B of FIG. 30 has been replaced. Signal electric potentials are obtained by reversing the signal electric potentials of FIG. 31 (see FIG. 33).

This also allows obtainment of functions and effects similar to those obtained by the configurations of FIGS. 30 and 31.

[Second Embodiment]

A second embodiment of the present invention is described below with reference to FIGS. 25 through 27.

The present embodiment describes a display device including the memory device 1 described in the First Embodiment.

Figure 25:
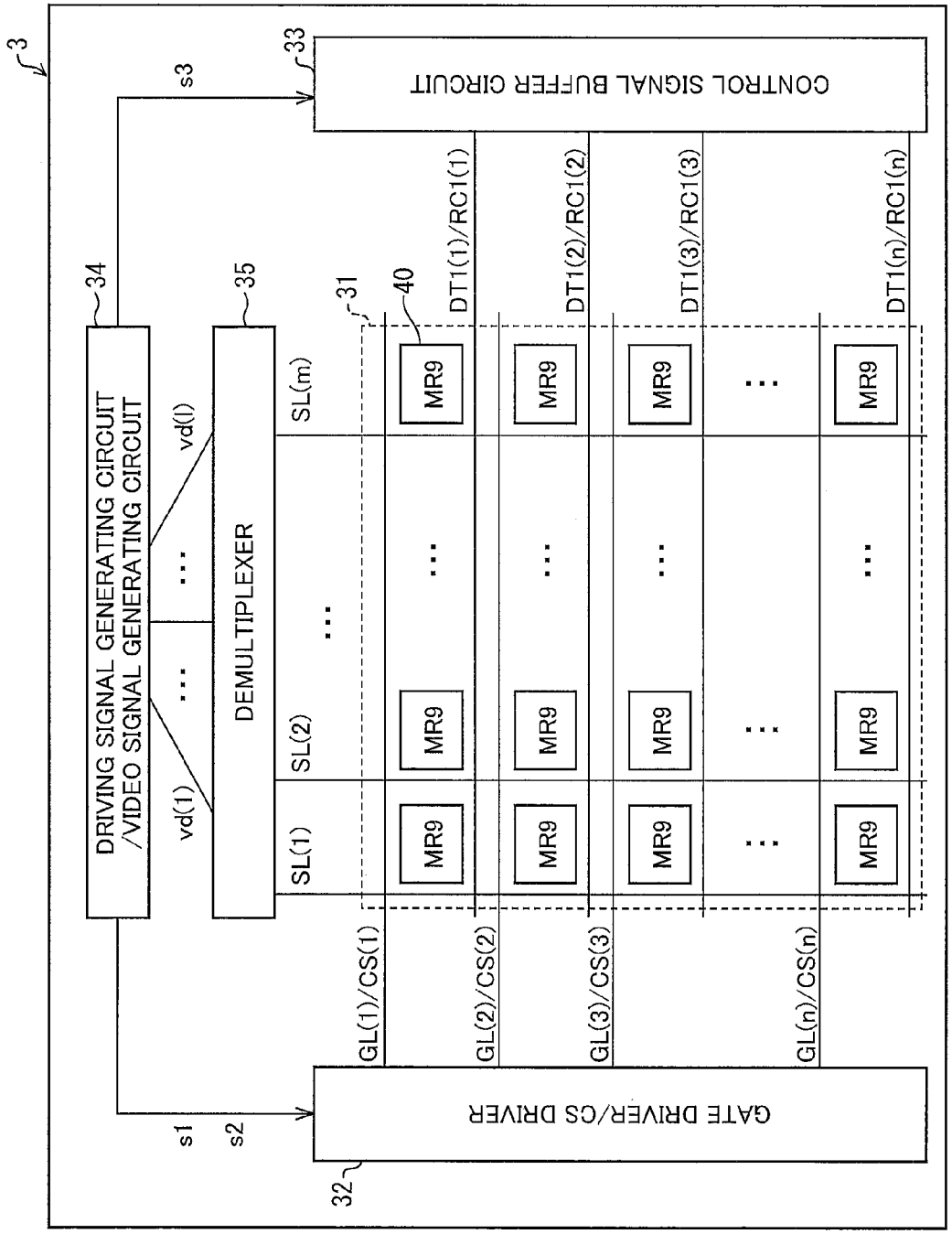
FIG. 25, which shows the embodiment of the present invention, is a block diagram illustrating an arrangement of a display device.

FIG. 25 illustrates an arrangement of a liquid crystal display device 3 as the display device of the present embodiment. The liquid crystal display device 3 operates in a mode which changes between (i) a multi-color display mode that is used for, for example, a screen display carried out while a mobile phone is operating and (ii) a memory circuit operation mode that is used for, for example, a screen display carried out while the mobile phone is in a standby state.

The liquid crystal display device 3 includes a pixel array 31, a gate driver/CS driver 32, a control signal buffer circuit 33, a driving signal generating circuit/video signal generating circuit 34, a demultiplexer 35, a gate line (scanning signal line) GL(i), a storage capacitor wire CS(i), a data transfer control line DT1(i), a refresh output control line RC1(i), a source line (data signal line) SL(j), and an output signal line vd(k). Note that i is an integer ($1 \leq i \leq n$), j is an integer ($1 \leq j \leq m$), and k is an integer ($1 \leq k \leq l < m$).

The pixel array 31, in which pixels 40 each indicated by a pixel circuit MR9 are provided in a matrix pattern, carries out an image display. Each of the pixels 40 includes the memory cell 20 of the First Embodiment. Accordingly, the pixel array 31 includes the memory array 10 of the First Embodiment.

The gate driver/CS driver 32 is a driving circuit which drives pixels 40 as many as n rows via the gate line GL(i) and the storage capacitor wire CS(i). The gate line GL(i) and the storage capacitor wire CS(i) are connected to each pixel 40 in an ith row. The gate line GL(i) serves also as the switch control line SC1 (see FIG. 23), i.e., the first word line Xi(1), and the storage capacitor wire CS(i) serves also as the reference electric potential wire RL1. In order to provide the refresh pulse line RP1 (see FIG. 19) used for the memory circuit MR8 of the First Embodiment, it is only necessary that another storage capacitor wire that serves also as the refresh pulse line RP1 be provided for each row.

The control signal buffer circuit 33 is a driving circuit which drives the pixels 40 as many as the n rows via the data transfer control line DT1(i) and the refresh output control line RC1(i). The data transfer control line DT1(i) is the data transfer control line DT1 (FIG. 23), i.e., the second word line Xi(2), and the refresh output control line RC1(i) is the refresh output control line RC1, i.e., the third word line Xi(3). In order to provide the memory circuit MR5 (see FIG. 12) of the First Embodiment, it is only necessary that the data transfer control line DT1(i) serve also as the refresh output control line RC1(i).

The driving signal generating circuit/video signal generating circuit 34 is a control driving circuit for carrying out an image display and a memory operation. The driving signal generating circuit/video signal generating circuit 34 includes the input-output interface 11, the command decoder 12, the timing control circuit 13, and the writing/reading circuit 15 of FIG. 21 in addition to a display data processing circuit. The timing control circuit 13 can serve also as a circuit which generates not only a timing used for the memory operation but also timings such as a gate start pulse, a gate clock, a source start pulse, and a source clock which are used for a display operation.

In the multi-color display mode (memory circuit non-operation mode), the driving signal generating circuit/video signal generating circuit 34 outputs a multi-gradation video signal from a video output terminal, so as to drive the source line SL(j) via the output signal line vd(k) and the demultiplexer 35. Concurrently with this, the driving signal generating circuit/video signal generating circuit 34 outputs a signal s1 for driving/controlling the gate driver/CS driver 32. This allows display data to be written to each of the pixels 40 and allows a multi-gradation moving image/still image to be displayed.

In the memory circuit operation mode, the driving signal generating circuit/video signal generating circuit 34 supplies data to be retained in the pixels 40 from the video output terminal to the source line SL(j) via the output signal line vd(k) and the demultiplexer 35. In addition to this, the driving signal generating circuit/video signal generating circuit 34 supplies a signal s2 for driving/controlling the gate driver/CS driver 32 and a signal s3 for driving/controlling the control signal buffer circuit 33. This allows data to be written to the pixels 40 and then displayed and retained and allows the data retained in the pixels 40 to be read.

Note, however, that the reading operation from the pixels 40 does not necessarily need to be carried out since the data which has been written to the pixels 40 and then retained in a memory circuit may be used only for a display. The data which the driving signal generating circuit/video signal generating circuit 34 supplies in the memory circuit operation mode via the video output terminal to the output signal line vd(k) is binary logic levels indicated by a first electric potential level and a second electric potential level. In a case where a pixel 40 corresponds to each picture element for a color display, a display can be carried out in colors whose number is obtained by raising 2 to the power of the number of colors of the picture elements. For example, in the case of picture elements of three colors (R, G, and B), a display can be carried out in a display mode of 8 (obtained by raising 2 to the power of 3) colors. The demultiplexer 35 distributes, to corresponding source lines SL(j), the data supplied to the output signal line vd(k).

As is clear from the above description, the gate driver/CS driver 32 and the control signal buffer circuit 33 constitute a row driver, whereas the driving signal generating circuit/video signal generating circuit 34 and the demultiplexer 35 constitute a column driver.

Figure 26:
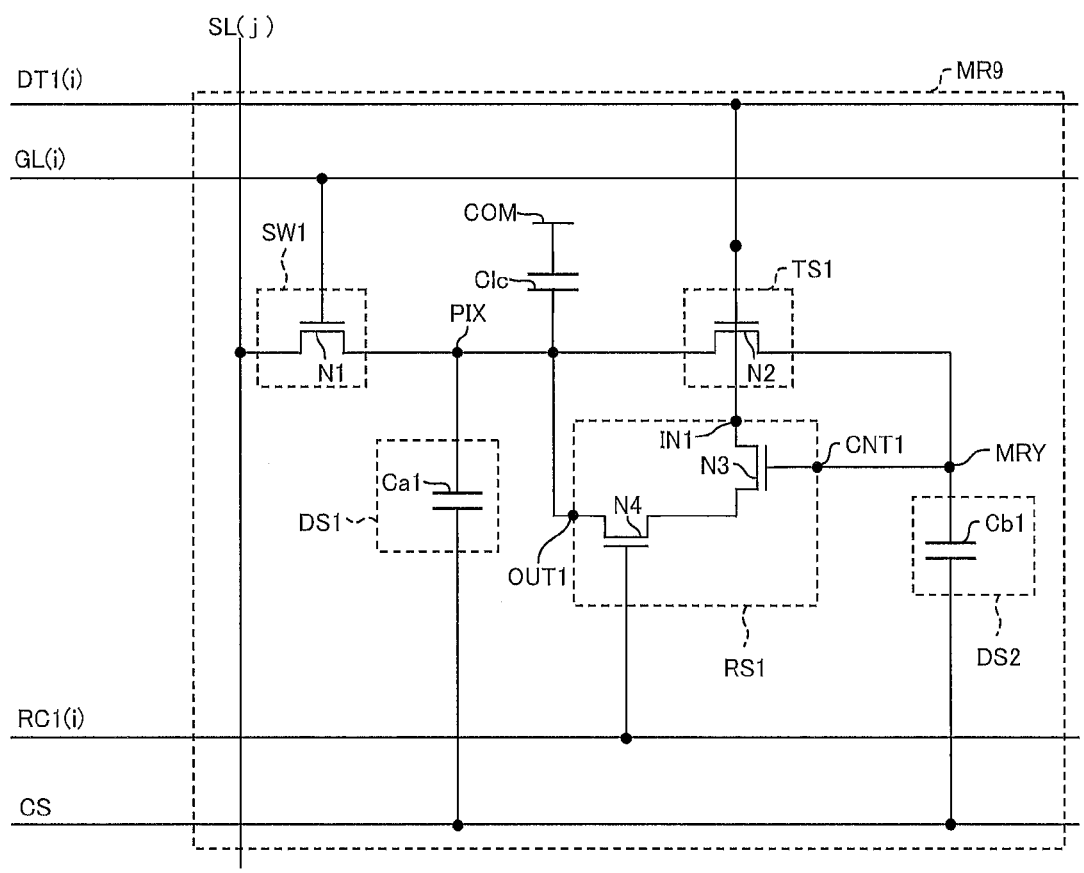
FIG. 26 is a circuit diagram illustrating an arrangement of a pixel of the display device of FIG. 25.

Next, FIG. 26 illustrates an example of an arrangement of the pixel 40 in the form of a pixel circuit MR9 which is an equivalent circuit.

The pixel circuit MR9 is obtained by causing the memory circuit MR1 described in the First Embodiment and illustrated in FIG. 1 to further include a liquid crystal capacitor Clc. Note that the first word line Xi(1), the second word line Xi(2), the third word line Xi(3), and the bit line Yj of FIG. 1 are written as the gate line GL(i), the data transfer control line DT1(i), the refresh output control line RC1(i), and the source line SL(j), respectively.

The liquid crystal capacitor Clc includes a liquid crystal layer which is provided between a node PIX and a common electrode COM. Namely, the node PIX is connected to a pixel electrode. The capacitor Ca1 functions also as a storage capacitor of the pixel 40. The transistor N1 which constitutes the switching circuit SW1 functions also as a selection element of the pixel 40. The common electrode COM is provided on a common electrode substrate facing a matrix substrate on which the circuit of FIG. 25 is provided. Note, however, that the common electrode COM may be provided on the matrix substrate.

All of the memory circuits described above can be used as a memory circuit provided in the pixel circuit MR9.

It is only necessary that the pixel circuit MR9 carry out a display in the multi-gradation display mode in a state in which a data signal whose electric potential levels are larger in number than binary levels is supplied to the pixel 40 and the refresh control section RS1 does not carry out the first operation in which the refresh control section RS1 is in the active state. In the multi-gradation display mode, the electric potential of the data transfer control line DT1(i) may be fixed to Low so that only the capacitor Ca1 functions as a storage capacitor. Alternatively, the electric potential of the data transfer control line DT1(i) may be fixed to High so that the capacitor Ca1 and the capacitor Cb1 are combined to function as a storage capacitor. Further, in a case where (i) the electric potential of the refresh output control line RC1(i) is fixed to Low so that the transistor N4 continues to be off or (ii) the electric potential of the data transfer control line DT1(i) is set high so that the transistor N3 turns off, it is possible to prevent the electric potential of the data transfer control line DT1(i) from affecting a display gradation of the liquid crystal capacitor Clc which display gradation is determined by an electric charge accumulated in the first data retaining section DS1. This allows display performance identical to that of a liquid crystal display device having no memory function.

FIG. 16 illustrates operation of the pixel circuit MR9 in the memory circuit operation mode. In the memory circuit operation mode of FIG. 16, an electric potential waveform of the common electrode COM is added to the electric potential waveforms of FIG. 13. That is, the memory circuit operation mode is executed by using the writing operation into the memory cell 20 in the memory device 1.

Figure 27:
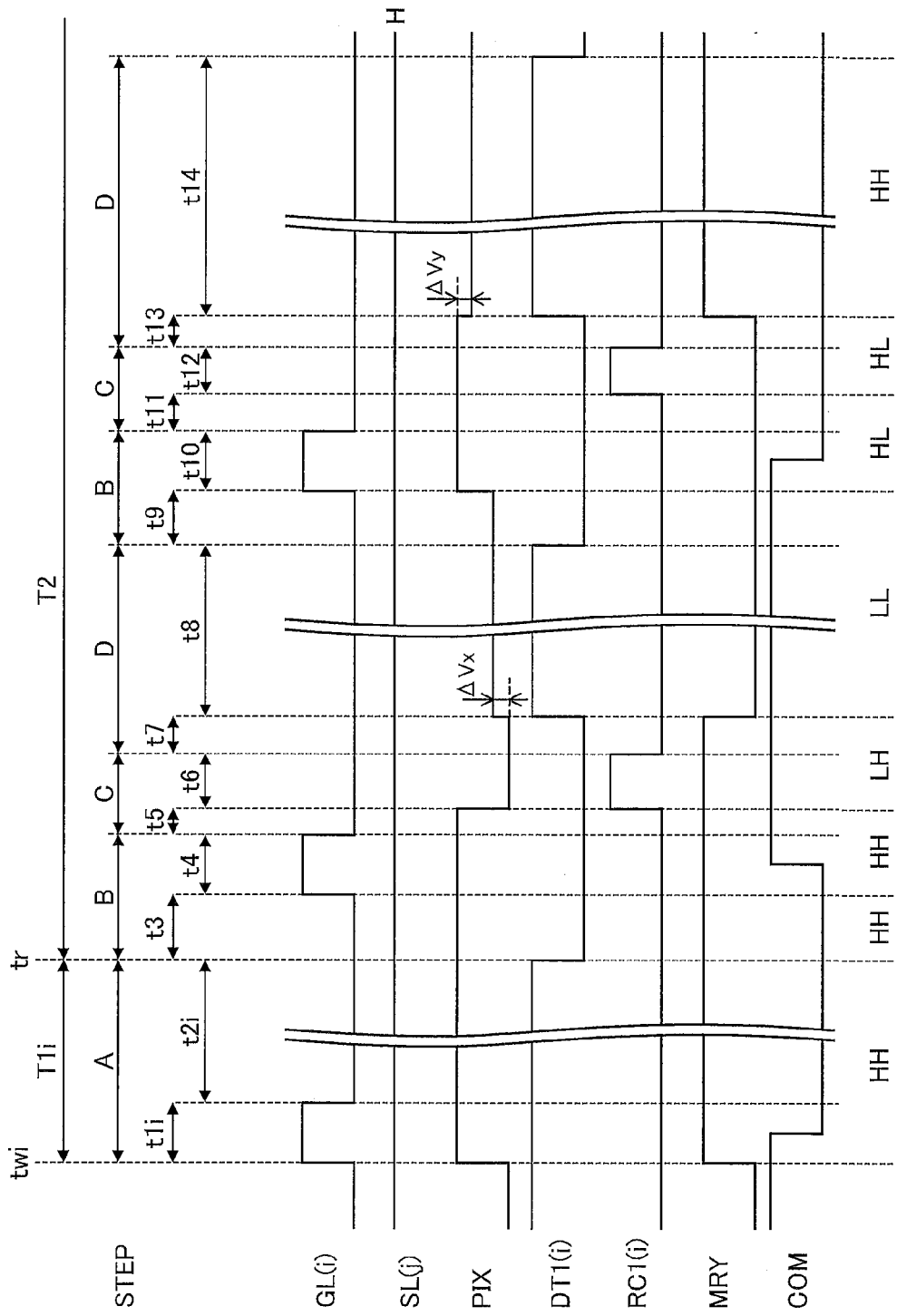
FIG. 27 is a signal diagram illustrating an operation of the pixel of FIG. 26.
Figure 28:
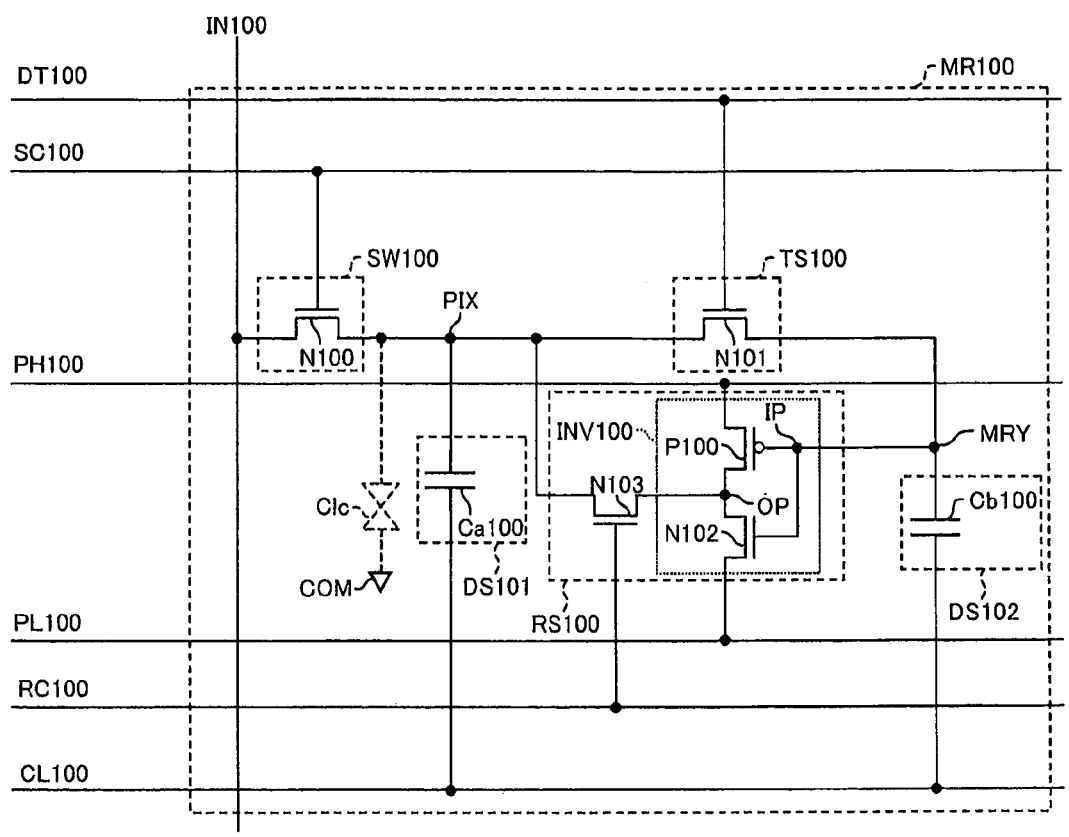
FIG. 28, which shows a conventional technique, is a circuit diagram illustrating a configuration of a memory circuit.

The operation of the pixel circuit MR9 in FIG. 27 can be classified into the following operation steps.

(1) Step A (Period t1i through Period t2i (Writing Period T1i))

In a step A, in a state in which (i) the binary logic level corresponding to a data signal is being supplied from the driving signal generating circuit/video signal generating circuit 34 and the demultiplexer 35 to the source line SL(j) and (ii) the refresh output control section RS1 is carrying out the second operation, the pixel circuit MR9 causes the switching circuit SW1 to turn on, so as to write the binary logic level to the pixel 40. Then, in a state in which (i) the binary logic level has been written to the memory cell 20 and (ii) the refresh output control section RS1 is carrying out the second operation, the pixel circuit MR9 causes the data transfer section TS1 to carry out the transfer operation.

(2) Step B (Each of Period t3 through Period t4 and Period t9 through Period t10)

In a step B following the step A, in a state in which (i) the refresh output control section RS1 is carrying out the second operation and (ii) the data transfer section TS1 is carrying out the non-transfer operation, the pixel circuit MR9 causes the switching circuit SW1 to turn on, so as to supply, to the first data retaining section DS1 via the source line SL(j), the binary logic level which is equal to a level that is equivalent to control information which causes the refresh output control section RS1 to be in the active state.

(3) Step C (Each of Period t5 through Period t6 and Period t11 through Period t12)

In a step C following the step B, in a state in which (i) the switching circuit SW1 is off and (ii) the data transfer section TS1 is carrying out the non-transfer operation, the pixel circuit MR9 causes the refresh output control section RS1 to carry out the first operation. By the time the first operation is finished, the pixel circuit MR9 causes the binary logic level to be supplied, to the input of the refresh output control section RS1, from the data transfer control line DT1(i) serving also as the voltage supply VS1, the binary logic level being inverse to the level that is equivalent to the control information which causes the refresh output control section RS1 to be in the active state.

(4) Step D (Each of Period t7 through Period t8 and Period t13 through Period t14)

In a step D following the step C, in a state in which (i) the switching circuit SW1 is off and (ii) the refresh output control section RS1 is carrying out the second operation, the pixel circuit MR9 causes the data transfer section TS1 to carry out the transfer operation.

As for the entire operation in the memory circuit operation mode, the pixel circuit MR9 carries out the step A first, and following the step A, the pixel circuit MR9 carries out, at least one time, a series of operations from the start of the step B to the end of the step D (the period t3 through the period t8).

The common electrode COM is driven so that an electric potential of the common electrode COM is reversed between High and Low every time the transistor N1 turns on. As described earlier, in a case where alternating-current driving is carried out in which the common electrode of the liquid crystal capacitor is inverted between the binary levels, the liquid crystal capacitor is subjected to alternating-current driving between positive and negative polarities, and black and white can be displayed.

It is assumed here, as an example, that the binary levels to be supplied to the common electrode COM are a first electric potential level and a second electric potential level. This makes it possible to easily obtain a black display and a white display only by the first electric potential level and the second electric potential level for each of a liquid crystal application voltage of a positive polarity and a liquid crystal application voltage of a negative polarity. For example, assume that the High electric potential of the common electrode COM is equal to the High electric potential of the binary logic levels and that the Low electric potential of the common electrode COM is equal to the Low electric potential of the binary logic levels. In a case where the electric potential of the common electrode COM is Low and the electric potential of the node PIX is Low, a black display of a positive polarity is obtained, whereas in a case where the electric potential of the common electrode COM is Low and the electric potential of the node PIX is High, a white display of a positive polarity is obtained. In a case where the electric potential of the common electrode COM is High and the electric potential of the node PIX is Low, a white display of a negative polarity is obtained, whereas in a case where the electric potential of the common electrode COM is High and the electric potential of the node PIX is High, a black display of a negative polarity is obtained. Accordingly, liquid crystal is driven so that, every time the electric potential of the node PIX is refreshed, a direction of a liquid crystal application voltage is reversed with a display gradation almost unchanged. This allows liquid-crystal alternating-current driving in which an effective value of the liquid crystal application voltage is constant regardless of whether the liquid crystal application voltage is positive or negative.

It is, also assumed here, as an example, that the binary levels to be supplied to the common electrode COM are inverted only in a period in which the switching circuit SW1 is on (see FIG. 27). According to this, the binary levels to be supplied to the common electrode COM are inverted only in a period in which the pixel electrode is connected to the source line SL(j) via the switching circuit SW1. Therefore, the common electrode electric potential is reversed in a state in which the pixel electrode electric potential is fixed to an electric potential of the source line SL(j). This prevents the pixel electrode electric potential that is being retained, especially the pixel electrode electric potential obtained in a refresh period from changing due to, for example, the reversal of the common electrode electric potential in a floating state of the node PIX.

As described earlier, according to the present embodiment, the display device can have both the function of the multi-gradation display mode (second display mode) and the function of the memory circuit operation mode (first display mode). In the memory circuit operation mode, in which an image such as a still image that hardly changes over time is displayed, a circuit such as an amplifier for displaying a multi-gradation image in a video signal generating circuit and a data supply operation can be stopped. This allows low electric power consumption. In addition, in the memory circuit operation mode, an electric potential can be refreshed in the pixel 40. Therefore, it is unnecessary to rewrite data of the pixel 40 while charging/discharging the source line SL(j) again. This allows a reduction in electric power consumption. Further, a data polarity can be reversed in the pixel 40. Therefore, in order to reverse a polarity, it is unnecessary to rewrite the data of the pixel 40 by charging/discharging, into the source line SL(j), display data whose polarity has been reversed. This allows a reduction in electric power consumption.

The pixel circuit MR9 serving as a memory circuit has no factor for a great increase in electric power consumption such as a through current of an inverter for carrying out a refresh operation. The pixel circuit MR9 allows a greater reduction in electric power consumption in the memory circuit operation mode itself than a conventional art.

Note that a display device can also be arranged to include the memory device 1 so that each memory circuit MR of the First Embodiment is provided in a driving circuit such as a CS driver of the display device. In such a case, for example, a binary logic level of retained data may be used as an output directly from a memory cell. Use of the memory circuit MR1 of FIG. 1, which includes transistors that are all N-channel TFTs, allows the memory cell to be provided in a driving circuit that is monolithically built into a display panel made of amorphous silicon.

In order to attain the object, a memory device of the present invention includes: a memory array in which memory cells are provided in a matrix pattern; a row driver which drives each row of the memory array; a column driver which drives each column of the memory array; a first wire which is provided for the each row and connects memory cells in an identical row; a second wire and a third wire each of which connects the memory cells; and a fourth wire which is provided for the each column and connects memory cells in an identical column, the fourth wire being driven by the column driver so that each of a first electric potential level and a second electric potential level each indicating a binary logic level is supplied to the fourth wire, the memory cells of the memory array each including: a switching circuit; a first retaining section; a transfer section; a second retaining section; and a first control section, the switching circuit being driven by the row driver via the first wire, so as to selectively turn on/off between the fourth wire and the first retaining section, the first retaining section retaining the binary logic level to be supplied thereto, the transfer section being driven via the second wire, so as to selectively carry out (i) a transfer operation in which the binary logic level retained in the first retaining section is transferred to the second retaining section in a state in which the binary logic level remains retained in the first retaining section and (ii) a non-transfer operation in which no transfer operation is carried out, the second retaining section retaining the binary logic level to be supplied thereto, the first control section being driven via the third wire, so as to be selectively controlled to be in a state in which the first control section carries out a first operation or a second operation, the first operation being an operation which is carried out by the first control section in (i) an active state in which the first control section receives an input thereto and supplies the input as an output thereof to the first retaining section or (ii) a non-active state in which the first control section stops carrying out an output, the active or non-active state having been selected in accordance with control information indicative of which of the first electric potential level and the second electric potential level is retained in the second retaining section as the binary logic level, the second operation being an operation in which the first control section stops carrying out the output regardless of the control information, and the memory device further comprising a voltage supply which supplies a set electric potential to an input of the first control section.

According to the invention, for example, in a case where data is desired to be written to a memory cell, the binary logic level which corresponds to the data to be written and is the first electric potential level or the second electric potential level is supplied from the column driver to the fourth wire. Then, in a case where the binary logic level is supplied from the fourth wire via the switching circuit to the first retaining section and then retained in the first retaining section, the binary logic level retained in the first retaining section can also be retained in the second retaining section by the transfer operation carried out by the transfer section. The first control section may be in the active state (i) when the first electric potential is retained in the second retaining section or (ii) when the second electric potential level is retained in the second retaining section. In either case, assume that the electric potential of the voltage supply is set to supply a level which is inverse to an active level of the first control section when a period in which the first control section carries out the first operation is finished. In a case where, in a state in which the transfer section is carrying out the non-transfer operation, the first control section carries out the first operation in which the first control section is in the active state, the first retaining section is in a state in which the first retaining section retains a level which is inverse to the binary logic level having been retained therein until then, and the second retaining section is in a state in which the second retaining section retains the binary logic level having been retained therein until then. In contrast, in a case where, in a state in which the transfer section is carrying out the non-transfer operation, the first control section carries out the second operation in which the first control section is in the non-active state, both the first retaining section and the second retaining section are in a state in which the first retaining section and the second retaining section retain the respective binary logic levels having been retained therein until then.

Note here that, in a case where the active level of the first control section is supplied from the column driver to the fourth wire, the binary logic level retained in the first retaining section is overwritten with the active level via the switching circuit, and thereafter the transfer section carries out the transfer operation, both the first retaining section and the second retaining section are in a state in which the first retaining section and the second retaining section retain a level which is inverse to the binary logic level obtained during writing. According to this, refresh can be carried out in a memory cell. The refresh can be repeated by repeating similar operation to the operation described above. According to the refresh, the binary logic level to be retained is inverted every time the refresh is carried out with respect to identical written data supplied from the column driver.

As described earlier, according to the arrangement, in a case where one and the other of the first electric potential level and the second electric potential level are supplied from the fourth wire and the voltage supply, respectively to each of the memory cells by no use of an inverter after binary logic data has been written to the first retaining section, a binary logic level corresponding to the binary logic data having been written to a memory cell can be refreshed while being subjected to a level inversion. Since a binary logic level which has been refreshed and is retained in the first retaining section and a binary logic level which has been refreshed and is retained in the second retaining section are equal to each other, the first retaining section and the second retaining section do not change in electric potential even if the transfer section carries out the transfer operation. This allows both the first retaining section and the second retaining section to retain the binary logic levels thus refreshed for a long time while the transfer section is in a state in which the transfer section carries out the transfer operation. In this case, since the first retaining section and the second retaining section are connected via the transfer section, occurrence of an off-leakage current in a transfer element of the transfer section is irrelevant to retention of the binary logic levels. The binary logic levels, which are retained in a mass by a large electric capacitance represented by a sum of the first retaining section and the second retaining section, are less likely to change in electric potential even by an influence of a noise from outside.

Accordingly, even if the off-leakage current occurs in the transfer element used in the transfer section, an electric potential of a retaining node which retains the binary logic level of the second retaining section is less likely to change since the electric potential is retained for a long time together with an electric potential of a retaining node of the first retaining section. According to a conventional memory cell, the binary logic levels which have been refreshed and are different from each other are retained for a long time in a state in which the first retaining section and the second retaining section are electrically separated from each other by the transfer element of the transfer section. Therefore, the off-leakage current of the transfer element has a great influence on the electric potential of the second retaining section.

Further, even if the electric potential of the retaining node of the second retaining section changes, a time for the change is not long enough for the control information for the first control section carrying out the first operation to change between the active level and the non-active level.

In a case where it is assumed that an inverter exists in the first control section, there exist two complementary levels of a High level and a Low level as active levels at each of which the inverter operates. Therefore, a range is narrow in which the electric potential of the second retaining section can exist as a level at which the inverter stably maintains an identical operation. For example, assume that the electric potential of the second retaining section is at the Low level. While the inverter is being operated so that a p-channel transistor turns on and an n-channel transistor turns off, it is feared that a slight increase in gate electric potential of the p-channel transistor may cause the n-channel transistor to turn on. However, in a case where the n-channel transistor is designed to have a large threshold voltage so as to avoid such a fear and the inverter is desired to operate so that the p-channel transistor turns off and the n-channel transistor turns on, a range becomes narrow in which the High level functions as the active level. In contrast, according to the invention, the active level of the first control section is one of the first electric potential level and the second electric potential level. Therefore, in a case where a broad range is secured in which the control information for the first control section exists as the non-active level, it is less feared that the non-active level may change to the active level. In contrast, in a case where the active level functions at an early stage of the active state of the first operation of the first control section, an object of the active level to be supplied from the voltage supply section to the first retaining section is easily attained. Therefore, even in a case where the active level finally changes to the non-active level, the change is less likely to cause an operation error in the first control section. Accordingly, even if the electric potential of the retaining node of the second retaining section changes, it is possible to carry out designing with such a large margin as to prevent the operation error in the first control section. For example, assume that the control information for the first control section is supplied to a gate of a transistor. Such designing corresponds to designing such that an increase in threshold voltage of the transistor causes a gate-source voltage to be less likely to exceed the threshold voltage of the transistor even if the electric potential of the second retaining section which electric potential should be at the non-active level changes.

Further, in a case where the electric potential of the retaining node of the second retaining section changes but the first control section carries out the second operation, no operation error occurs.

This yields an effect of providing a memory device such that, even if an off-leakage current occurs in a transfer element used in a transfer section which transfers binary logic data between two retaining sections, a circuit which carries out a refresh operation in accordance with a binary logic level retained in one of the two retaining sections can suitably carry out its original operation with no increase in consumption current and no operation error.

In order to attain the object, the memory device of the present invention is arranged such that: the first control section includes: a first switch which causes the binary logic level retained in the second retaining section to be a turning on/off control signal as the control information; and a second switch which causes a signal to be supplied to the third wire to be a turning on/off control signal; and the first switch and the second switch are connected in series to each other between the input of the first control section and an output of the first control section.

The invention yields an effect of easily attaining an arrangement such that one and the other of the first electric potential level and the second electric potential level are supplied from the fourth wire and the voltage supply, respectively to each of the memory cells by no use of an inverter after the binary logic data has been written to the first retaining section.

In order to attain the object, the memory device of the present invention is arranged such that: in a writing mode in which the memory device writes data to a memory cell, the memory device carries out a first step of (I) in a state in which (i) the binary logic level corresponding to the data is being supplied from the column driver to the fourth wire and (ii) the first control section is carrying out the second operation, causing the switching circuit to turn on, so as to write the binary logic level to the memory cell and (II) in a state in which (i) the binary logic level has been written to the memory cell and (ii) the first control section is carrying out the second operation, causing the transfer section to carry out the transfer operation; and the memory device carries out, at least one time, a series of operations, which are a second step following the first step, a third step following the second step, and a fourth step following the third step, from the start of the second step to the end of the fourth step, in the second step, in a state in which (i) the first control section is carrying out the second operation and (ii) the transfer section is carrying out the non-transfer operation, the memory device causes the switching circuit to turn on, so as to supply, to the first retaining section via the fourth wire, the binary logic level which is equal to a level that is equivalent to the control information which causes the first control section to be in the active state, in the third step, in a state in which (i) the switching circuit is off and (ii) the transfer section is carrying out the non-transfer operation, the memory device causes the first control section to carry out the first operation, and by the time the first operation is finished, the memory device causes the binary logic level to be supplied from the voltage supply to the input of the first control section, the binary logic level being inverse to the level that is equivalent to the control information which causes the first control section to be in the active state, and in the fourth step, in a state in which (i) the switching circuit is off and (ii) the first control section is carrying out the second operation, the memory device causes the transfer section to carry out the transfer operation.

According to the invention, in a case where one and the other of the first electric potential level and the second electric potential level are supplied from the fourth wire and the voltage supply, respectively to each of the memory cells after the binary logic data has been written to the first retaining section, an effect is yielded such that the binary logic level corresponding to the binary logic data having been written to a memory cell can be refreshed while being subjected to a level inversion.

According to the invention, an effect is also yielded such that it is possible to eliminate the need for a peripheral circuit which is necessary, in a common conventional dynamic memory circuit, for refreshing an electric potential of a bit line while carrying out destructive reading.

In order to attain the object, the memory device of the present invention is arranged such that: the first retaining section includes a first capacitor whose one end serves as a retaining node which retains the binary logic level; the second retaining section includes a second capacitor whose one end serves as a retaining node which retains the binary logic level; the first capacitor has a larger capacitance than the second capacitor; and the transfer section includes a third switch.

According to the invention, merely in a case where the third switch is on, movement of an electric charge between the first capacitor and the second capacitor easily allows a voltage of the second capacitor to be close to a voltage of the first capacitor which voltage was obtained before the third switch has turned on. As the first capacitor has a larger capacitance than the second capacitor, such an effect becomes greater. This yields an effect of easily making the transfer section.

In order to attain the object, the memory device of the present invention is arranged such that: the first retaining section includes a first capacitor whose one end serves as a retaining node which retains the binary logic level; the second retaining section includes a second capacitor whose one end serves as a retaining node which retains the binary logic level; the first capacitor has a larger capacitance than the second capacitor; the transfer section includes a third switch; and the switching circuit, the first switch, the second switch, and the third switch are N-channel field-effect transistors.

According to the invention, since the switching circuit, the first switch, the second switch, and the third switch are N-channel field-effect transistors which are identical to each other in polarity, the switching circuit, the first switch, the second switch, and the third switch can be simultaneously built into a memory cell. This yields an effect of facilitating a production process. Further, since the switching circuit, the first switch, the second switch, and the third switch are N-channel transistors, an effect is yielded such that a memory cell can be made of amorphous silicon.

In order to attain the object, the memory device of the present invention is arranged such that: the first retaining section includes a first capacitor whose one end serves as a retaining node which retains the binary logic level; the second retaining section includes a second capacitor whose one end serves as a retaining node which retains the binary logic level; the first capacitor has a larger capacitance than the second capacitor; the transfer section includes a third switch; and the switching circuit, the first switch, the second switch, and the third switch are P-channel field-effect transistors.

According to the invention, since the switching circuit, the first switch, the second switch, and the third switch are P-channel field-effect transistors which are identical to each other in polarity, the switching circuit, the first switch, the second switch, and the third switch can be simultaneously built into a memory cell. This yields an effect of facilitating a production process.

In order to attain the object, the memory device of the present invention is arranged such that: the second wire serves also as the voltage supply; and during the third step, the memory device supplies, to the second wire, the binary logic level which is inverse to the level that is equivalent to the control information which causes the first control section to be in the active state.

According to the invention, in a case where the second wire serves also as the voltage supply during the third step in which the transfer section carries out the non-transfer operation, an effect is yielded such that the memory device can have a simpler arrangement.

In order to attain the object, the memory device of the present invention is arranged such that: the voltage supply is separately wired; and during the third step, the memory device supplies, to the voltage supply, the binary logic level which is inverse to the level that is equivalent to the control information which causes the first control section to be in the active state.

According to the invention, the voltage supply is separately wired. This yields an effect such that an electric potential can be set regardless of an electric potential to be supplied to another wire.

In order to attain the object, the memory device of the present invention is arranged such that: the second wire serves also as the third wire; when the transfer section is in a state in which the transfer section carries out the transfer operation, the first control section is controlled to be in a state in which the first control section carries out the second operation, whereas, when the transfer section is in a state in which the transfer section carries out the non-transfer operation, the first control section is controlled to be in a state in which the first control section carries out the first operation; the voltage supply is separately wired; and during the third step, the memory device supplies, to the voltage supply, the binary logic level which is inverse to the level that is equivalent to the control information which causes the first control section to be in the active state.

According to the invention, the second wire serves also as the third wire so that operation logic is inverted between the transfer operation of the transfer section and the first operation of the first control section. This yields an effect such that the memory device can have a simpler arrangement.

In order to attain the object, the memory device of the present invention is arranged such that: the first retaining section includes a first capacitor whose one end serves as a retaining node which retains the binary logic level; the second retaining section includes a second capacitor whose one end serves as a retaining node which retains the binary logic level; the first capacitor has a larger capacitance than the second capacitor; the transfer section includes a third switch; the memory device further includes a fifth wire which is provided for the each row of the memory array and is connected to the other end of the second capacitor of each of the memory cells in the identical row; in the fourth step, a first period is set after the memory device temporarily causes the transfer section to carry out the transfer operation in the state in which (i) the switching circuit is off and (ii) the first control section is carrying out the second operation, the first period being a period in which the memory device subsequently causes the first control section to carry out the first operation in a state in which (i) the switching circuit is off and (ii) the transfer section is carrying out the transfer operation; in a case where the control information which causes the first control section to be in the active state when the first control section carries out the first operation is at a higher level of the first electric potential level and the second electric potential level, the memory device supplies, to the fifth wire, a pulse whose electric potential rises from a Low electric potential to a High electric potential; and in a case where the control information which causes the first control section to be in the active state when the first control section carries out the first operation is at a lower level of the first electric potential level and the second electric potential level, the memory device supplies, to the fifth wire, a pulse whose electric potential falls from the High electric potential to the Low electric potential.

According to the invention, the first retaining section can retain the High electric potential and the Low electric potential for a long term. This allows a reduction in frequency of polarity reversal of data to be retained. Since polarity reversal produces a consumption current associated with charge and discharge of the first capacitor and the second capacitor, an effect is yielded such that a consumption current can be reduced in proportion to a reduction in number of times of charge and discharge.

In order to attain the object, the memory device of the present invention is arranged such that in the first period, the memory device supplies, to the fourth wire, the binary logic level which is equal to a level that is equivalent to the control information which causes the first control section to be in the non-active state when the first control section carries out the first operation.

According to the invention, an effect is obtained such that a change in electric potential of the first retaining section can be prevented in a case where the electric potential to be retained in the first retaining section is the binary logic level to be supplied to the fourth wire and the switching circuit whose off-leakage is originally large is used or in a case where the electric potential to be retained in the first retaining section is the binary logic level to be supplied to the fourth wire and (i) an off-leakage of the switching circuit increases toward the fourth wire when the Low electric potential of the fourth wire becomes lower than the Low electric potential of the first retaining section or (ii) an off-leakage of the switching circuit increases toward the first retaining section when the High electric potential of the fourth wire becomes higher than the High electric potential of the first retaining section.

In order to attain the object, the memory device of the present invention is arranged such that: in a reading mode in which the memory device reads the data from the memory cell, the memory device carries out a fifth step, a sixth step following the fifth step, and a seventh step following the sixth step, in the fifth step, in a state in which (i) the binary logic level which is equal to a level that is equivalent to the control information which causes the first control section to be in the active state is being supplied from the column driver to the fourth wire, (ii) the transfer section is carrying out the non-transfer operation, and (iii) the first control section is carrying out the second operation, the memory device causes the switching circuit to turn on, so as to write the binary logic level to the memory cell, in the sixth step, in a state in which (i) the switching circuit is on and (ii) the transfer section is carrying out the non-transfer operation, the memory device causes the first control section to carry out the first operation, and in the seventh step, in the state in which (i) the switching circuit is on and (ii) the transfer section is carrying out the non-transfer operation, the memory device causes the column driver to sense an electric potential of the fourth wire, so as to determine the data retained in the memory cell.

According to the invention, a polarity of the electric potential level which polarity is displayed in the fourth wire after the sixth step differs in accordance with which of the first electric potential level and the second electric potential level is written in the memory cell as the binary logic data. This yields an effect of allowing easy reading of data.

In order to attain the object, the memory device of the present invention is arranged such that: following the seventh step, the memory device carries out an eighth step of, in the state in which (i) the switching circuit is off and (ii) the first control section is carrying out the second operation, causing the transfer section to carry out the transfer operation; and the memory device carries out, at least one time, a series of operations, which are a ninth step following the eighth step, a tenth step following the ninth step, and an eleventh step following the tenth step, from the start of the ninth step to the end of the eleventh step, in the ninth step, in a state in which (i) the transfer section is carrying out the non-transfer operation, (ii) the binary logic level which is equal to the level that is equivalent to the control information which causes the first control section to be in the active state is being supplied from the column driver to the fourth wire, and (iii) the first control section is carrying out the second operation, the memory device causes the switching circuit to turn on, in the tenth step, in the state in which (i) the switching circuit is off and (ii) the transfer section is carrying out the non-transfer operation, the memory device causes the first control section to carry out the first operation, and in the eleventh step, in the state in which (i) the switching circuit is off and (ii) the first control section is carrying out the second operation, the memory device causes the transfer section to carry out the transfer operation.

According to the invention, data is read in a state in which the binary logic level of the memory cell is inverted from that obtained during writing of the data. This yields an effect such that this polarity can be returned to that obtained during the writing and refreshed. Further, the data is read in a state in which the capacitor of the fourth wire is sufficiently charged. This yields an effect such that in restoring the data after the reading, it is unnecessary to provide a peripheral circuit which is necessary, in a common conventional dynamic memory circuit, for refreshing an electric potential of a bit line while carrying out destructive reading.

In order to attain the object, a display device of the present invention includes: a memory device mentioned above, the first retaining section including a liquid crystal capacitor of a pixel electrode connected to the retaining node of the first retaining section, the retaining node retaining the binary logic level, the first wire serving also as a scanning signal line, and the fourth wire serving also as a data signal line, and the display device causing the row driver to drive the switching circuit via the first wire and supplying a data signal from the column driver via the fourth wire and the switching circuit to the first retaining section, so as to apply a voltage to the liquid crystal capacitor and to carry out a display.

According to the invention, the pixel electrode of the liquid crystal capacitor is connected to the retaining node of the first retaining section, the first wire serves also as a scanning signal line, and the fourth wire serves also as a data signal line. Further, in this case, the switching circuit can function as a selection element of a pixel. This yields an effect of allowing an image display by use of an electric potential retained in the first retaining section.

In order to attain the object, the display device of the present invention is arranged such that the display device carries out a first display mode in which the binary logic level is supplied as the data signal to the memory cell so that the display is carried out.

According to the invention, in a case where data of the binary level is written to the memory cell and retained while being refreshed, black and white can be displayed. This yields an effect such that an image such as a still image that hardly changes over time can be displayed by use of the writing operation to the memory cell.

In order to attain the object, the display device of the present invention is arranged such that: in the first display mode, the display device carries out a step A of (I) in a state in which (i) the binary logic level corresponding to the data signal is being supplied from the column driver to the fourth wire and (ii) the first control section is carrying out the second operation, causing the switching circuit to turn on, so as to write the binary logic level to the memory cell and (II) in a state in which (i) the binary logic level has been written to the memory cell and (ii) the first control section is carrying out the second operation, causing the transfer section to carry out the transfer operation; and the display device carries out, at least one time, a series of operations, which are a step B following the step A, a step C following the step B, and a step D following the step C, from the start of the step B to the end of the step D, in the step B, in a state in which (i) the first control section is carrying out the second operation and (ii) the transfer section is carrying out the non-transfer operation, the display device causes the switching circuit to turn on, so as to supply, to the first retaining section via the fourth wire, the binary logic level which is equal to a level that is equivalent to the control information which causes the first control section to be in the active state, in the step C, in a state in which (i) the switching circuit is off and (ii) the transfer section is carrying out the non-transfer operation, the display device causes the first control section to carry out the first operation, and by the time the first operation is finished, the display device causes the binary logic level to be supplied from the voltage supply to the input of the first control section, the binary logic level being inverse to the level that is equivalent to the control information which causes the first control section to be in the active state, and in the step D, in a state in which (i) the switching circuit is off and (ii) the first control section is carrying out the second operation, the display device causes the transfer section to carry out the transfer operation.

According to the invention, in a case where one and the other of the first electric potential level and the second electric potential level are supplied from the fourth wire and the voltage supply, respectively to each of the memory cells after the data signal has been written to the first retaining section, an effect is yielded such that the binary logic level corresponding to the data signal having been written to a memory cell can be refreshed while being subjected to a level inversion.

In order to attain the object, the display device of the present invention is arranged such that the display device carries out alternating-current driving in which a common electrode of the liquid crystal capacitor is inverted between binary levels.

According to the invention, in a case where alternating-current driving is carried out in which the common electrode of the liquid crystal capacitor is inverted between the binary levels, an effect is yielded such that the liquid crystal capacitor is subjected to alternating-current driving between positive and negative polarities, and black and white can be displayed.

In order to attain the object, the display device of the present invention is arranged such that the binary levels to be supplied to the common electrode are the first electric potential level and the second electric potential level.

According to the invention, an effect is yielded such that it is possible to easily obtain a black display and a white display only by the first electric potential level and the second electric potential level for each of a liquid crystal application voltage of a positive polarity and a liquid crystal application voltage of a negative polarity.

In order to attain the object, the display device of the present invention is arranged such that the binary levels to be supplied to the common electrode are inverted only in a period in which the switching circuit is on.

According to the invention, the binary levels to be supplied to the common electrode are inverted only in a period in which the pixel electrode is connected to the fourth wire via the switching circuit. Therefore, the common electrode electric potential is reversed in a state in which the pixel electrode electric potential is fixed to an electric potential of the fourth wire. This yields an effect of preventing the pixel electrode electric potential that is being retained, especially the pixel electrode electric potential obtained in a refresh period from changing due to, for example, the reversal of the common electrode electric potential.

In order to attain the object, the display device of the present invention is arranged such that: the column driver is capable of supplying, to the fourth wire, a multilevel data signal which is the data signal whose electric potential levels are larger in number than the binary levels; and the display device carries out a second display mode in which the multi-level data signal is supplied to the memory cell so that the display is carried out in a state in which the first control section does not carry out the first operation in which the first control section is in the active state.

According to the invention, in a case where the first control section does not carry out the first operation in which the first control section is in the active state, the memory cell has an arrangement of a common liquid crystal cell which carries out an image display. This makes it possible to carry out the second display mode in which a multi-gradation display is carried out by supply of the multilevel data signal whose electric potential levels are larger in number than the binary levels. This yields an effect of providing a general-purpose display device by use of the first display mode and the second display mode.

In order to attain the object, the display device of the present invention is arranged such that the first retaining section serves also as a storage capacitor.

According to the invention, the first retaining section serves also as a storage capacitor. This yields an effect of carrying out a stable image display with less change in electric potential due to a charge leakage without the need of providing a separate storage capacitor.

In order to attain the object, a memory device driving method of the present invention for writing data to the memory device mentioned above, the memory device driving method includes: carrying out a first step of (I) in a state in which (i) the binary logic level corresponding to the data is being supplied from the column driver to the fourth wire and (ii) the first control section is carrying out the second operation, causing the switching circuit to turn on, so as to write the binary logic level to the memory cell and (II) in a state in which (i) the binary logic level has been written to the memory cell and (ii) the first control section is carrying out the second operation, causing the transfer section to carry out the transfer operation; and carrying out, at least one time, a series of operations, which are a second step following the first step, a third step following the second step, and a fourth step following the third step, from the start of the second step to the end of the fourth step, the second step, in a state in which (i) the first control section is carrying out the second operation and (ii) the transfer section is carrying out the non-transfer operation, causing the switching circuit to turn on, so as to supply, to the first retaining section via the fourth wire, the binary logic level which is equal to a level that is equivalent to the control information which causes the first control section to be in the active state, the third step, in a state in which (i) the switching circuit is off and (ii) the transfer section is carrying out the non-transfer operation, causing the first control section to carry out the first operation, and by the time the first operation is finished, causing the binary logic level to be supplied from the voltage supply to the input of the first control section, the binary logic level being inverse to the level that is equivalent to the control information which causes the first control section to be in the active state, and the fourth step, in a state in which (i) the switching circuit is off and (ii) the first control section is carrying out the second operation, causing the transfer section to carry out the transfer operation.

According to the invention, in a case where one and the other of the first electric potential level and the second electric potential level are supplied from the fourth wire and the voltage supply, respectively to each of the memory cells after the binary logic data has been written to the first retaining section, an effect is yielded such that the binary logic level corresponding to the binary logic data having been written to a memory cell can be refreshed while being subjected to a level inversion.

In order to attain the object, a memory device driving method of the present invention for reading the data from the memory device mentioned above, the memory device driving method includes: carrying out a fifth step, a sixth step following the fifth step, and a seventh step following the sixth step, the fifth step, in a state in which (i) the binary logic level which is equal to a level that is equivalent to the control information which causes the first control section to be in the active state is being supplied from the column driver to the fourth wire, (ii) the transfer section is carrying out the non-transfer operation, and (iii) the first control section is carrying out the second operation, causing the switching circuit to turn on, so as to write the binary logic level to the memory cell, the sixth step, in a state in which (i) the switching circuit is on and (ii) the transfer section is carrying out the non-transfer operation, causing the first control section to carry out the first operation, and the seventh step, in the state in which (i) the switching circuit is on and (ii) the transfer section is carrying out the non-transfer operation, causing the column driver to sense an electric potential of the fourth wire, so as to determine the data retained in the memory cell.

According to the invention, a polarity of the electric potential level which polarity is displayed in the fourth wire after the sixth step differs in accordance with which of the first electric potential level and the second electric potential level is written in the memory cell as the binary logic data. This yields an effect of allowing easy reading of data.

In order to attain the object, the memory device driving method of the present invention includes: following the seventh step, carrying out an eighth step of, in the state in which (i) the switching circuit is off and (ii) the first control section is carrying out the second operation, causing the transfer section to carry out the transfer operation; and carrying out, at least one time, a series of operations, which are a ninth step following the eighth step, a tenth step following the ninth step, and an eleventh step following the tenth step, from the start of the ninth step to the end of the eleventh step, the ninth step, in a state in which (i) the transfer section is carrying out the non-transfer operation, (ii) the binary logic level which is equal to the level that is equivalent to the control information which causes the first control section to be in the active state is being supplied from the column driver to the fourth wire, and (iii) the first control section is carrying out the second operation, causing the switching circuit to turn on, the tenth step, in the state in which (i) the switching circuit is off and (ii) the transfer section is carrying out the non-transfer operation, causing the first control section to carry out the first operation, and the eleventh step, in the state in which (i) the switching circuit is off and (ii) the first control section is carrying out the second operation, causing the transfer section to carry out the transfer operation.

According to the invention, data is read in a state in which the binary logic level of the memory cell is inverted from that obtained during writing of the data. This yields an effect such that this polarity can be returned to that obtained during the writing and refreshed.

In order to attain the object, a display device driving method for carrying out a display by writing the data signal to the display device mentioned above, the display device driving method includes: carrying out a step A of (I) in a state in which (i) the binary logic level corresponding to the data signal is being supplied from the column driver to the fourth wire and (ii) the first control section is carrying out the second operation, causing the switching circuit to turn on, so as to write the binary logic level to the memory cell and (II) in a state in which (i) the binary logic level has been written to the memory cell and (ii) the first control section is carrying out the second operation, causing the transfer section to carry out the transfer operation; and carrying out, at least one time, a series of operations, which are a step B following the step A, a step C following the step B, and a step D following the step C, from the start of the step B to the end of the step D, the step B, in a state in which (i) the first control section is carrying out the second operation and (ii) the transfer section is carrying out the non-transfer operation, causing the switching circuit to turn on, so as to supply, to the first retaining section via the fourth wire, the binary logic level which is equal to a level that is equivalent to the control information which causes the first control section to be in the active state, the step C, in a state in which (i) the switching circuit is off and (ii) the transfer section is carrying out the non-transfer operation, causing the first control section to carry out the first operation, and by the time the first operation is finished, causing the binary logic level to be supplied from the voltage supply to the input of the first control section, the binary logic level being inverse to the level that is equivalent to the control information which causes the first control section to be in the active state, and the step D, in a state in which (i) the switching circuit is off and (ii) the first control section is carrying out the second operation, causing the transfer section to carry out the transfer operation.

According to the invention, in a case where data of the binary level is written to the memory cell and retained while being refreshed, black and white can be displayed. This yields an effect such that an image such as a still image that hardly changes over time can be displayed by use of the writing operation to the memory cell.

In a case where one and the other of the first electric potential level and the second electric potential level are supplied from the fourth wire and the voltage supply, respectively to each of the memory cells after the data signal has been written to the first retaining section, an effect is yielded such that the binary logic level corresponding to the data signal having been written to a memory cell can be refreshed while being subjected to a level inversion.

In order to attain the object, the display device driving method of the present invention is arranged to further include carrying out alternating-current driving in which a common electrode of the liquid crystal capacitor is inverted between binary levels.

According to the invention, in a case where alternating-current driving is carried out in which the common electrode of the liquid crystal capacitor is inverted between the binary levels, an effect is yielded such that the liquid crystal capacitor is subjected to alternating-current driving between positive and negative polarities, and black and white can be displayed.

In order to attain the object, the display device driving method of the present invention is arranged such that the binary levels to be supplied to the common electrode are the first electric potential level and the second electric potential level.

According to the invention, an effect is yielded such that it is possible to easily obtain a black display and a white display only by the first electric potential level and the second electric potential level for each of a liquid crystal application voltage of a positive polarity and a liquid crystal application voltage of a negative polarity.

In order to attain the object, the display device driving method of the present invention is arranged such that the binary levels to be supplied to the common electrode are inverted only in a period in which the switching circuit is on.

According to the invention, the binary levels to be supplied to the common electrode are inverted only in a period in which the pixel electrode is connected to the fourth wire via the switching circuit. Therefore, the common electrode electric potential is reversed in a state in which the pixel electrode electric potential is fixed to an electric potential of the fourth wire. This yields an effect of preventing the pixel electrode electric potential that is being retained, especially the pixel electrode electric potential obtained in a refresh period from changing due to, for example, the reversal of the common electrode electric potential.

In order to attain the object, the display device driving method of the present invention is arranged to further include carrying out a second display mode in which a multilevel data signal is supplied from the column driver to the memory cell so that the display is carried out in a state in which the first control section does not carry out the first operation in which the first control section is in the active state, the multilevel data signal being the data signal whose electric potential levels are larger in number than the binary levels, the column driver being capable of supplying the multilevel data signal to the fourth wire.

According to the invention, in a case where the first control section does not carry out the first operation in which the first control section is in the active state, the memory cell has an arrangement of a common liquid crystal cell which carries out an image display. This makes it possible to carry out the second display mode in which a multi-gradation display is carried out by supply of the multilevel data signal whose electric potential levels are larger in number than the binary levels. This yields an effect of providing a general-purpose display device by use of the first display mode and the second display mode.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention can be preferably used for, for example, a display of a mobile phone.

REFERENCE SIGNS LIST

1 Memory Device
3 Liquid Crystal Display Device (Display Device)
10 Memory Array
14 Word Line Control Circuit 14 (Row Driver)
15 Writing/Reading Circuit (Column Driver)
20 Memory Cell
40 Pixel (Memory Cell)
SC1 Switch Control Line (First Wire)
DT1 Data Transfer Control Line (Second Wire)
RC1 Refresh Output Control Line (Third Wire)
IN1 Data Input Line (Fourth Wire)
$Xi(1)$ ($1 \leq i \leq n$) First Word Line (First Wire)
$Xi(2)$ ($1 \leq i \leq n$) Second Word Line (Second Wire, Supply Source)
$Xi(3)$ ($1 \leq i \leq n$) Third Word Line (Third Wire)
$Yj$ ($1 \leq j \leq m$) Bit Line (Fourth Wire)
RP1 Refresh Pulse Line (Fifth Wire)
SW1 Switching Circuit
DS1 First Data Retaining Section (First Retaining Section)
DS2 Second Data Retaining Section (Second Retaining Section)
TS1 Data Transfer Section (Transfer Section)
RS1 Refresh Output Control Section (First Control Section)
VS1 Voltage Supply
L1, L2 Control Line (Voltage Supply)
N1-N8 Transistor (N-channel Field Effect Transistor)
P1-P7 Transistor (P-channel Field Effect Transistor)
N3, P5, N5, P5 Transistor (First Switch)
N4, P4, P6, N7 Transistor (Second Switch)
N2, P2, N6, P7 Transistor (Third Switch)

Ca1 Capacitor (First Capacitor)
Cb1 Capacitor (Second Capacitor)
GL(i) (1≤i≤n) Gate Line (Scanning Signal Line)
SL(j) (1≤j≤m) Source Line (Data Signal Line)
The invention claimed is:
1. A memory device comprising:
a memory array in which memory cells are provided in a matrix pattern;
a row driver which drives each row of the memory array;
a column driver which drives each column of the memory array;
a first wire which is provided for each row and connects memory cells in an identical row;
a second wire and a third wire each of which connects the memory cells; and
a fourth wire which is provided for each column and connects memory cells in an identical column, the fourth wire being driven by the column driver so that each of a first electric potential level and a second electric potential level each indicating a binary logic level is supplied to the fourth wire,
the memory cells of the memory array each including:
a switching circuit;
a first retaining section;
a transfer section;
a second retaining section; and
a first control section,
the switching circuit being driven by the row driver via the first wire, so as to selectively turn on/off between the fourth wire and the first retaining section,
the first retaining section retaining the binary logic level to be supplied thereto,
the transfer section being driven via the second wire, so as to selectively carry out (i) a transfer operation in which the binary logic level retained in the first retaining section is transferred to the second retaining section in a state in which the binary logic level remains retained in the first retaining section and (ii) a non-transfer operation in which no transfer operation is carried out,
the second retaining section retaining the binary logic level to be supplied thereto,
the first control section being driven via the third wire, so as to be selectively controlled to be in a state in which the first control section carries out a first operation or a second operation,
the first operation being an operation which is carried out by the first control section in (i) an active state in which the first control section receives an input thereto and supplies the input as an output thereof to the first retaining section or (ii) a non-active state in which the first control section stops carrying out an output, the active or non-active state having been selected in accordance with control information indicative of which of the first electric potential level and the second electric potential level is retained in the second retaining section as the binary logic level,
the second operation being an operation in which the first control section stops carrying out the output regardless of the control information,
said memory device further comprising a voltage supply which supplies a set electric potential to an input of the first control section, and
wherein in a writing mode in which the memory device writes data to a memory cell,
the memory device carries out a first step of (I) in a state in which (i) the binary logic level corresponding to the data is being supplied from the column driver to the fourth wire and (ii) the first control section is carrying out the second operation, causing the switching circuit to turn on, so as to write the binary logic level to the memory cell and (II) in a state in which (i) the binary logic level has been written to the memory cell and (ii) the first control section is carrying out the second operation, causing the transfer section to carry out the transfer operation, and
the memory device carries out, at least one time, a series of operations, which are a second step following the first step, a third step following the second step, and a fourth step following the third step, from the start of the second step to the end of the fourth step,
in the second step, in a state in which (i) the first control section is carrying out the second operation and (ii) the transfer section is carrying out the non-transfer operation, the memory device causes the switching circuit to turn on, so as to supply, to the first retaining section via the fourth wire, the binary logic level which is equal to a level that is equivalent to the control information which causes the first control section to be in the active state,
in the third step, in a state in which (i) the switching circuit is off and (ii) the transfer section is carrying out the non-transfer operation, the memory device causes the first control section to carry out the first operation, and by the time the first operation is finished, the memory device causes the binary logic level to be supplied from the voltage supply to the input of the first control section, the binary logic level being inverse to the level that is equivalent to the control information which causes the first control section to be in the active state, and
in the fourth step, in a state in which (i) the switching circuit is off and (ii) the first control section is carrying out the second operation, the memory device causes the transfer section to carry out the transfer operation.
2. The memory device as set forth in claim 1, wherein the first control section includes:
a first switch which causes the binary logic level retained in the second retaining section to be a turning on/off control signal as the control information;
a second switch which causes a signal to be supplied to the third wire to be a turning on/off control signal; and
wherein the first switch and the second switch are connected in series to each other between the input of the first control section and an output of the first control section.
3. The memory device as set forth in claim 2, wherein:
the first retaining section includes a first capacitor whose one end serves as a retaining node which retains the binary logic level;
the second retaining section includes a second capacitor whose one end serves as a retaining node which retains the binary logic level;
the first capacitor has a larger capacitance than the second capacitor;
the transfer section includes a third switch; and
the switching circuit, the first switch, the second switch, and the third switch are N-channel field-effect transistors.
4. The memory device as set forth in claim 2, wherein:
the first retaining section includes a first capacitor whose one end serves as a retaining node which retains the binary logic level;

the second retaining section includes a second capacitor whose one end serves as a retaining node which retains the binary logic level;
the first capacitor has a larger capacitance than the second capacitor;
the transfer section includes a third switch; and
the switching circuit, the first switch, the second switch, and the third switch are P-channel field-effect transistors.

5. The memory device as set forth in claim 1, wherein:
the first retaining section includes a first capacitor whose one end serves as a retaining node which retains the binary logic level;
the second retaining section includes a second capacitor whose one end serves as a retaining node which retains the binary logic level;
the first capacitor has a larger capacitance than the second capacitor; and
the transfer section includes a third switch.

6. The memory device as set forth in claim 1, wherein:
the second wire serves also as the voltage supply; and
during the third step, the memory device supplies, to the second wire, the binary logic level which is inverse to the level that is equivalent to the control information which causes the first control section to be in the active state.

7. The memory device as set forth in claim 1, wherein:
the voltage supply is separately wired; and
during the third step, the memory device supplies, to the voltage supply, the binary logic level which is inverse to the level that is equivalent to the control information which causes the first control section to be in the active state.

8. The memory device as set forth in claim 1, wherein:
the second wire serves also as the third wire;
when the transfer section is in a state in which the transfer section carries out the transfer operation, the first control section is controlled to be in a state in which the first control section carries out the second operation, whereas, when the transfer section is in a state in which the transfer section carries out the non-transfer operation, the first control section is controlled to be in a state in which the first control section carries out the first operation;
the voltage supply is separately wired; and
during the third step, the memory device supplies, to the voltage supply, the binary logic level which is inverse to the level that is equivalent to the control information which causes the first control section to be in the active state.

9. The memory device as set forth in claim 1, wherein:
the first retaining section includes a first capacitor whose one end serves as a retaining node which retains the binary logic level;
the second retaining section includes a second capacitor whose one end serves as a retaining node which retains the binary logic level;
the first capacitor has a larger capacitance than the second capacitor;
the transfer section includes a third switch;
the memory device further includes a fifth wire which is provided for the each row of the memory array and is connected to the other end of the second capacitor of each of the memory cells in the identical row;
in the fourth step, a first period is set after the memory device temporarily causes the transfer section to carry out the transfer operation in the state in which (i) the switching circuit is off and (ii) the first control section is carrying out the second operation, the first period being a period in which the memory device subsequently causes the first control section to carry out the first operation in a state in which (i) the switching circuit is off and (ii) the transfer section is carrying out the transfer operation;
in a case where the control information which causes the first control section to be in the active state when the first control section carries out the first operation is at a higher level of the first electric potential level and the second electric potential level, the memory device supplies, to the fifth wire, a pulse whose electric potential rises from a Low electric potential to a High electric potential; and
in a case where the control information which causes the first control section to be in the active state when the first control section carries out the first operation is at a lower level of the first electric potential level and the second electric potential level, the memory device supplies, to the fifth wire, a pulse whose electric potential falls from the High electric potential to the Low electric potential.

10. The memory device as set forth in claim 9, wherein in the first period, the memory device supplies, to the fourth wire, the binary logic level which is equal to a level that is equivalent to the control information which causes the first control section to be in the non-active state when the first control section carries out the first operation.

11. A memory device comprising:
a memory array in which memory cells are provided in a matrix pattern;
a row driver which drives each row of the memory array;
a column driver which drives each column of the memory array;
a first wire which is provided for each row and connects memory cells in an identical row;
a second wire and a third wire each of which connects the memory cells; and
a fourth wire which is provided for each column and connects memory cells in an identical column, the fourth wire being driven by the column driver so that each of a first electric potential level and a second electric potential level each indicating a binary logic level is supplied to the fourth wire,
the memory cells of the memory array each including:
a switching circuit;
a first retaining section;
a transfer section;
a second retaining section; and
a first control section,
the switching circuit being driven by the row driver via the first wire, so as to selectively turn on/off between the fourth wire and the first retaining section,
the first retaining section retaining the binary logic level to be supplied thereto,
the transfer section being driven via the second wire, so as to selectively carry out (i) a transfer operation in which the binary logic level retained in the first retaining section is transferred to the second retaining section in a state in which the binary logic level remains retained in the first retaining section and (ii) a non-transfer operation in which no transfer operation is carried out,
the second retaining section retaining the binary logic level to be supplied thereto, the first control section being driven via the third wire, so as to be selectively controlled to be in a state in which the first control section carries out a first operation or a second operation, the first operation being an operation which is carried out by the first control section in (i) an active state in which the first control section receives an input thereto and supplies the input as an output thereof to the first retaining section or (ii) a non-active state in which the first control section stops carrying out an output, the active or non-active state having been selected in accordance with control information indicative of which of the first electric potential level and the second electric potential level is retained in the second retaining section as the binary logic level, and the second operation being an operation in which the first control section stops carrying out the output regardless of the control information;

said memory device further including a voltage supply which supplies a set electric potential to an input of the first control section; and wherein in a reading mode in which the memory device reads the data from the memory cell, the memory device carries out a first step, a second step following the first step, and a third step following the second step, in the first step, in a state in which (i) the binary logic level which is equal to a level that is equivalent to the control information which causes the first control section to be in the active state is being supplied from the column driver to the fourth wire, (ii) the transfer section is carrying out the non-transfer operation, and (iii) the first control section is carrying out the second operation, the memory device causes the switching circuit to turn on, so as to write the binary logic level to the memory cell, in the second step, in a state in which (i) the switching circuit is on and (ii) the transfer section is carrying out the non-transfer operation, the memory device causes the first control section to carry out the first operation, and in the third step, in the state in which (i) the switching circuit is on and (ii) the transfer section is carrying out the non-transfer operation, the memory device causes the column driver to sense an electric potential of the fourth wire, so as to determine the data retained in the memory cell.

12. The memory device as set forth in claim 11, wherein:

following the third step, the memory device carries out a fourth step of, in the state in which (i) the switching circuit is off and (ii) the first control section is carrying out the second operation, causing the transfer section to carry out the transfer operation; and the memory device carries out, at least one time, a series of operations, which are a fifth step following the fourth step, a sixth step following the fifth step, and an seventh step following the sixth step, from the start of the fifth step to the end of the seventh step, in the fifth step, in a state in which (i) the transfer section is carrying out the non-transfer operation, (ii) the binary logic level which is equal to the level that is equivalent to the control information which causes the first control section to be in the active state is being supplied from the column driver to the fourth wire, and (iii) the first control section is carrying out the second operation, the memory device causes the switching circuit to turn on, in the sixth step, in the state in which (i) the switching circuit is off and (ii) the transfer section is carrying out the non-transfer operation, the memory device causes the first control section to carry out the first operation, and in the seventh step, in the state in which (i) the switching circuit is off and (ii) the first control section is carrying out the second operation, the memory device causes the transfer section to carry out the transfer operation.

13. A memory device comprising:

a memory array in which memory cells are provided in a matrix pattern;

a row driver which drives each row of the memory array;

a column driver which drives each column of the memory array;

a first wire which is provided for each row and connects memory cells in an identical row;

a second wire and a third wire each of which connects the memory cells; and a fourth wire which is provided for each column and connects memory cells in an identical column, the fourth wire being driven by the column driver so that each of a first electric potential level and a second electric potential level each indicating a binary logic level is supplied to the fourth wire, the memory cells of the memory array each including:
  a switching circuit;
  a first retaining section;
  a transfer section;
  a second retaining section; and
  a first control section,
  the switching circuit being driven by the row driver via the first wire, so as to selectively turn on/off between the fourth wire and the first retaining section,
  the first retaining section retaining the binary logic level to be supplied thereto,
  the transfer section being driven via the second wire, so as to selectively carry out (i) a transfer operation in which the binary logic level retained in the first retaining section is transferred to the second retaining section in a state in which the binary logic level remains retained in the first retaining section and (ii)a non-transfer operation in which no transfer operation is carried out,
  the second retaining section retaining the binary logic level to be supplied thereto,
  the first control section being driven via the third wire, so as to be selectively controlled to be in a state in which the first control section carries out a first operation or a second operation,
  the first operation being an operation which is carried out by the first control section in (i) an active state in which the first control section receives an input thereto and supplies the input as an output thereof to the first retaining section or (ii) a non-active state in which the first control section stops carrying out an output, the active or non-active state having been selected in accordance with control information indicative of which of the first electric potential level and the second electric potential level is retained in the second retaining section as the binary logic level,
  the second operation being an operation in which the first control section stops carrying out the output regardless of the control information,
  the first retaining section including a liquid crystal capacitor of a pixel electrode connected to the retaining node of the first retaining section, the retaining node retaining the binary logic level, the first wire serving also as a scanning signal line, and the fourth wire serving also as a data signal line, and the display device causing the row driver to drive the switching circuit via the first wire and supplying a data signal from the column driver via the fourth wire and the switching circuit to the first retaining section, so as to apply a voltage to the liquid crystal capacitor and to carry out a display, the display device carries out a first display mode in which the binary logic level is supplied as the data signal to the memory cell so that the display is carried out;

said memory device further including a voltage supply which supplies a set electric potential to an input of the first control section; and wherein in the first display mode, the display device carries out a step A of (I) in a state in which (i) the binary logic level corresponding to the data signal is being supplied from the column driver to the fourth wire and (ii) the first control section is carrying out the second operation, causing the switching circuit to turn on, so as to write the binary logic level to the memory cell and (II) in a state in which (i) the binary logic level has been written to the memory cell and (ii) the first control section is carrying out the second operation, causing the transfer section to carry out the transfer operation; and the display device carries out, at least one time, a series of operations, which are a step B following the step A, a step C following the step B, and a step D following the step C, from the start of the step B to the end of the step D, in the step B, in a state in which (i) the first control section is carrying out the second operation and (ii) the transfer section is carrying out the non-transfer operation, the display device causes the switching circuit to turn on, so as to supply, to the first retaining section via the fourth wire, the binary logic level which is equal to a level that is equivalent to the control information which causes the first control section to be in the active state, in the step C, in a state in which (i) the switching circuit is off and (ii) the transfer section is carrying out the non-transfer operation, the display device causes the first control section to carry out the first operation, and by the time the first operation is finished, the display device causes the binary logic level to be supplied from the voltage supply to the input of the first control section, the binary logic level being inverse to the level that is equivalent to the control information which causes the first control section to be in the active state, and in the step D, in a state in which (i) the switching circuit is off and (ii) the first control section is carrying out the second operation, the display device causes the transfer section to carry out the transfer operation.

14. The display device as set forth in claim 13, wherein the display device carries out alternating-current driving in which a common electrode of the liquid crystal capacitor is inverted between binary levels.

15. The display device as set forth in claim 14, wherein the binary levels to be supplied to the common electrode are inverted only in a period in which the switching circuit is on.

16. The display device as set forth in claim 14, wherein the binary levels to be supplied to the common electrode are the first electric potential level and the second electric potential level.

17. The display device as set forth in claim 13, wherein the first retaining section serves also as a storage capacitor.

18. A memory device comprising:

a memory array in which memory cells are provided in a matrix pattern;

a row driver which drives each row of the memory array;

a column driver which drives each column of the memory array;.

a first wire which is provided for each row and connects memory cells in an identical row;

a second wire and a third wire each of which connects the memory cells; and a fourth wire which is provided for each column and connects memory cells in an identical column, the fourth wire being driven by the column driver so that each of a first electric potential level and a second electric potential level each indicating a binary logic level is supplied to the fourth wire, the memory cells of the memory array each including:

a switching circuit;
a first retaining section;
a transfer section;
a second retaining section; and
a first control section, the switching circuit being driven by the row driver via the first wire, so as to selectively turn on/off between the fourth wire and the first retaining section, the first retaining section retaining the binary logic level to be supplied thereto, the transfer section being driven via the second wire, so as to selectively carry out (i) a transfer operation in which the binary logic level retained in the first retaining section is transferred to the second retaining section in a state in which the binary logic level remains retained in the first retaining section and (ii) a non-transfer operation in which no transfer operation is carried out, the second retaining section retaining the binary logic level to be supplied thereto, the first control section being driven via the third wire, so as to be selectively controlled to be in a state in which the first control section carries out a first operation or a second operation, the first operation being an operation which is carried out by the first control section in (i) an active state in which the first control section receives an input thereto and supplies the input as an output thereof to the first retaining section or (ii) a non-active state in which the first control section stops carrying out an output, the active or non-active state having been selected in accordance with control information indicative of which of the first electric potential level and the second electric potential level is retained in the second retaining section as the binary logic level, the second operation being an operation in which the first control section stops carrying out the output regardless of the control information, the first retaining section including a liquid crystal capacitor of a pixel electrode connected to the retaining node of the first retaining section, the retaining node retaining the binary logic level, the first wire serving also as a scanning signal line, and the fourth wire serving also as a data signal line, and the display device causing the row driver to drive the switching circuit via the first wire and supplying a data signal from the column driver via the fourth wire and the switching circuit to the first retaining section, so as to apply a voltage to the liquid crystal capacitor and to carry out a display;

said memory device further including a voltage supply which supplies a set electric potential to an input of the first control section;

wherein the column driver is capable of supplying, to the fourth wire, a multilevel data signal which is the data signal whose electric potential levels are larger in number than the binary levels; and wherein the display device carries out a second display mode in which the multilevel data signal is supplied to the memory cell so that the display is carried out in a state in which the first control section does not carry out the first operation in which the first control section is in the active state.

* * * * *